(12) United States Patent
Lu et al.

(10) Patent No.: US 12,113,142 B2
(45) Date of Patent: Oct. 8, 2024

(54) STRINGS OF SOLAR CELLS HAVING LASER ASSISTED METALLIZATION CONDUCTIVE CONTACT STRUCTURES AND THEIR METHODS OF MANUFACTURE

(71) Applicant: Maxeon Solar Pte. Ltd., Singapore (SG)

(72) Inventors: Pei Hsuan Lu, San Jose, CA (US); Tyler D. Newman, Sunnyvale, CA (US); Paul W. Loscutoff, Castro Valley, CA (US); George G. Correos, Corralitos, CA (US); Yafu Lin, San Jose, CA (US); Andrea R. Bowring, Mountain View, CA (US); David C. Okawa, Redwood City, CA (US); Matthew T. Matsumoto, Pasadena, CA (US); Benjamin I. Hsia, Fremont, CA (US); Arbaz Ahmed Shakir, Santa Clara, CA (US); John H. Lippiatt, San Jose, CA (US); Simone I. Nazareth, San Jose, CA (US); Ryan Reagan, Hayward, CA (US); Todd R. Johnson, San Jose, CA (US); Ned Western, San Jose, CA (US); Tamir Lance, Los Gatos, CA (US); Marc Robinson, Cedar Park, TX (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 17/356,417

(22) Filed: Jun. 23, 2021

(65) Prior Publication Data

US 2021/0408313 A1 Dec. 30, 2021

Related U.S. Application Data

(60) Provisional application No. 63/043,695, filed on Jun. 24, 2020.

(51) Int. Cl.
*H01L 31/05* (2014.01)
*H01L 31/02* (2006.01)
(Continued)

(52) U.S. Cl.
CPC ...... *H01L 31/0508* (2013.01); *H01L 31/0201* (2013.01); *H01L 31/0516* (2013.01); *H01L 31/1876* (2013.01); *H02S 40/34* (2014.12)

(58) Field of Classification Search
CPC ............. H01L 31/0201; H01L 31/0508; H01L 31/0516; H01L 31/1876; H02S 40/34
See application file for complete search history.

(56) References Cited

U.S. PATENT DOCUMENTS 6,150,602 A * 11/2000 Campbell .............. B64G 1/443
136/244
2001/0029975 A1 * 10/2001 Takeyama ........... H01L 31/0504
136/244
(Continued)

*Primary Examiner* — Devina Pillay
(74) *Attorney, Agent, or Firm* — Schwabe, Williamson & Wyatt, P.C.

(57) ABSTRACT

Strings of solar cells having laser assisted metallization conductive contact structures, and their methods of manufacture, are described. For example, a solar cell string includes a first solar cell having a front side and a back side, and one or more laser assisted metallization conductive contact structures electrically connecting a first metal foil to the back side of the first solar cell. The solar cell string also includes a second solar cell having a front side and a back side, and one or more laser assisted metallization conductive contact structures electrically connecting a second metal foil to the back side of the second solar cell. The solar cell string also includes a conductive interconnect coupling the first and second solar cells, the conductive interconnect including a strain relief feature.

2 Claims, 31 Drawing Sheets

(51) Int. Cl.
*H01L 31/18* (2006.01)
*H02S 40/34* (2014.01)

(56) References Cited

U.S. PATENT DOCUMENTS

| | | | |
|---|---|---|---|
| 2014/0190546 A1* | 7/2014 | Fukumochi | H01L 31/042 |
| | | | 438/4 |
| 2014/0373903 A1* | 12/2014 | Hashimoto | H01L 31/0512 |
| | | | 136/251 |
| 2016/0284633 A1* | 9/2016 | Ang | H01L 25/105 |
| 2017/0133535 A1* | 5/2017 | Pass | H01L 31/0512 |

* cited by examiner

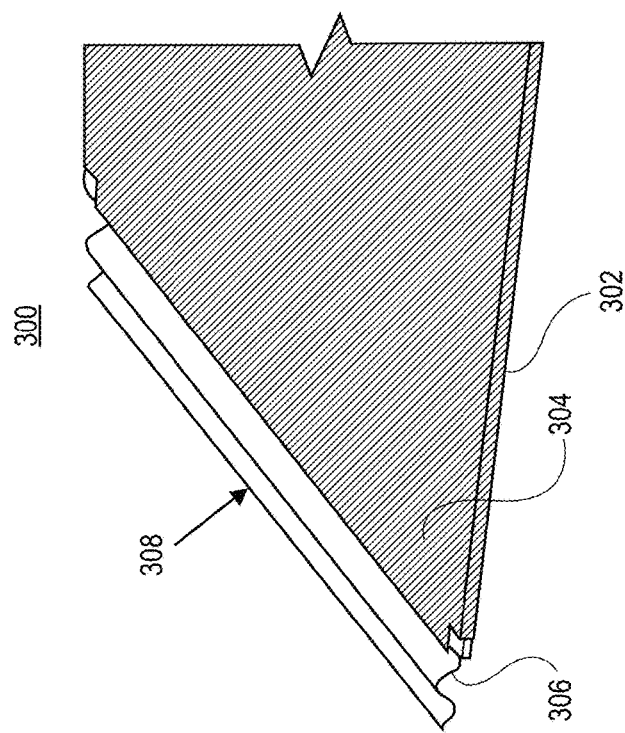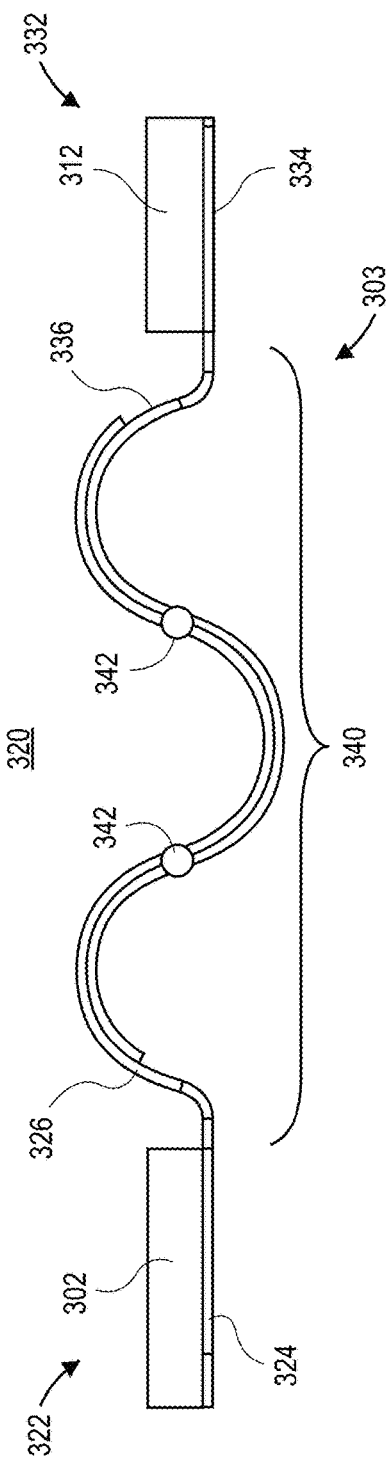

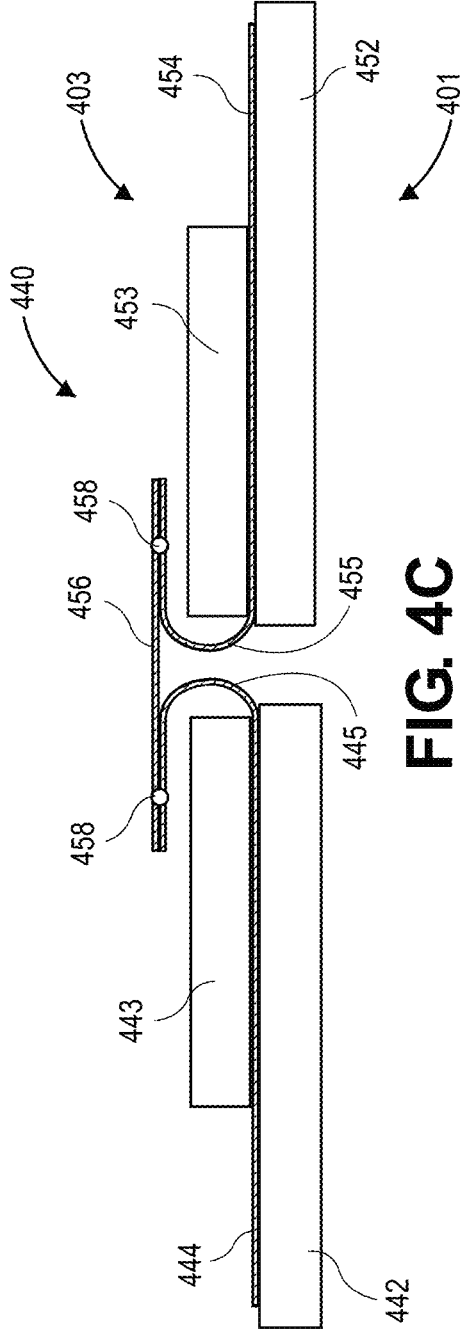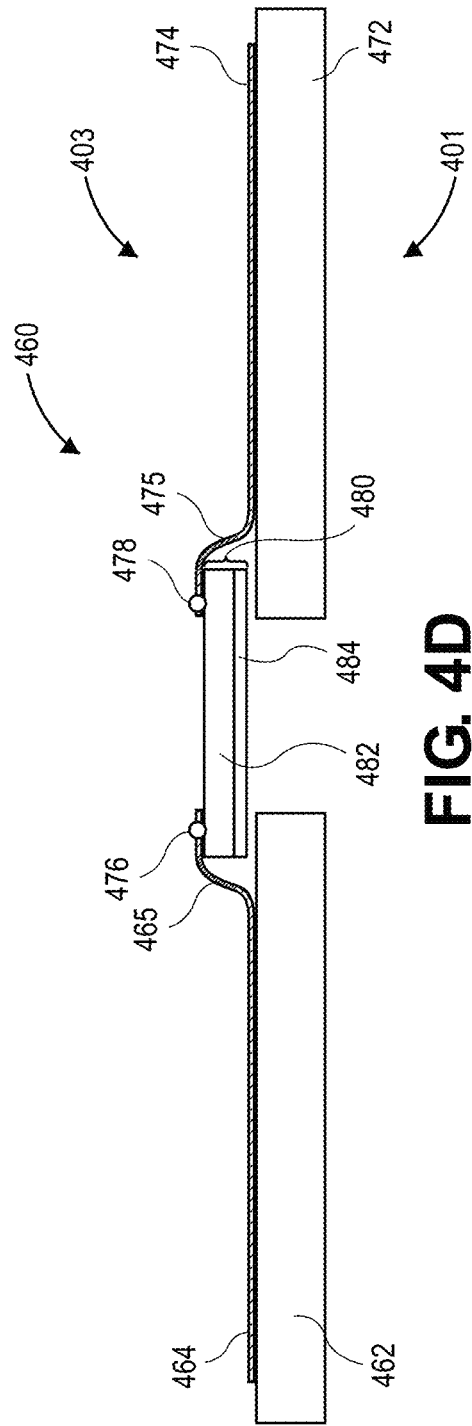

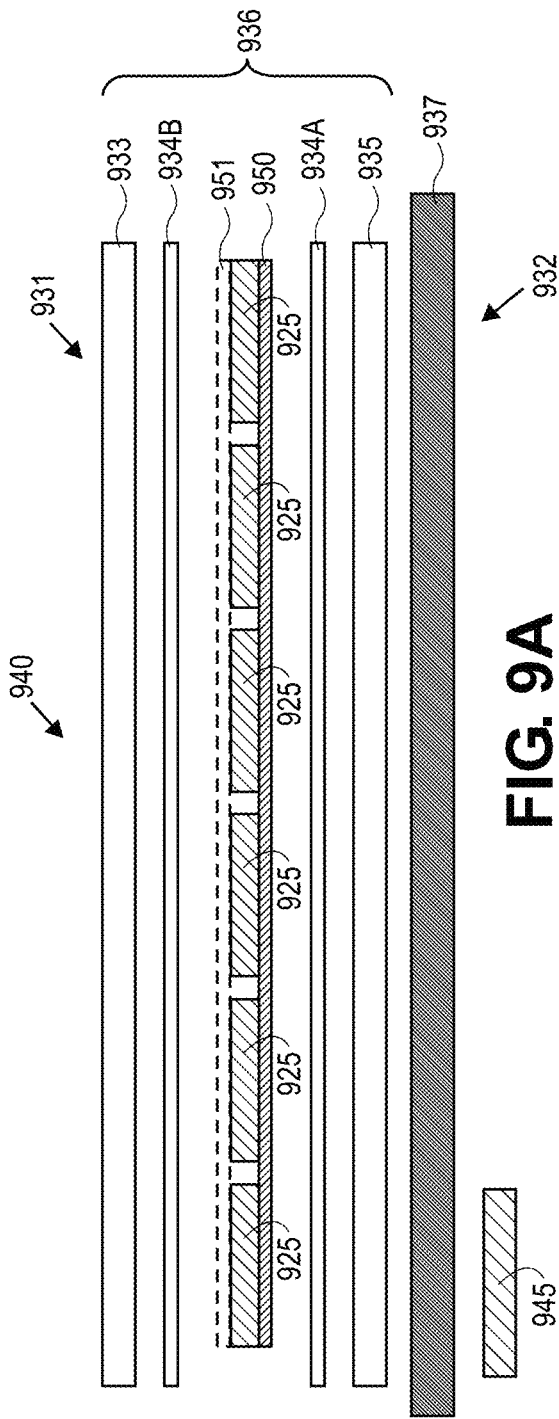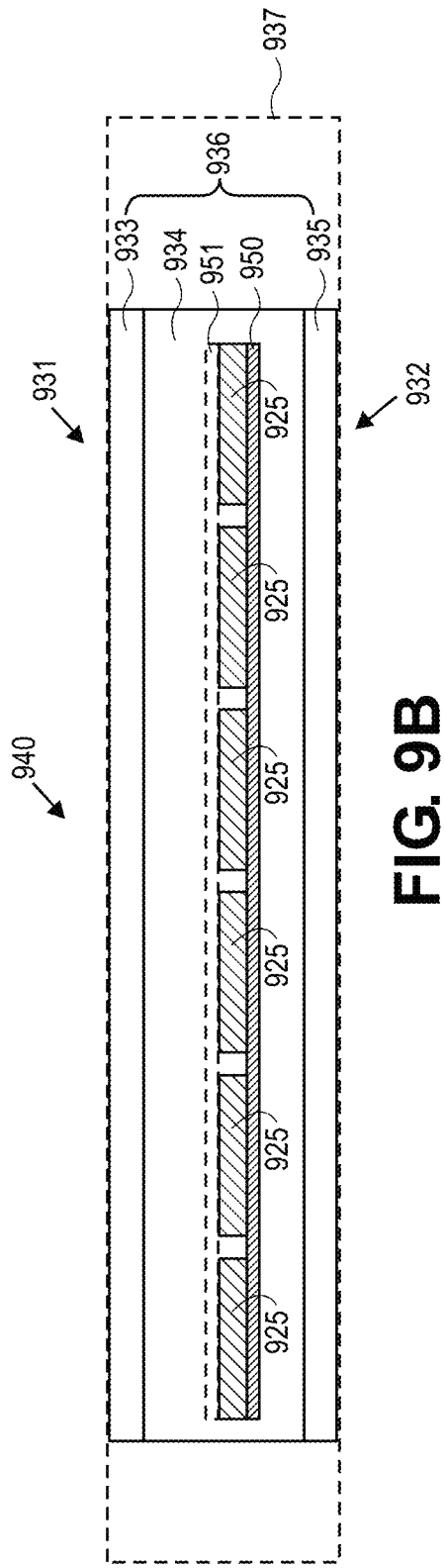
FIG. 9A
FIG. 9B

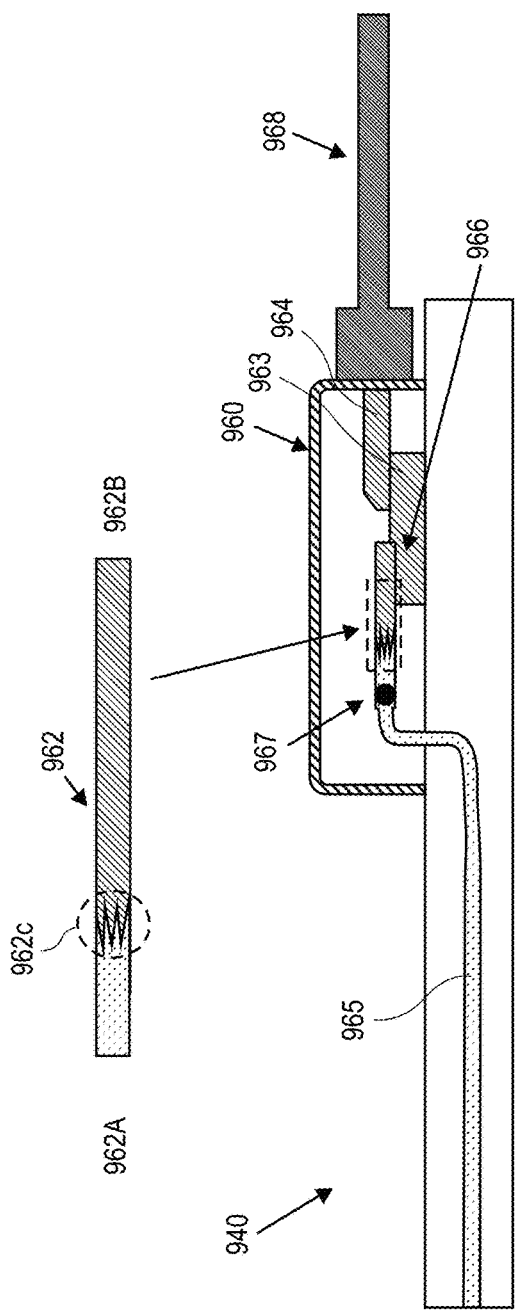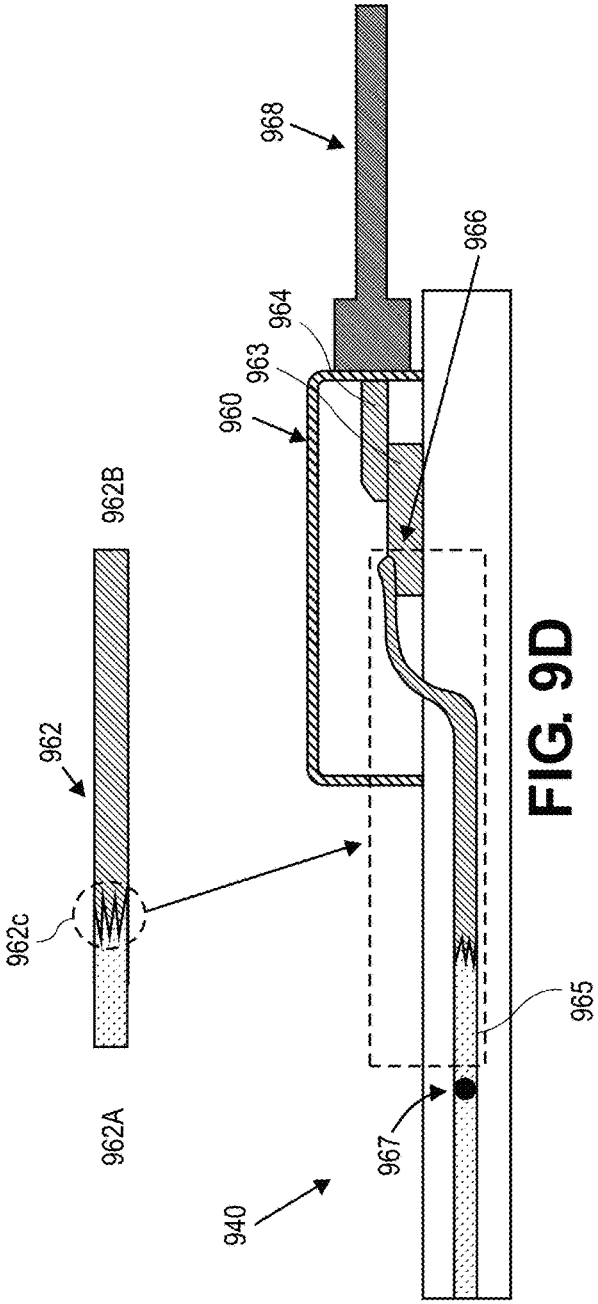

STRINGS OF SOLAR CELLS HAVING LASER ASSISTED METALLIZATION CONDUCTIVE CONTACT STRUCTURES AND THEIR METHODS OF MANUFACTURE

CROSS-REFERENCE TO RELATED APPLICATIONS

This application claims benefit of U.S. Provisional Patent Application No. 63/043,695, filed on Jun. 24, 2020, the entire contents of which are hereby incorporated by reference herein.

TECHNICAL FIELD

Embodiments of the present disclosure are in the field of renewable energy or semiconductor processing and, in particular, include strings of solar cells having laser assisted metallization conductive contact structures and their methods of manufacture.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

BRIEF DESCRIPTION OF THE DRAWINGS

FIG. 3A illustrates an angled view of a solar cell having a foil overhang portion with a strain relief feature, in accordance with an embodiment of the present disclosure.

FIG. 3B illustrates a cross-sectional view of two solar cells coupled by overhang portions with a strain relief feature, in accordance with an embodiment of the present disclosure.

FIGS. 4A-4E illustrate cross-sectional views of various arrangements of two solar cells coupled by an interconnect with a strain relief feature, in accordance with embodiments of the present disclosure.

FIGS. 9A and 9B illustrate cross-sectional views of an example solar cell module, in accordance with an embodiment of the present disclosure.

FIGS. 9C and 9D illustrate example junction boxes and electrical configurations between junction boxes including metal clad cables and solar module and/or laminate, in accordance with an embodiment of the present disclosure.

DETAILED DESCRIPTION

Figure 1A:
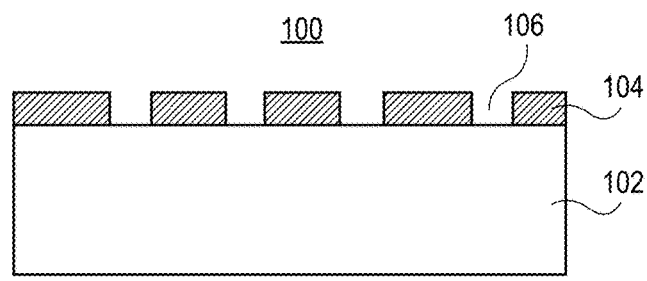
FIG. 1A illustrates a cross-sectional view of a starting structure for a laser assisted metallization patterning (LAMP) process, in accordance with an embodiment of the present disclosure.

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Regions" or "portions" describe discrete areas, volumes, divisions or locations of an object or material having definable characteristics but not always fixed boundaries.

"Comprising" is an open-ended term that does not foreclose additional structure or steps.

"Configured to" connotes structure by indicating a device, such as a unit or a component, includes structure that performs a task or tasks during operation, and such structure is configured to perform the task even when the device is not currently operational (e.g., is not on/active). A device "configured to" perform one or more tasks is expressly intended to not invoke a means or step plus function interpretation under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell is the first solar cell in a sequence; instead the term "first" is used to differentiate this solar cell from another solar cell (e.g., a "second" solar cell).

"Coupled" refers to elements, features, structures or nodes, unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Exposed to a laser beam" describes a process subjecting a material to incident laser light, and can be used interchangeably with "subjected to a laser," "processed with a laser" and other similar phrases.

"Doped regions," "semiconductor regions," and similar terms describe regions of a semiconductor disposed in, on, above or over a substrate. Such regions can have an N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and/or inhibits light reflectivity. An intervening layer can be several layers, for example a stack of intervening layers. In some contexts, the intervening layer can be interchanged with a tunneling dielectric layer, while in others the intervening layer is a masking layer or an "antireflective coating layer" (ARC layer). Exemplary materials include silicon nitride, silicon oxynitride, silicon oxide (SiOx), silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials and combinations thereof. In an example, the intervening layer can include a material that can act as a moisture barrier. Also, for example, the insulating material can be a passivation layer for a solar cell. In an example the intervening layer can be a dielectric double layer, such as a silicon oxide ($SiO_x$), for example with high hydrogen content, aluminum oxide ($Al_2O_3$) dielectric double layer.

"Locally deposited metal" and "metal deposition" are used to describe forming a metal region by exposing a metal source to a laser that forms and/or deposits metal from the metal source onto portions of a substrate. This process is not limited to any particular theory or mechanism of metal deposition. In an example, locally deposited metal can be formed upon exposure of a metal foil to a laser beam that forms and/or deposits metal from the metal foil, such as all of the metal foil exposed to the laser beam, onto portions of a silicon substrate. This process can be referred to as a "Laser Assisted Metallization Patterning" or LAMP technique. The locally deposited metal can have a thickness of 10 nm to 10 microns, a width approximately defined by the laser beam size, and physical and electrical properties matching those of the source metal foil.

"Patterning" refers to a process of promoting separation or separating portions of a source metal, and can specifically refer to weakening a region of a metal foil that is between a bulk of the metal foil and a deposited region of the metal foil (i.e., the deposited metal). This patterning can be the result of heat, perforation, deformation or other manipulation of the metal foil by the same laser process, LAMP, that deposits a metal foil onto a substrate, and can promote removal of the bulk of the metal foil (i.e., the non-deposited metal foil) from the resulting device. Unless expressed otherwise, references to LAMP includes such patterning.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein. A substrate also can be glass, a layer of polymer or another material.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

As described in further detail below, aspects of this disclosure relate to increased solar cell conversion efficiency and/or lower manufacturing costs by providing novel processes for fabricating solar cell structures and strings of solar cell structures.

Local patterning and metallization of substrate structures, for example semiconductor substrate structures, using a laser beam, and the resulting structures, e.g., metallized micro-electronic devices, semiconductor substrates and/or solar cells, are described herein. In accordance with one or more examples, a metal for a conductor contact is effectively deposited and patterned, and this process can be accomplished in a single operation with a laser. In an exemplary process, a metal foil (as a metal source) is placed over a surface of a substrate, such as a semiconductor solar cell, and portions of the metal foil are exposed to a laser beam to create localized heat for localized metal deposition while at the same time patterning the metal foil (the source metal layer).

In further examples, the above described local patterning and metallization process is performed in the presence of a non-patterned intervening layer or stack of intervening layers on a substrate or substrate feature. In a particular example, the intervening layer or stack is not subjected to a patterning process prior to positioning a metal foil on top of the intervening layer or stack, and in addition to patterning and locally depositing metal from a metal foil, the laser beam patterns the non-patterned intervening layer or stack of intervening layers in the same process operation.

After the deposition and patterning process, remnants of the source of the metal layer can be removed in a subsequent process. For example, portions of a metal foil that are not exposed to the laser beam are removed (i.e., non-deposited metal foil is removed). In a further example, portions of the metal foil are exposed to a subsequently applied laser beam, such as another laser beam and/or exposed to a laser having different properties (e.g., power, frequency, etc.). This subsequent processing can provide further patterning of the metal foil for purposes of removing the non-deposited metal foil. In certain implementations, a LAMP technique is repeated on a substrate in successive steps to form a metal layer on the substrate.

FIG. 1A illustrates a cross-sectional view of a starting structure for a laser assisted metallization patterning (LAMP) process, in accordance with an embodiment of the present disclosure.

Referring to FIG. 1A, a starting structure 100 for a LAMP process includes a patterned layer 104 (such as a patterned dielectric layer, a patterned insulating layer or a patterned organic mask) on an underlying structure or substrate 102. The patterned layer 104 has openings 106 therein exposing portions of the underlying structure or substrate 102. In an example, the patterned layer 104 is on a side of underlying structure or substrate 102 opposite a light receiving surface, which can be a texturized light-receiving surface. In some examples, the patterned layer 104 is formed and/or disposed on the light receiving surface of the substrate 102.

In an example, underlying structure or substrate 102 is a monocrystalline silicon substrate, such as a bulk single crystalline N-type doped silicon substrate. It is to be appreciated, however, that underlying structure or substrate 102 can be a layer, such as a multi-crystalline silicon layer, on a global solar cell substrate. In one example, underlying structure or substrate 102 has therein N-type doped regions and P-type doped regions. The N-type semiconductor regions and P-type semiconductor regions can be on a dielectric layer. In an example, the N-type semiconductor regions and P-type semiconductor regions can be on a dielectric layer including a thin dielectric material as an intervening material between the N-type semiconductor regions or P-type semiconductor regions, respectively, and the underlying structure or substrate 102. In an example, the N-type semiconductor regions and P-type semiconductor regions can be in a polycrystalline layer disposed on the dielectric layer.

Figure 1B:
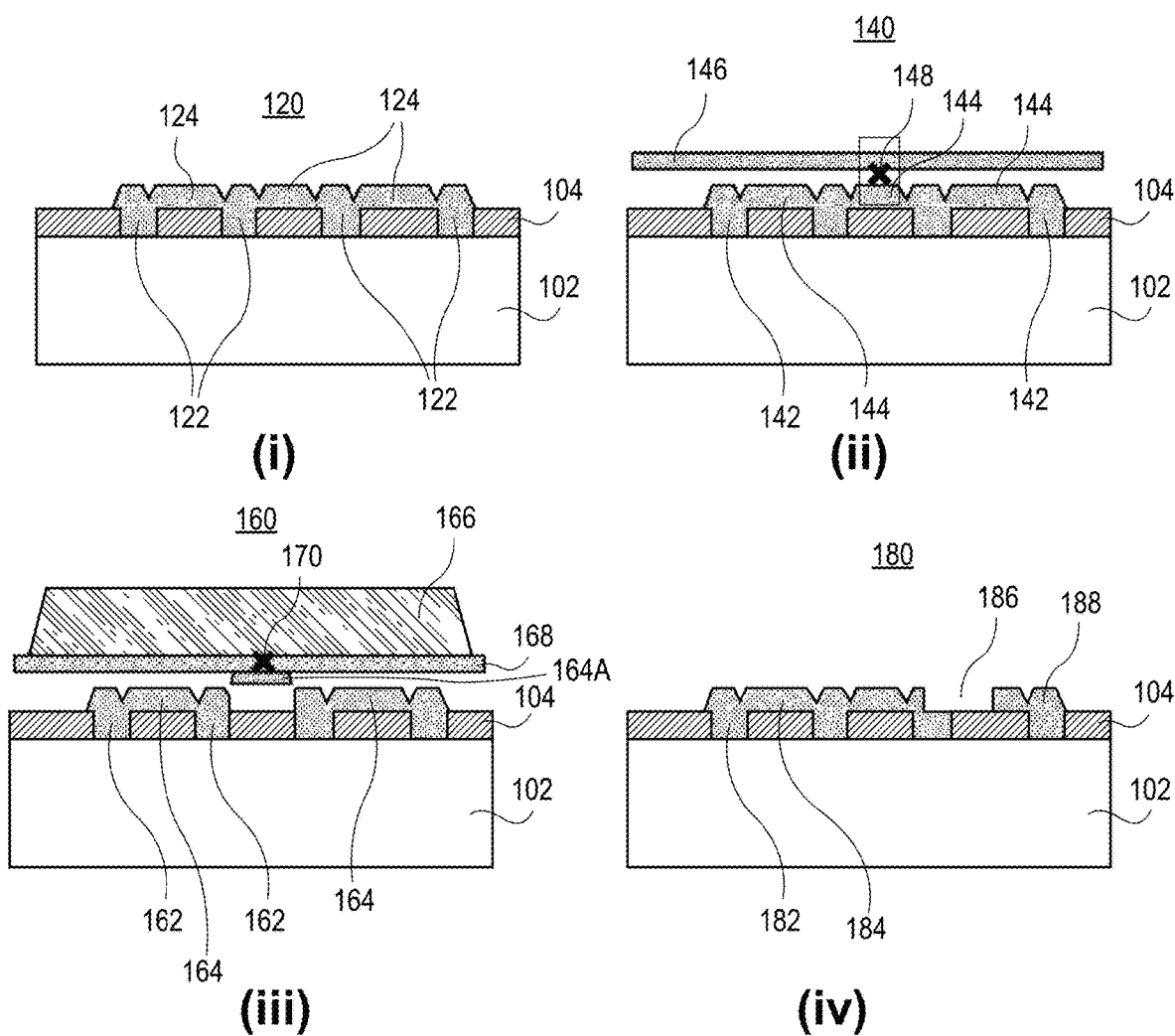
FIG. 1B illustrates cross-sectional view of various structures resulting from a LAMP process, in accordance with an embodiment of the present disclosure.

FIG. 1B illustrates cross-sectional views of various structures resulting from a LAMP process, in accordance with an embodiment of the present disclosure.

Referring to part (i) of FIG. 1B, a structure 120 includes locally deposited metal portions 122 in the openings 106 of the starting structure 100 of FIG. 1A. The locally deposited metal portions 122 can be connected by excess foil portions 124 remaining from the LAMP process.

Referring to part (ii) of FIG. 1B, a structure 140 includes locally deposited metal portions 142 in the openings 106 of the starting structure 100 of FIG. 1A. The locally deposited metal portions 142 can be connected by excess foil portions 144 remaining from the LAMP process. A second LAMP process can be performed to weld a carrier 146, such as a second foil, to one or more of the excess portions 144, e.g., at weld location 148. In an example, although one weld location 148 is shown, there can be multiple weld locations to weld the carrier 146 to the excess foil portions 144.

Referring to part (iii) of FIG. 1B, a structure 160 includes locally deposited metal portions 162 in the openings 106 of the starting structure 100 of FIG. 1A. The locally deposited metal portions 162 can be connected by excess foil portions 164 remaining from the LAMP process. One or more 164A of the excess portions 164 can be mechanically grabbed and removed. In one such embodiment, a carrier 166 has a metal foil 168 thereon. The metal foil 168 is bonded to one or more 164A of the excess portions 164, e.g., at weld location 170, and the one or more 164A of the excess portions 164 is then removed to provide structure 160. In an example, other excess foil portions 164 can remain connecting adjacent locally deposited metal portions 162, as shown.

Referring to part (iv) of FIG. 1B, a structure 180 includes locally deposited metal portions 182 in the openings 106 of the starting structure 100 of FIG. 1A. The locally deposited metal portions 182 can be connected by excess foil portions 184 remaining from the LAMP process. In one embodiment, an etch process can then be used to remove a region of the locally deposited metal portions 182 and/or the excess foil portions 184, e.g., at location 186, to leave an isolated conductive structure 188. In one embodiment, the isolated conductive structure 188 is a p-finger for a cell tester structure. Although as shown, some excess foil portions 184 can remain, in one example, the excess foil portions 184 can be removed where the locally deposited metal portions 182 can remain disposed over the substrate 102.

Cell to cell stringing and circuit formation can be critical to the creation of a solar product (e.g., solar cell string, solar laminate, solar module, etc.). In particular, effectively addressing the mechanical and electrical requirements to adequately connect solar cells together can require specific processes and structures. This becomes more critical when thin foils are used for the metallization and when a LAMP process and/or a LAMP bond is used to adhere a foil to a substrate of the solar cell. Disclosed herein are embodiments directed to structures, processes and tools for addressing some of the challenges of stringing and/or forming a circuit formation for a solar product.

Figure 2A:
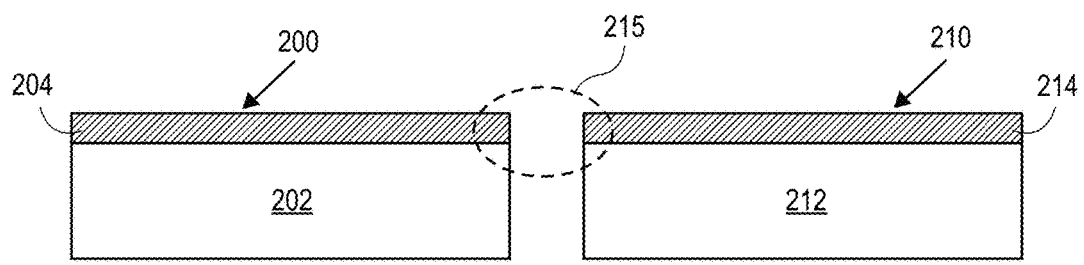
FIG. 2A illustrates a cross-sectional view of two adjacent solar cells having LAMP adhered foil thereon, in accordance with an embodiment of the present disclosure.

FIG. 2A illustrates a cross-sectional view of two adjacent solar cells having LAMP adhered foil thereon, in accordance with an embodiment of the present disclosure.

Referring to FIG. 2A, a first solar cell 200 includes an underlying structure or substrate 202 having a LAMP adhered foil 204 thereon. A second solar cell 210 includes an underlying structure or substrate 212 having a LAMP adhered foil 214 thereon. A potential interconnect location 215 is indicated between the first solar cell 200 and the second solar cell 210. Exemplary interconnect features for inclusion at potential interconnect location 215 are described below.

Figure 2B:
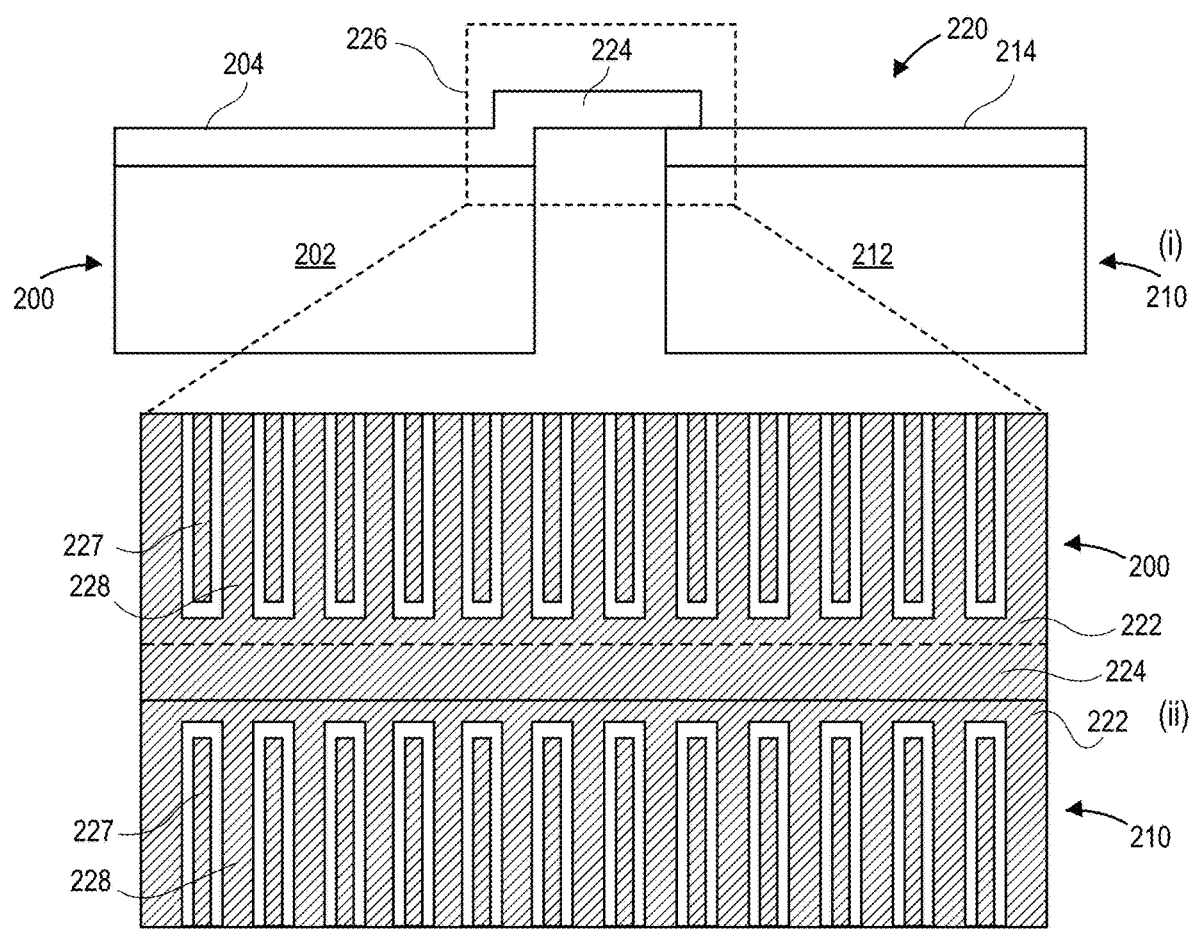
FIG. 2B illustrates a cross-sectional view (i) and a plan view (ii) of solar cells including an overhang portion, in accordance with an embodiment of the present disclosure.

FIG. 2B shows images of a solar cell having LAMP adhered foil thereon, in accordance with an embodiment of the present disclosure. Reference numbers used for structures described in FIG. 2A can also refer to the same or similar structures described in FIG. 2B. In an example, the first solar cell 200 and second solar cell 210 in FIG. 2A can also refer to the first solar cell 200 and second solar cell 210 in FIG. 2B.

Referring to image (i) of FIG. 2B, a solar cell structure 220 having a LAMP adhered foil is shown. In embodiments, the solar cell structure 220 can include a first solar cell 200 having a first substrate 202. In embodiments, the solar cell structure 220 can include a second solar cell 210 having a second substrate 212. In an example, as described above, the substrates 202, 204 can include silicon substrates. In embodiments, a first LAMP adhered foil 204 can be disposed over the first substrate 202 and a second LAMP adhered foil 214 can be disposed over the second substrate 212. In embodiments, the first LAMP adhered foil 204 can include an overhang portion 224 which extends beyond the underlying structure or substrate 202. In embodiments, the overhang portion 224 can extend over an edge of the second substrate 212 and the second LAMP adhered foil 214. In embodiments, the overhang portion 224 can be bonded to the second LAMP adhered foil 214. In an example, the overhang portion 224 can be welded to the second LAMP adhered foil 214.

Referring to (ii) of FIG. 2B, a plan view of portion 226 of image (i) of FIG. 2A is shown. In (ii) of FIG. 2B, finger portions 227, 228 of the LAMP adhered foil 204, 214 bonded to the underlying structure or substrate of the solar cell structure 220 are viewable. In embodiments, the pitch distance between finger portions 227, 228 can be approximately in a range between 0.5-2 millimeters. In an example, the distance between the center of one finger of the finger portions 227 to the center of an adjacent finger 228 can be approximately in a range of 0.5-2 millimeters. In embodiments, referring again to (ii), the LAMP adhered foil at 222 can also represent a busbar portion of the LAMP adhered foil located on the solar cell structure. In an embodiment, the width of at least one finger of the finger portions 227, 228 can be greater than 200 µm. In an example the width of at least one finger of the finger portions 227, 228 can be in a range of 100-500 µm. In embodiments, the terms solar cells and solar cell structure can be used interchangeably throughout the disclosure.

Figure 2C:
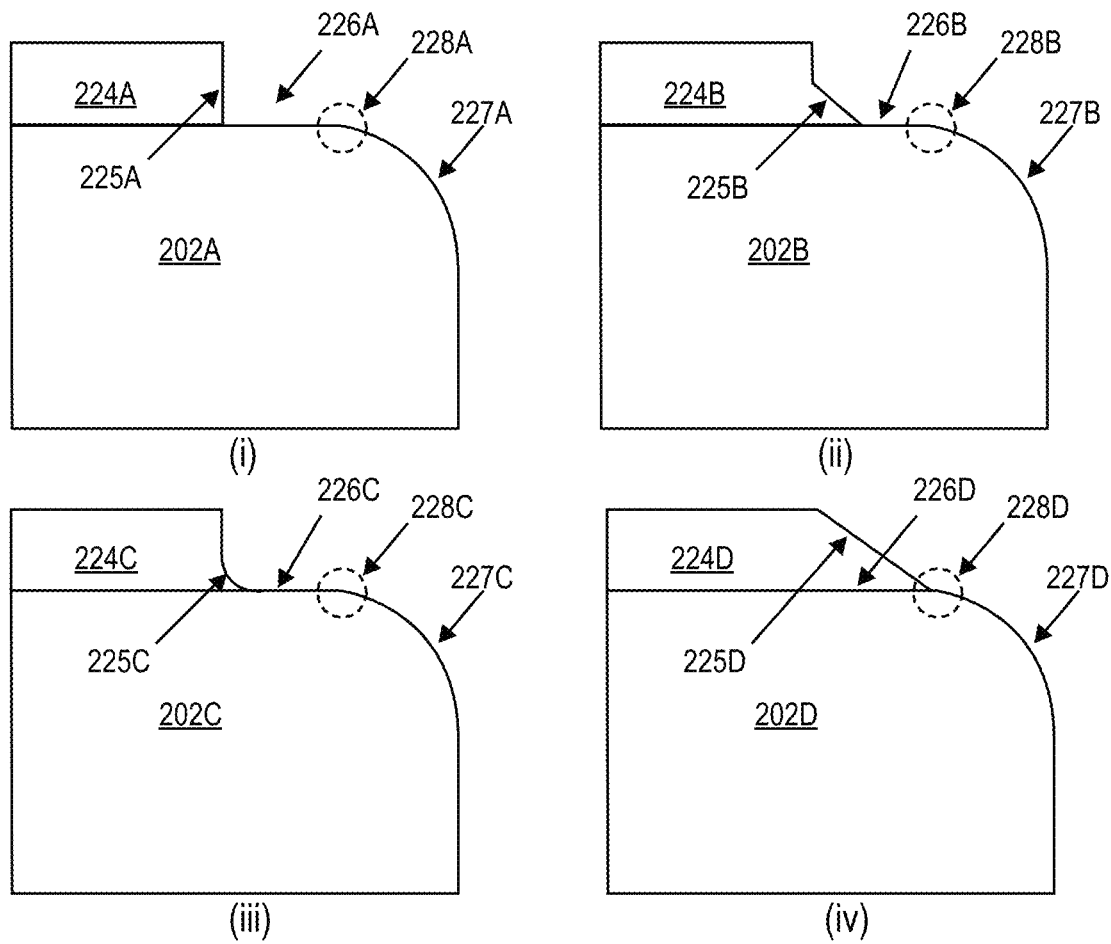
FIG. 2C illustrates plan views of solar cells including overhang portions, in accordance with embodiments of the present disclosure.

Referring to FIG. 2C, cross-sectional views are shown corresponding to an example of solar cells having overhang portions, in accordance with an embodiment of the present disclosure. In particular, four example solar cells are shown in each of (i) to (iv) of FIG. 2C. Referring to (i)-(iv) of FIG. 2C, in embodiments, each of the solar cells shown can include a substrate 202A, 202B, 202C and 202D. In an embodiment, each of the substrates 202A, 202B, 202C, 202D can include an edge 226A, 226B, 226C and 226D, respectively. In an embodiment, each of the substrates can also include at least one pseudo corner 227A, 227B, 227C and 227D, respectively. In an embodiment, each of the pseudo corners 227A, 227B, 227C, 227D can include at least one pseudo corner vertex 228A, 228B, 228C and 228D, respectively. In an example, at least one of the pseudo corner vertexes 228A, 228B, 228C, 228D can be located where the substrate edges 226A, 226B, 226C, 226D meet the pseudo corners 227A, 227B, 227C, 227D, respectively.

Referring again to FIG. 2C, in embodiments, the overhang portions can include any type or shape and/or design. In an example, the overhang portions can include a rectangular, curved, trapezoidal, beveled and any other type of shape. Referring to (i) of FIG. 2C, in an example, the overhang portions 224 can include a rectangular overhang portion 224A. Referring to (ii) of FIG. 2C, in an example, the overhang portion can include a trapezoidal overhang portion 224B. Referring to (iii) of FIG. 2C, in an example, the overhang portion can include a beveled overhang portion 224C. Referring to (iv) of FIG. 2C, in an example, the overhang portion can include a pseudo corner extension overhang portion 224D.

Referring to (i) of FIG. 2C, in embodiments, the rectangular overhang portion 224A can extend off the edge 226A of a substrate 202A. In embodiments, the rectangular overhang portion 224A can include an edge 225A which can be perpendicular to the edge 226A of the substrate 202A.

Referring to (ii) of FIG. 2C, in embodiments, the trapezoidal overhang portion 224B can include an edge 225B which can have an angled portion and a perpendicular portion with respect to the edge 226B of the substrate 202B (e.g., at least one side of the edge 225B can shaped similar to the edge of a trapezoid). In an embodiment, the angled portion of 225B can include an angle less than 45 degrees from the edge 226B. In an embodiment, similar to the edge 225A, the perpendicular portion of edge 225B can be perpendicular to the edge 226B of the substrate 202B.

Referring to (iii) of FIG. 2C, in embodiments, the beveled overhang portion 224C can include an edge 225C which can be curved. In an example, the curvature of the edge 225 can be inward, or in one example, the curvature can be toward the metal of the beveled overhang portion 224C or away from the edge 226C of the substrate 202C.

Referring to (iv) of FIG. 2C, in embodiments, in contrast to the overhang portions above, the pseudo extension overhang portion 224D can extend to the vertex 228D of the pseudo corner 227D of the substrate 202D. In an embodiment, the pseudo extension overhang portion 224D can be continuous from one pseudo vertex to another pseudo vertex of a substrate, e.g., in contrast to the overhang portions 224A. 224B and 224C which can include a gap or a space between the overhang portions 224A, 224B. 224C to pseudo vertex portions 228A, 228B, 228C, respectively.

Figure 2D:
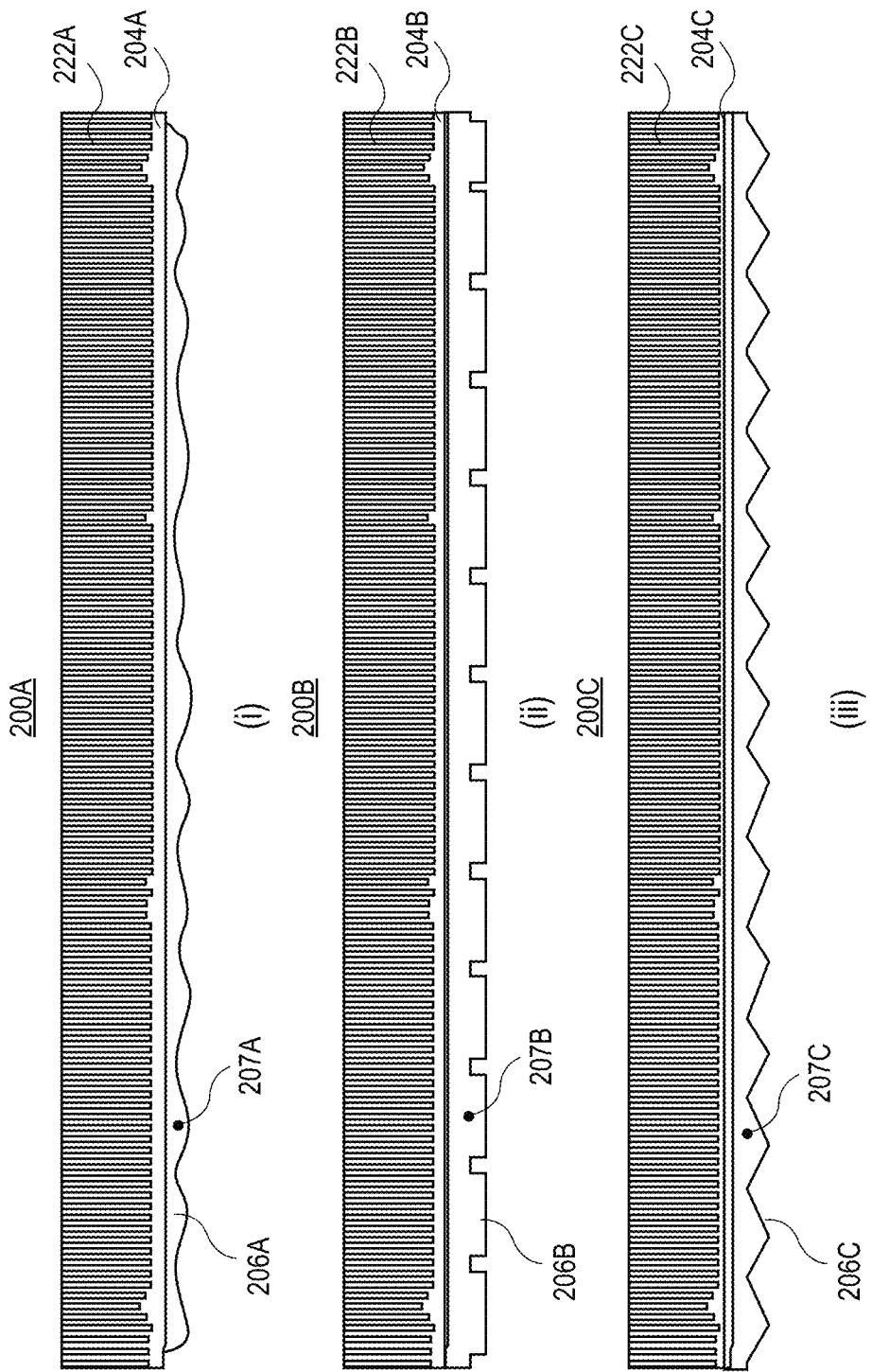
FIG. 2D illustrates plan views of solar cells including an overhang portion, in accordance with an embodiment of the present disclosure.

Referring to FIG. 2D, plan views are shown corresponding to example of solar cells having overhang portions, in accordance with an embodiment of the present disclosure. In a particular example, (i) of FIG. 2D shows a curved or a wavey overhang portion 206A, (ii) of FIG. 2D shows rectangular or square overhang portions 206B and (iii) shows triangular overhang portions 206C.

Referring to (i) of FIG. 2D, a solar cell 220A can include a LAMP adhered foil 222A thereon. The LAMP adhered foil 222A can include an overhang portion 206A which extends beyond the underlying structure or substrate of the solar cell 200B. In an embodiment, an edge of the overhang portion 206A can include a curved or wavy pattern to provide stress relief for bonding to the overhang portion 206A. Although the overhang portion 206A is shown to include a wavy pattern, other patterns can also be used. In an example, the patterned overhang portion can include a square wave pattern, triangular wave pattern, sawtooth wave pattern, a rounded or sinusoidal wave pattern, a trapezoidal wave patterned, polygonal wave pattern and/or any other type of shape, curvature or pattern can be used.

Referring to (ii) of FIG. 2D, a solar cell 220B can include a LAMP adhered foil 222B thereon. The LAMP adhered foil 222B can include an overhang portion 206B which also extends beyond the underlying structure or substrate of the solar cell 200B. In an embodiment, an edge of the overhang portion 206B can include a rectangular, square and/or a square wave pattern to provide stress relief for bonding to the overhang portion 206B.

Referring to (iii) of FIG. 2D, a solar cell 220C can include a LAMP adhered foil 222C thereon. The LAMP adhered foil 222C can include an overhang portion 206C which also extends beyond the underlying structure or substrate of the solar cell 200C. In an embodiment, an edge of the overhang portion 206C can include a triangular and/or a triangular wave pattern to provide stress relief for bonding to the overhang portion 206C.

Referring again to (i) to (iii) of FIG. 2C, in embodiments, the overhang portions 206A, 206B, 206C can include strain relief and/or stress relief features built into the overhang portions. In an example of stress relief and/or strain relief features, the overhang portions 206A. 206B, 206C can include cutouts, slits, holes, and/or any other type of gap/cavity/break. In an example, the shapes and/or features of 206A, 206B 206C can provide stress relief during bonding the overhang portions 206A, 206B, 206C to another solar cell or to another overhang portion of another solar cell. In an example, the bonding can be performed at the extended portions 207A. 207B, 207C shown in (i), (ii) and (iii) of FIG. 2D, respectively.

Figure 2E:
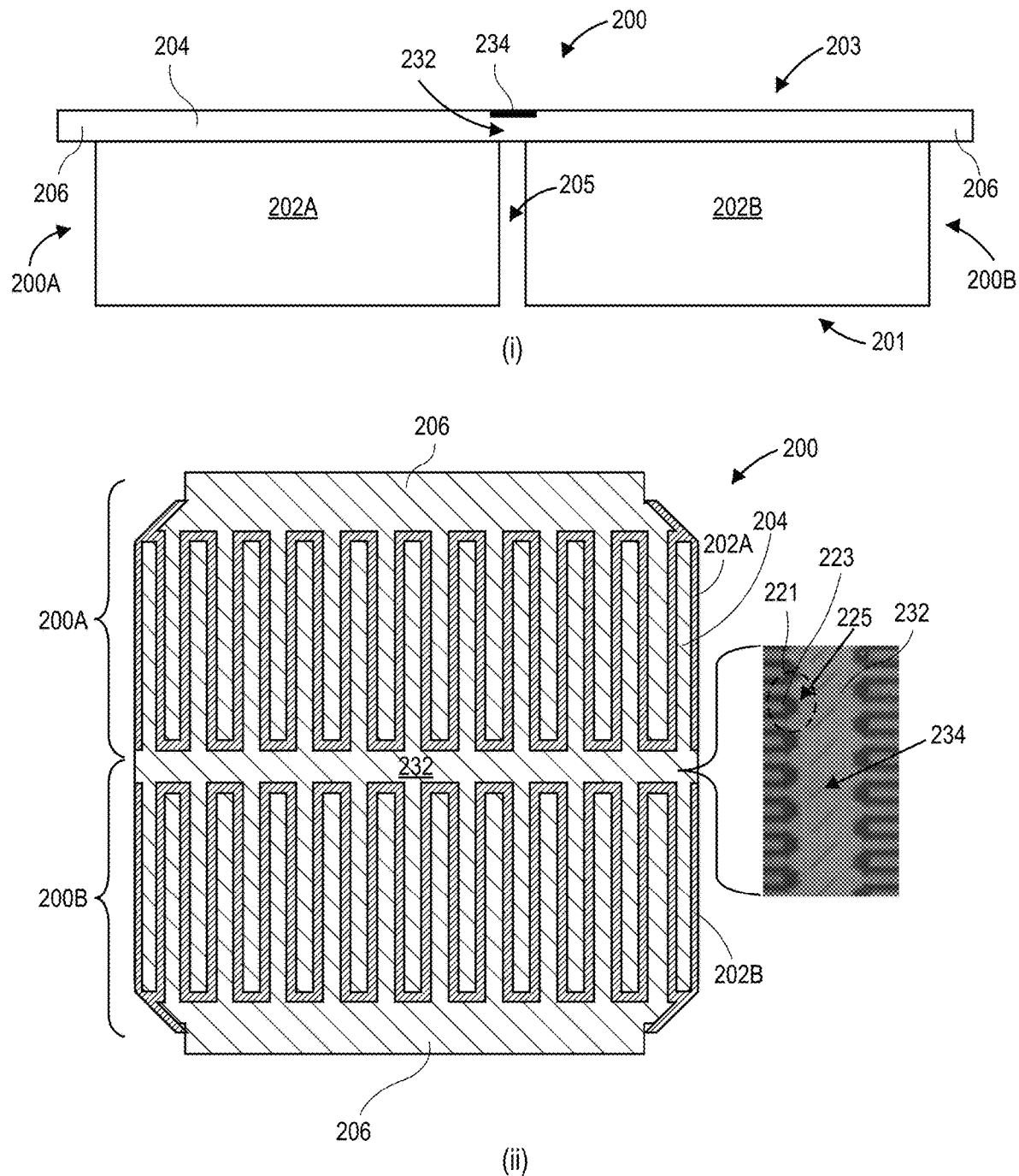
FIG. 2E is a cross-sectional (i) and a plan view (ii) of a solar cell metallization structure, in accordance with an embodiment of the present disclosure.

Referring to FIG. 2E, a cross-sectional view (i) and a plan view (ii) is shown corresponding to a solar cell having a plurality of sub-cells coupled by metallization structure.

Referring to (i) and (ii) of FIG. 2E, in embodiments, a solar cell 200, can include a plurality of sub-cells 200A, 200B, each of the sub-cells having a singulated and physically separated semiconductor substrate portion 202A, 202B. In embodiments, the solar cell 200 can have a front side 201 and a back side 203 opposite the front side 201. Adjacent ones of the singulated and physically separated semiconductor substrate portions can have a groove 205 there between. The solar cell 200 also can include a metallization structure 204. In some examples, the metallization structure 204 can be referred to as a monolithic metallization structure (MMD). In an example, the metallization structure 204 can include LAMP adhered foil as described above. In embodiments, a portion of the metallization structure 232 can couple ones of the plurality of sub-cells 200A, 200B together. The groove 205 between adjacent ones of the singulated and physically separated semiconductor substrate portions 202A. 202B can expose a portion of the metallization structure (e.g., from a front side 201 of the solar cell 200). Such solar cells and related fabrication structures and processes are also disclosed in the following commonly-assigned disclosure, which is incorporated herein by reference in their entirety: U.S. Pat. No. 9,496,437, entitled "Solar cell having a plurality of sub-cells coupled by a metallization structure" filed on Mar. 28, 2014 by Gabriel Harley, Michael Morse and Peter John Cousins. Also shown are overhang portions 206, as described above and herein.

Referring again to (i) and (ii) of FIG. 2E, the metallization structure 232 of the solar cell 200 can include reinforcement features 234. In an example, the reinforcement features 234 can include welded and/or at least partially melted portions of the metallization structure 232. In an embodiment, the reinforcement features can include a line as shown. An embodiment, although the reinforcement feature shown is in a shape of a line, other shapes, structures and formations can be used. In an example, the reinforcement feature 234 can include a line, dashed line, dot, circle, square, rectangular, oblong, oval, any other polygon, curvature or shape can be used. In an embodiment, the reinforcement structures 234 can be formed using a laser. In an example, a laser welding process can be used to form the reinforcement structures 234. In one example, the reinforcement structures can be bonded to an underlying semiconductor region (e.g., a p-doped or an n-doped region) in or above the substrates 202A, 202B. In an embodiment, the reinforcement structures can be bonded to an underlying metal layer (e.g., a thin metal layer, a layer of metal foil, a wire).

Referring to (ii) of FIG. 2E, in embodiments, also shown are finger base structures 221. In an embodiment, the finger base structure 221 can include a metal finger 223 and a spacing 225 between the metal finger 223 the metallization structure 232. In embodiments, the finger base structure 221 can add structural support and rigidity to the bonding of the metal fingers 223, metallization structure 232 to the solar cell 200. In embodiments, as shown, the finger base structure 221 can include a trapezoidal shape as shown. In an example, the spacing 221 can include a trapezoidal shape or any other shape. In embodiments, the finger base structure 221 can include a circular, oblong, square, rectangular, triangular, polygonal or any other shape.

In another aspect, parting and detaching of metal can be a substantial failure mode. One concept to address or reduce breakages or metal detach includes the formation of the overhanging foil connecting adjacent solar cells into a so-called "W" or strain relief feature. Intimate contact between the wings can be critical for successful welds in such features. Either clever vacuum, down holders, or some other method to force the wings together can be used for coupling. In one embodiment, e.g., for handling purposes, the wings are made flat and smooth prior to welding to ensure intimate contact. It is to be appreciated that in order to avoid breaking of strings due to thermal cycling may require some type of strain relief. A stringing process can contribute by forming an "accordion" type structure with overlapping foil that can flex with temperature.

FIG. 3A illustrates an angled view of a solar cell having a foil overhang portion with a strain relief feature, in accordance with an embodiment of the present disclosure.

Referring to FIG. 3A, a solar cell structure 300 includes a LAMP adhered foil 304 on an underlying structure or substrate 302. The LAMP adhered foil 304 has an overhang portion 306. The overhang portion 306 can include a strain relief feature 308 formed therein. In embodiments, the feature 308 can include a structural pattern configured to inhibit mechanical stress and/or mechanical strain. Further description of the structural and functional aspects of the strain relief feature 308 are described below.

FIG. 3B illustrates a cross-sectional view of two solar cells coupled by foil overhang portions with a strain relief feature in accordance with an embodiment of the present disclosure.

Referring to FIG. 3B, a solar cell string 320 includes a first solar cell 322 having a front side 301 and a back side 303. In embodiments, the first solar cell 322 can include a first substrate 302. One or more laser assisted metallization conductive contact structures electrically connects a first metal foil 324 to the first substrate 302 at the back side 303. The solar cell string 320 also includes a second solar cell 332 having a front side 301 and a back side 303. In embodiments, the second solar cell 332 can include a second substrate 312. One or more laser assisted metallization conductive contact structures (e.g., LAMP structures) electrically connects a second metal foil 334 to the to the second substrate 312 at back side 303. The solar cell string 320 also includes a conductive interconnect 340 coupling the first 322 and second 332 solar cells. The conductive interconnect 340 can include a strain relief feature which includes a plurality of folds out of plane from the first 322 and second 332 solar cells. In an embodiment, the strain relief feature of conductive interconnect 340 can be referred to as a W or M strain relief feature. In embodiments, the strain relief feature of the conductive interconnect 340 can include a wavey pattern, sinusoidal pattern, sawtooth pattern, square wave pattern and/or any other type of pattern. The strain relief feature can include an overhang portion 326 of the first metal foil 324 and an overhang portion 336 of the second metal foil 334. The first metal foil 324 can be bonded (e.g., welded) to the overhang portion 336 of the second metal foil 334 at one or more locations 342.

Figure 3C:
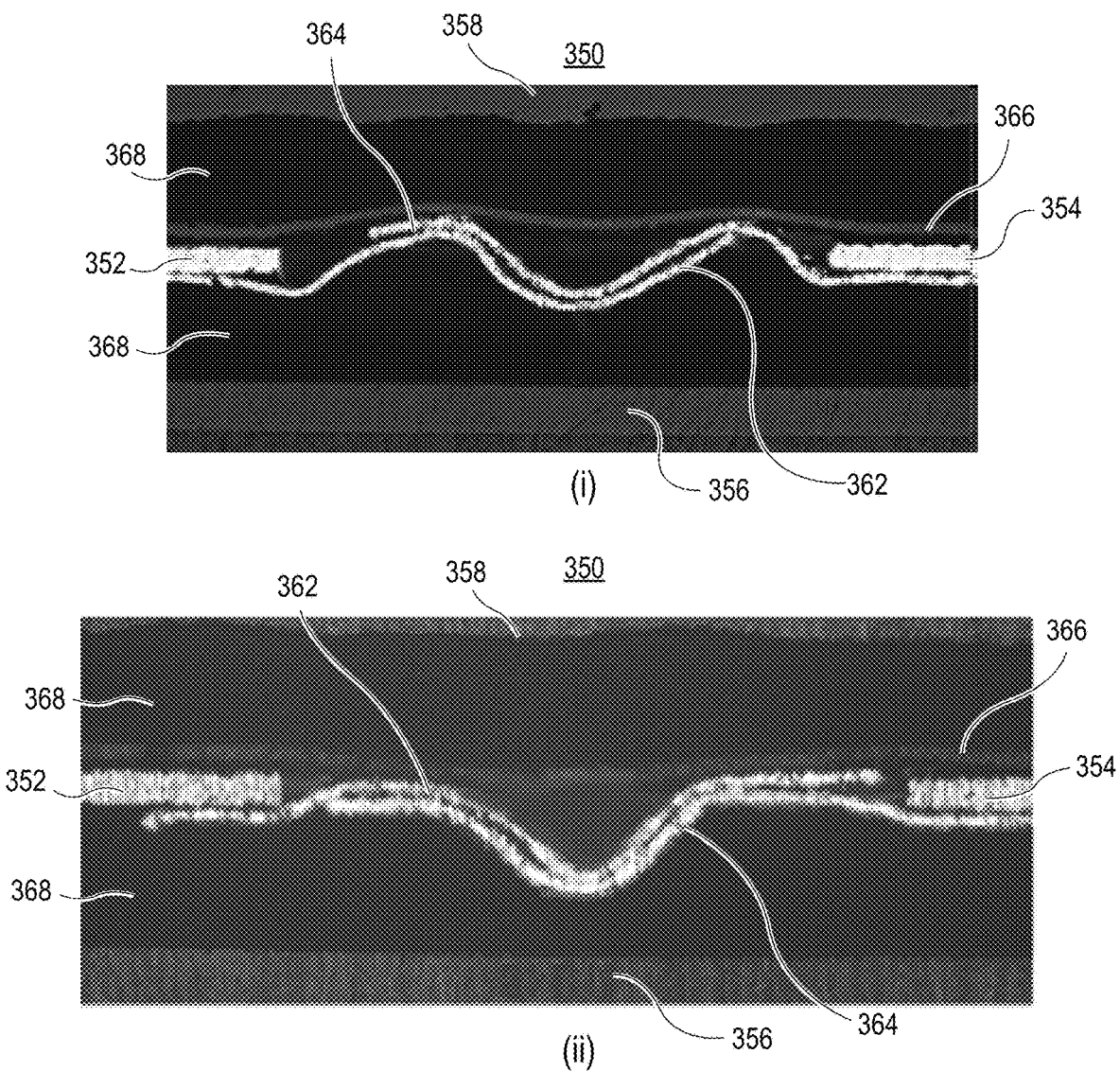
FIG. 3C are images of a cross-sectional view of a string of solar cells coupled by overhang portions with a strain relief feature, in accordance with an embodiment of the present disclosure.

FIG. 3C illustrates images of two solar cells coupled by foil overhang portions with a strain relief feature, in accordance with an embodiment of the present disclosure.

Referring to FIGS. 3C (i) and 3C (ii), a portion of a solar cell string is shown including a first solar cell 352 and a second solar cell 354 between a backsheet 356 and glass 358, e.g., as in a photovoltaic laminate and/or module. The first solar cell 352 and the second solar cell 354 can be coupled by foil portions 362 and 364, respectively, such as aluminum (Al) foil portions, which can be supported by an insulator 366. An encapsulant 368 can be included throughout the structure. Referring to FIG. 3C (i), an image is shown where the foil portion 362 can be disposed under the foil portion 364. In embodiments, referring to FIG. 3C (ii), an image is shown where the foil portion 364 can be disposed under the foil portion 362. In one example, the configuration shown FIG. 3C (i) can be located at one end of a solar cell and the configuration shown FIG. 3C (ii) can be located at another (e.g., opposite) end of a solar cell. In some examples, the configurations shown, e.g., the one foil portion 362/364 over another can be used in any number of combinations, for example the portion 362 can be located over the portion 364 on both (e.g., opposite) ends of a solar cell. In one example, the portion 364 can be located over the portion 362 on both (e.g., opposite) ends of a solar cell. Still, in another example, the portion 362 can be located over the portion 364 on one end and the portion 364 can be located over the portion 362 on another (e.g., opposite) end of a solar cell. Thus, any number of configurations can be used. Further examples of a PV module. e.g., including a backsheet, glass and encapsulant, are shown in FIG. 9D below.

Figure 3D:
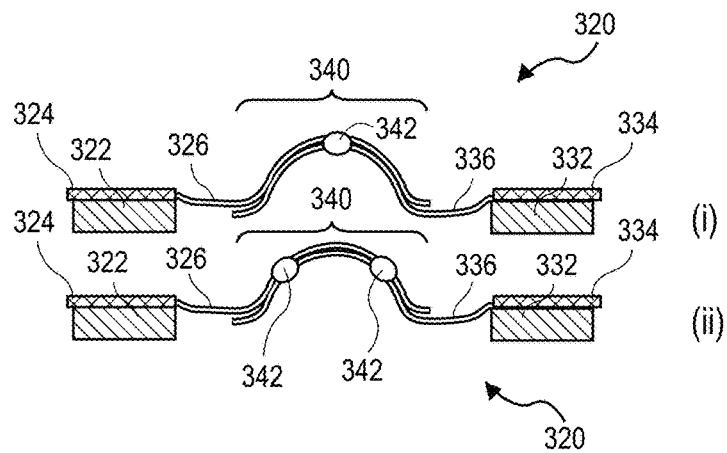
FIG. 3D illustrates a cross-sectional view of a string of pairs of solar cells coupled by overhang portions with a strain relief feature, in accordance with an embodiment of the present disclosure.

FIG. 3D illustrates two cross-sectional views of two solar cells coupled by foil overhang portions with a strain relief feature in accordance with an embodiment of the present disclosure.

Referring to FIG. 3D, a solar cell string 320 includes a first solar cell 322 having a front side and a back side. In embodiments, one or more laser assisted metallization conductive contact structures (e.g., LAMP structures) electrically connects a first metal foil 324 to the back side of the first solar cell 322. The solar cell string 320 also includes a second solar cell 332 having a front side and a back side. One or more laser assisted metallization conductive contact structures electrically connects a second metal foil 334 to the back side of the second solar cell 332. The solar cell string 320 also includes a conductive interconnect 340 coupling the first 322 and second 332 solar cells. The conductive interconnect 340 can include a strain relief feature which includes a plurality of folds out of plane from the first 322 and second 332 solar cells. In an embodiment, the strain relief feature can include a first overhang portion 326 extending from the first metal foil 324 and a second overhang portion 336 extending from the second metal foil 334. Referring to FIG. 3D (i), the first overhang portion 326 of the first metal foil 324 can be bonded (e.g., welded) to the second overhang portion 336 of the second metal foil 334 at a bond location 342 (e.g., bonded at a single bond location). Referring to FIG. 3D (ii), the first overhang portion 326 of the first metal foil 324 can be bonded (e.g., welded) to the second overhang portion 336 of the second metal foil 334 at a plurality of bond locations 342 (bonded at multiple bond locations). Although, one and two bond locations are shown, there can be multiple (e.g., more than two) bond locations used. In an example, there can be two or more bond locations which bond the first overhang portion 326 to the second overhang portion 336, as shown in FIG. 3E below.

Figure 3E:
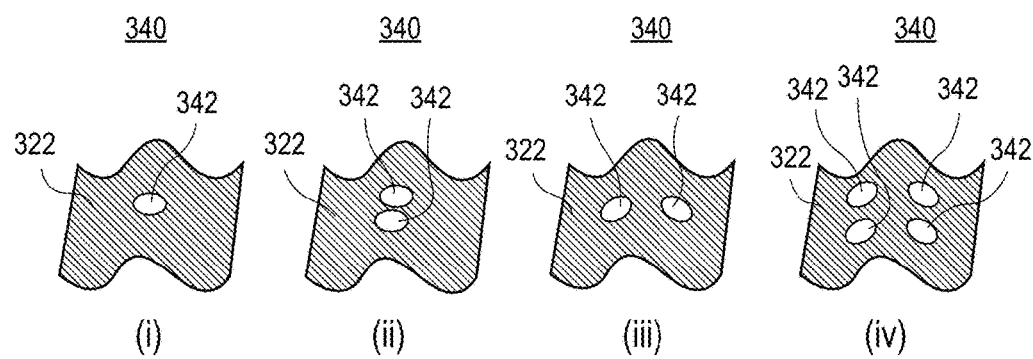
FIG. 3E illustrates a cross-sectional view of overhang portions with a strain relief feature, in accordance with an embodiment of the present disclosure.

FIG. 3E illustrates a plurality of conductive interconnects with a strain relief features and multiple bond locations are shown, in accordance with an embodiment of the present disclosure.

Referring to FIG. 3E, the conductive interconnects 340 can include one or more bond locations 342. In an embodiment, and as described above, the conductive interconnects 340 can include a first metal foil of a first solar cell bonded to a second metal foil of a second solar cell at bond locations 342. Referring to FIGS. 3E (i)-(iv), multiple configurations and arrangements can be used for the bond locations 342. In an example, FIG. 3E (i) shows a single bond location 342. FIG. 3E (ii) and (iii) show two bond locations and FIG. 3E (iv) show four bond locations. In an example, as shown in FIG. 3E (ii) the bond locations 342 can be adjacent to one another along a direction perpendicular to the conductive interconnects 340. In an example, as shown in FIG. 3E (iii) the bond locations 342 can be adjacent to one another along a direction parallel to the conductive interconnects 340. Referring to FIG. 3 (iv), four bond locations are shown. In embodiments, two, three, four or more bond locations can be used.

Figure 3F:
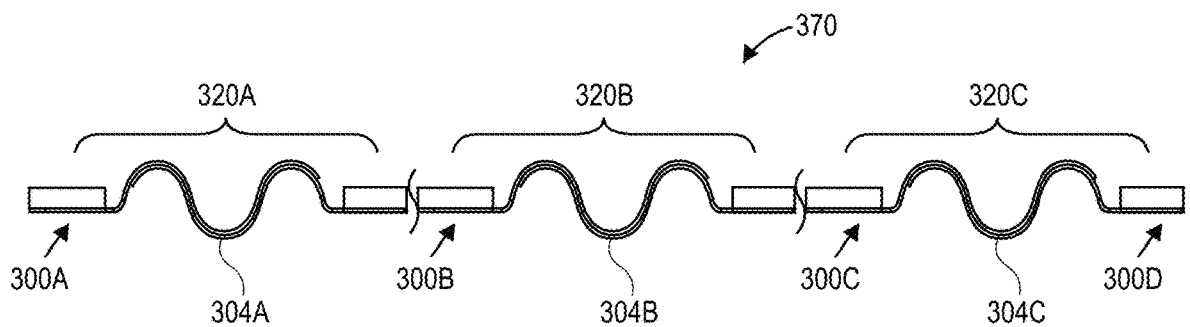
FIG. 3F illustrates a cross-sectional view of a string of pairs of solar cells coupled by overhang portions with a strain relief feature, in accordance with an embodiment of the present disclosure.

FIG. 3F illustrates a cross-sectional view of a string of pairs of solar cells coupled by foil overhang portions with a strain relief feature, in accordance with an embodiment of the present disclosure.

Referring to FIG. 3F, a solar cell string 370 includes pairs 320A, 320B, 320C of solar cells coupled by foil overhang portions 304A. 304B, 304C with a strain relief feature, respectively. In an example, the pairs of solar cells 320A, 320B, 320C can include solar cells 300A, 300B, 300C, 300D. In embodiments, for the pair 320A, an overhang portion 304A can connect the solar cells 300A and 300B. In embodiments, for the pair 320B, an overhang portion 304B can connect the solar cells 300B and 300C. In embodiments, for the pair 320C an overhang portion 304C can connect the solar cells 300C and 300D. In embodiments, the pairs 320A, 320B, 320C of solar cells can be coupled to one another in series, as shown. In embodiments, the pairs of solar cells 320A, 320B 320 can also be connected in parallel. Although three pairs of solar cells 320 are shown, multiple pairs of solar cells can be used. For example, the solar cell string 370 can include 1, 2, 3 or more pairs of solar cells. Additionally, multiple configurations can be used. In an example, some pairs of solar cells can be connected in series while other pairs of solar cells can be connected in parallel.

FIGS. 4A-4E illustrate cross-sectional views of various arrangements of two solar cells coupled by an interconnect with a strain relief feature, in accordance with embodiments of the present disclosure.

Figure 4A:
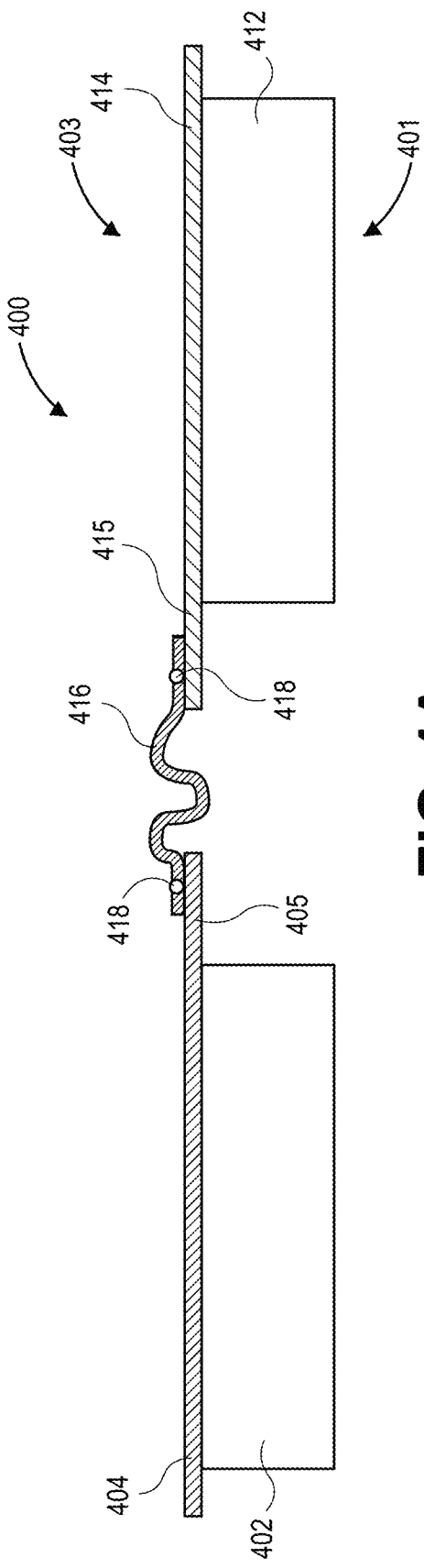

Referring to FIG. 4A, a solar cell string 400 includes a first solar cell 402 having a front side 401 and a back side 403. One or more laser assisted metallization conductive contact structures (e.g., LAMP structures) electrically connects a first metal foil 404 to the back side 403 of the first solar cell 402. The solar cell string 400 also includes a second solar cell 412 having a front side 401 and a back side 403. One or more laser assisted metallization conductive contact structures electrically connects a second metal foil 414 to the back side 403 of the second solar cell 412. The solar cell string 400 also includes a conductive interconnect coupling the first 402 and second 412 solar cells. The conductive interconnect has a strain relief feature including a conductive piece 416 bonded to a portion 405 of the first metal foil 404 and to a portion 415 of the second metal foil 414, e.g., at bonds or welds 418. The portion 405 of the first metal foil 404 is an overhang portion of the first metal foil 404, and the portion 415 of the second metal foil 414 is an overhang portion of the second metal foil 414. The conductive piece 416 can have one or more folds out of plane of the first 402 and second 412 solar cells.

Figure 4B:
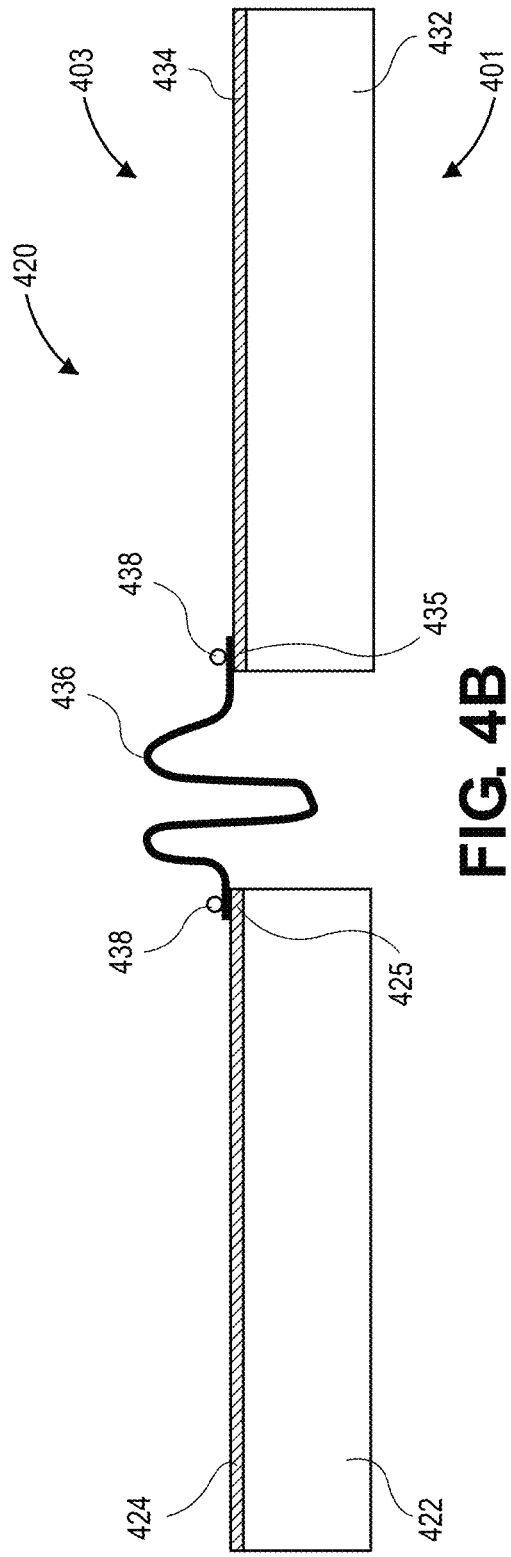

Referring to FIG. 4B, a solar cell string 420 includes a first solar cell 422 having a front side 401 and a back side 403. One or more laser assisted metallization conductive contact structures (e.g., LAMP structure) electrically connects a first metal foil 424 to the back side 403 of the first solar cell 422. The solar cell string 420 also includes a second solar cell 432 having a front side 401 and a back side 403. One or more laser assisted metallization conductive contact structures (e.g., LAMP structure) electrically connects a second metal foil 434 to the back side 403 of the second solar cell 432. The solar cell string 420 also includes a conductive interconnect coupling the first 422 and second 432 solar cells. The conductive interconnect has a strain relief feature including a conductive piece 436 bonded to a portion 425 of the first metal foil 424 and to a portion 435 of the second metal foil 434. e.g., at bonds or welds 438. The portion 425 of the first metal foil 424 is on the first solar cell 422, and the portion 435 of the second metal foil 434 is on the second solar cell 432. In an example, the portion 425 does not extend past an edge of the first solar cell 422 and the portion 435 does not extend past an edge of the second solar cell 432. In embodiments, the conductive piece 436 can have one or more folds out of plane of the first 422 and second 432 solar cells.

Referring to FIG. 4C, a solar cell string 440 includes a first solar cell 442 having a front side 401 and a back side 403. One or more laser assisted metallization conductive contact structures (e.g., LAMP structure) electrically connects a first metal foil 444 to the back side 403 of the first solar cell 442. The solar cell string 440 also includes a second solar cell 452 having a front side 401 and a back side 403. One or more laser assisted metallization conductive contact structures electrically connects a second metal foil 454 to the back side 403 of the second solar cell 452. A first insulator structure 443 is over the first solar cell 442 and is at least partially wrapped by an overhang portion 445 of the first metal foil 444. A second insulator structure 453 is over the second solar cell 452 and is at least partially wrapped by an overhang portion 455 of the second metal foil 454. The solar cell string 440 also includes a conductive interconnect coupling the first 442 and second 452 solar cells. The conductive interconnect has a strain relief feature including a conductive piece 456 bonded to the overhang portion 445 of the first metal foil 444 and to the overhang portion 455 of the second metal foil 454, e.g., at welds 458. In embodiments, the conductive piece 456 can include a metal foil and/or an aluminum foil. Such welding of a separate piece of foil to overhang portions or wings (445 and 455) of the metal foils 444 and 454 after they have been wrapped over an insulating material 443 or 453 can allow for movement of the overhang portions and the cells 442 and 452.

Referring to FIG. 4D, a solar cell string 460 includes a first solar cell 462 having a front side 401 and a back side 403. One or more laser assisted metallization conductive contact structures (e.g., LAMP structure) electrically connects a first metal foil 464 to the back side 403 of the first solar cell 462. The solar cell string 460 also includes a second solar cell 472 having a front side 401 and a back side 403. One or more laser assisted metallization conductive contact structures electrically connects a second metal foil 474 to the back side 403 of the second solar cell 472. The solar cell string 460 also includes a conductive interconnect coupling the first 462 and second 472 solar cells. The conductive interconnect has a strain relief feature including a structure 480 between the first solar cell 442 and the second solar cell 452. The structure 480 includes a conductive layer 482 on an insulator layer 484. A wing portion 465 of the first metal foil 464 is bonded to the conductive layer 482, e.g., at weld 476. A wing portion 475 of the second metal foil 474 is also bonded to the conductive layer 482 e.g., at weld 478. In embodiments, the wing portion 465, 475 can also be referred to as overhang portion 465, 475. In one embodiment, the conductive layer 482 of structure 480 is a copper or aluminum ribbon. In embodiments, the insulator layer 484 can be used to cover, cloak and/or obstruct the conductive layer 482 from view. In embodiments, the insulating layer 482 can have a same or similar color as an underlying layer (e.g., a backsheet and/or an encapsulant layer). In embodiments, the insulator layer 484 can instead include an anodized portion of the conductive layer 482. In embodiments, the conductive layer 482 can include a metal foil and/or an aluminum foil.

Although the insulator layer 484 as shown can be coupled to the conductive layer 482, in some embodiments, the insulating layer 484 can be coupled to the wing portions 465, 475. In an example, the conductive layer 482 can be excluded and the insulating layer 484 can be coupled directly to one or more of the wing portions 465, 475. In embodiments, the conductive layer 482 can cover, cloak and/or obstruct from view one or more of the wing portions 465, 475. In embodiments, the insulating layer 484 can include different light transmitting and reflective properties. In an example, the insulating layer 484 can include materials with specific optical reflective and/or transmissive properties. In embodiments, the insulating layers 484 can include multiple layers or other regions. In embodiments, the insulating layer 484 can include one or more layers of different transparency/reflectivity and these layers or other regions can have discrete borders or, in some embodiments, do not. These regions, which can be layers 484, can also have different widths as well as different sizes and shapes. As used herein, in an embodiment, the insulating layer 484 can be referred to as masking layers, masking regions and/or layers.

Figure 4E:
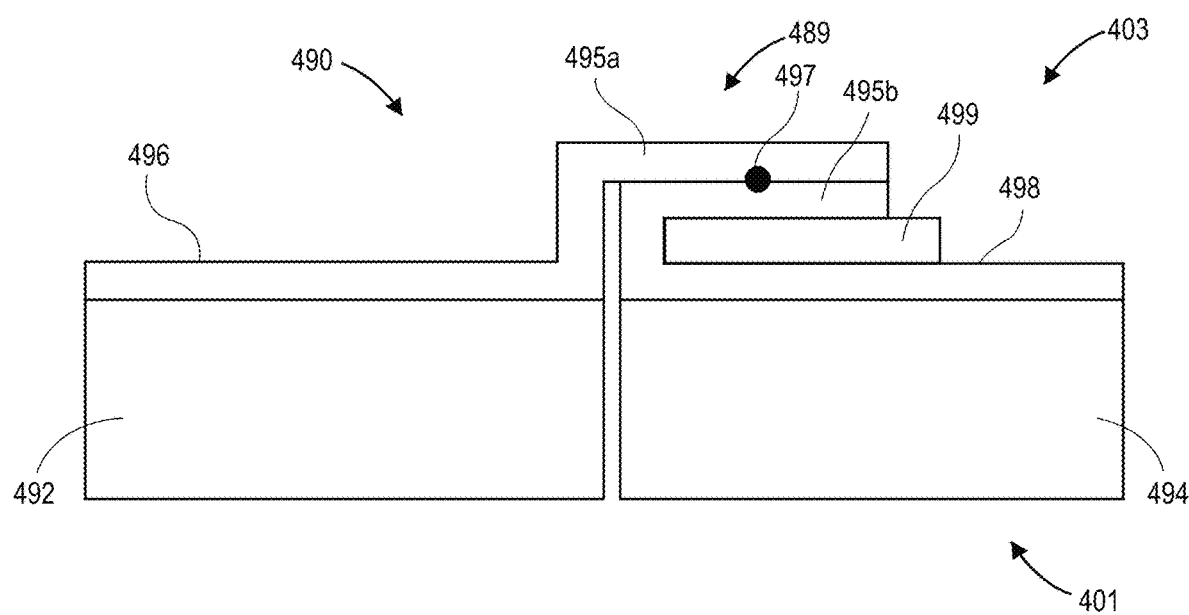

Referring to FIG. 4E, a solar cell string 490 includes a first solar cell 492 having a front side 401 and a back side 403. One or more laser assisted metallization conductive contact structures (e.g., LAMP structures) electrically connects a first metal foil 496 to the back side 403 of the first solar cell 492. The solar cell string 490 also includes a second solar cell 494 having a front side 401 and a back side 403. One or more laser assisted metallization conductive contact structures (e.g., LAMP structures) electrically connects a second metal foil 498 to the back side 403 of the second solar cell 494. In embodiments, the solar cell string 490 also includes a conductive interconnect 489 having a strain relief feature coupling the first 492 and second 494 solar cells together. In embodiments, the conductive interconnect 489 includes an overhang portion 495a of the first metal foil 496 which is bonded to an overhang portion 495b of the second metal foil 498 at a bond 497, as shown. In embodiments, the bond 497 can include a weld. In an example, the bond 497 can formed using laser welding. In embodiments, although one bond is shown, more bonds or a plurality of bonds (e.g., one, two or more bonds) can be used. In embodiments, the overhang portion 495a extends over the first metal foil 496 and second metal foil 498. In embodiments, the overhang portion 495b extends from the second metal foil 498 and at least partially wraps around a first insulator 499. In embodiments, the first insulator structure 499 is also partially wrapped by the overhang portion 495a. In embodiments, the first insulator 499 can include a dielectric material, encapsulant material and/or any other type of insulating material. In embodiments, the overhang portions 495a, 495b can also be referred to as wing portions 495a, 495b. In an example, the strain relief feature of the conductive interconnect 489 can include the overlap of bonded overhang portions 495a, 495b over the first insulator 499. In an example, welding of the overhang portion 495a over the overhang portion 495b and wrapping the overhang portions 495a, 495b over the first insulator 499 can reduce the strain and minimize the distance between the solar cells 492 and 494.

Figure 5A:
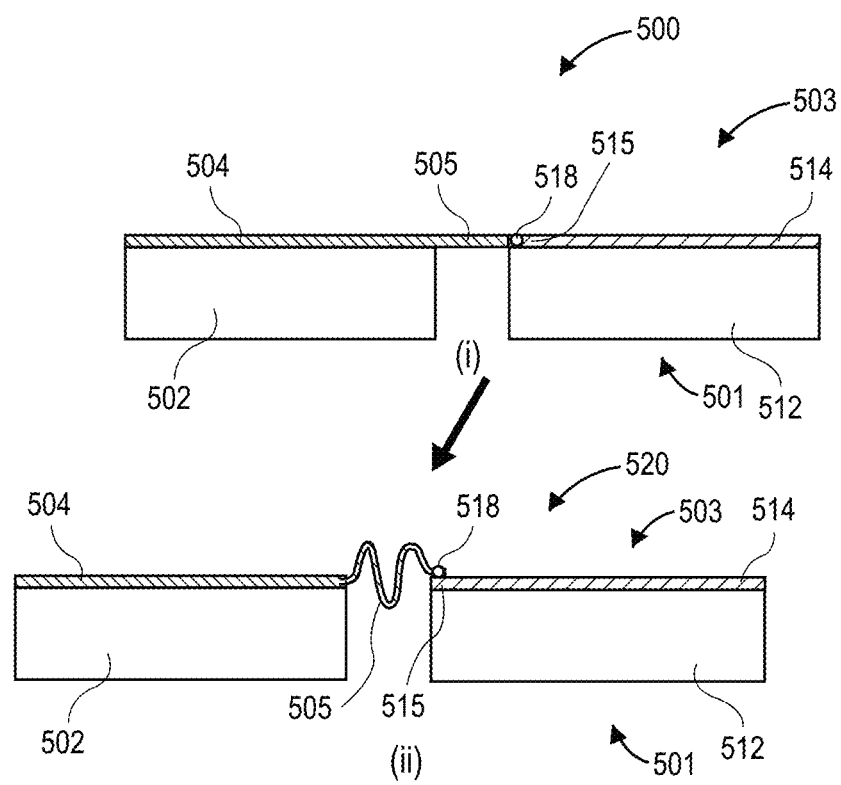
FIG. 5A illustrates cross-sectional views representing the coupling of two solar cells by an interconnect having a strain relief feature formed therein, in accordance with embodiments of the present disclosure.

FIG. 5A illustrates cross-sectional views representing the coupling of two solar cells by an interconnect having a strain relief feature formed therein, in accordance with embodiments of the present disclosure.

Referring to part (i) of FIG. 5A, a solar cell string 500 includes a first solar cell 502 having a front side 501 and a back side 503. One or more laser assisted metallization conductive contact structures (e.g., LAMP structures) electrically connects a first metal foil 504 to the back side 503 of the first solar cell 502. The solar cell string 500 also includes a second solar cell 512 having a front side 501 and a back side 503. One or more laser assisted metallization conductive contact structures (e.g., LAMP structures) electrically connects a second metal foil 514 to the back side 503 of the second solar cell 512. The solar cell string 500 also includes a conductive interconnect coupling the first 502 and second 512 solar cells. The conductive interconnect includes an overhang portion 505 of the first metal foil 504 bonded to a portion 515 of the second metal foil 514 over the second 512 solar cell. In embodiments, the portion 515 can include a weld or a laser weld. In embodiments, the portion 515 can be disposed over an edge of the second solar cell 512. In an embodiment, the overhang portion 505 can extend over an edge of the first solar cell 502 and an edge of the second solar cell 512 at the portion 515.

Referring to part (ii) of FIG. 5A, a strain relief feature 520 can be formed at the overhang portion 505 of the first metal foil 504. The strain relief feature 520 includes a plurality of folds out of plane of the first 502 and second 512 solar cells in the overhang portion 505 of the first metal foil 504. In embodiments, the strain relief feature of the overhang portion 505 can inhibit mechanical stress and/or mechanical strain between the first solar cell 502 and the second solar cell 512.

Figure 5B:
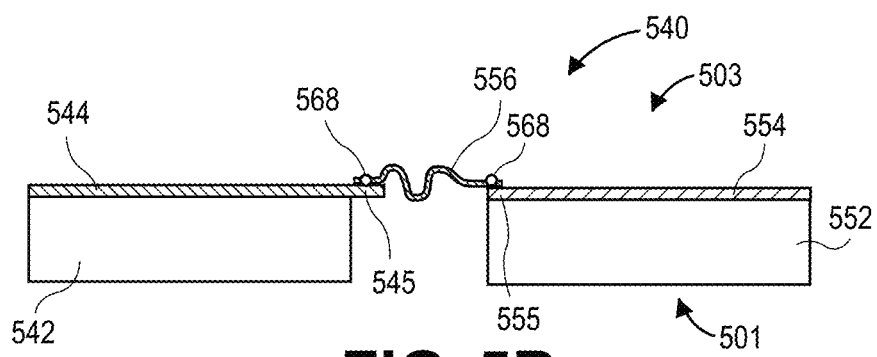
FIG. 5B illustrates a cross-sectional view of two solar cells coupled by an overhang portion with a strain relief feature, in accordance with an embodiment of the present disclosure.

FIG. 5B illustrates a cross-sectional view of two solar cells coupled by a foil overhang portion with a strain relief feature, in accordance with an embodiment of the present disclosure.

Referring to FIG. 5B, a solar cell string 540 includes a first solar cell 542 having a front side 501 and a back side 503. One or more laser assisted metallization conductive contact structures (e.g., LAMP structures) electrically connects a first metal foil 544 to the back side 503 of the first solar cell 542. The solar cell string 540 also includes a second solar cell 552 having a front side 501 and a back side 503. One or more laser assisted metallization conductive contact structures (e.g., LAMP structures) electrically connects a second metal foil 554 to the back side 503 of the second solar cell 552. In embodiments, the solar cell string 540 also includes a conductive interconnect coupling the first 542 and second 552 solar cells. The conductive interconnect has a strain relief feature including a conductive piece 556 bonded to a portion 545 of the first metal foil 544 and to a portion 555 of the second metal foil 554, e.g., at welds 568. In embodiments, the portion 545 of the first metal foil 544 is an overhang portion of the first metal foil 544. In an example, the overhang portion 545 can instead extend from and be continuous with the first metal foil 544. The portion 555 of the second metal foil 554 is on the second solar cell 552. The conductive piece 556 can have one or more folds out of plane of the first 542 and second 552 solar cells. Although, as shown, the conductive piece 556 is separate from the second metal foil 554, in embodiments, the second metal foil 554 can include the conductive piece 556. In an example, the conductive piece 556 can instead extend from and be continuous with the second metal foil 554.

Figure 5C:
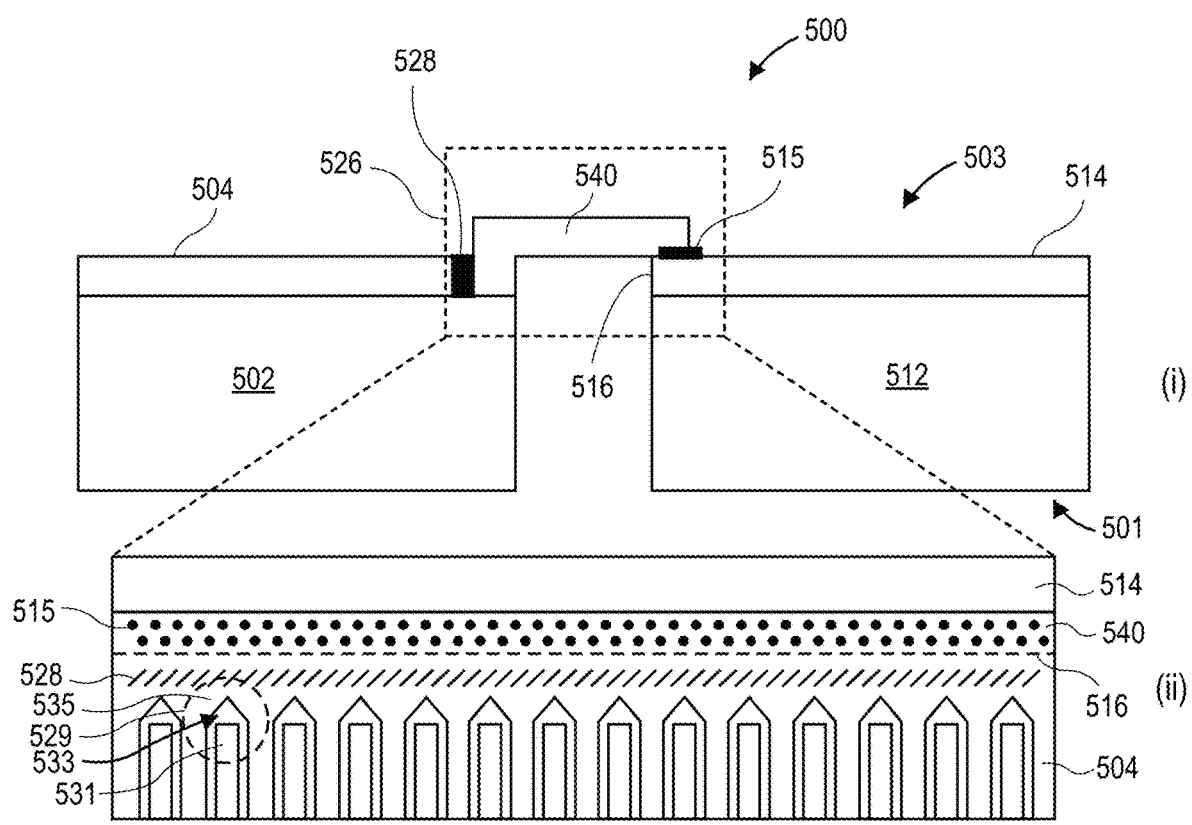
FIG. 5C illustrates a cross-sectional view (i) and a plan view (ii) of two solar cells coupled by a foil overhang portion with a strain relief feature, in accordance with an embodiment of the present disclosure.

FIG. 5C illustrates a cross-sectional view (i) and a plan view (ii) representing the coupling of two solar cells by an interconnect having a strain relief feature formed therein, in accordance with embodiments of the present disclosure.

Referring (i) and (ii) of FIG. 5C, a solar cell string 500 includes a first solar cell 502 having a front side 501 and a back side 503. One or more laser assisted metallization conductive contact structures (e.g., LAMP structures) electrically connects a first metal foil 504 to the back side 504 of the first solar cell 502. The solar cell string 500 also includes a second solar cell 512 having a front side 501 and a back side 503. One or more laser assisted metallization conductive contact structures (e.g., LAMP structures) electrically connects a second metal foil 514 to the back side 503 of the second solar cell 512. The solar cell string 500 also includes an overhang portion 540 of the first metal foil 504 which couples the first 502 and second 512 solar cells together.

Referring to (ii) of FIG. 5C, a plan view portion 526 of (i) of FIG. 5C is shown. Referring to (ii) of FIG. 5C, in embodiments, bond portions 515 can bond the overhang portion 540 to the second metal foil 514. In embodiments, the bond portions 515 can include a weld or a laser weld. In embodiments, the bond portions or welds 515 can include a circular, oblong, square, rectangular, polygonal or any other shape. In some embodiments, the bond portions 515 can include line welds. In embodiments, as shown, the bond portions 515 can be arranged in alternating manner. In an example, some bond portions 515 can be located farther or closer to an edge 516 of the second solar cell 512 (e.g., also shown in (i) of FIG. 5C). In embodiments, as shown, the bond portions 515 can include a plurality of bond portions or welds. In an example, there can be one, two, three, four (e.g., as shown) or more bond portions 515. In embodiments, the first metal foil 504 can include second bond portions 528 which can bond the metal foil 504 to the first solar cell 502. In embodiments, the second bond portions 528 can include line welds as shown. In some embodiments, the second bond portions 528 can include a circular, oblong, square, rectangular, polygonal or any other shape. Also shown are finger base structures 529. In an embodiment, the finger base structure 529 can include a metal finger 531 and a spacing 533 between the metal finger 531 and a busbar portion 535. In embodiments, the finger base structure 529 can add structural support and rigidity to the underlying metal foil 504 and the bonding between the metal foil 504 and the solar cell 502. In embodiments, as shown, the finger base structure 529 can include a triangular shape as shown. In embodiments, the finger base structure 529 can include a circular, oblong, square, rectangular, trapezoidal, polygonal or any other shape.

In another aspect, thermocompression bonding can be implemented for bonding interconnects between LAMP cells. For some LAMP bussing designs, it can be advantageous to use thermocompression bonding, specifically for designs having long busses at each end and a wrap-around p-finger, or designs with overhanging foil. Thermocompression bonding of interconnects in LAMP involves the application of heat and pressure to, e.g., aluminum pieces to create low resistance bonds. The aluminum can be in the form of one or more wires, but, in one example, is more likely to be a ribbon or overhang portion of a LAMP adhered foil. The ribbon can be embossed or have other stress-relief features. The heat and pressure can be applied by a hot plate and bond heat, or by a heated roller. The bond can be formed down the length of the interconnect, rather than in the direction of fingers on the cell. In one embodiment, if the LAMP cells have an overhang style, then the bond can be a 1-2 mm strip between the cells, pressing the two overhang tabs and bonding them together. An example is provided in FIG. 6. Alternatively, if the cell design has long thin bus areas, then the ribbon can be relatively wider with two strips on each end. In the latter arrangement, cloaking tape can be used to isolate a wrap-around p-finger on one side of the cell. The use of micro-pads can be another option.

Figure 6:
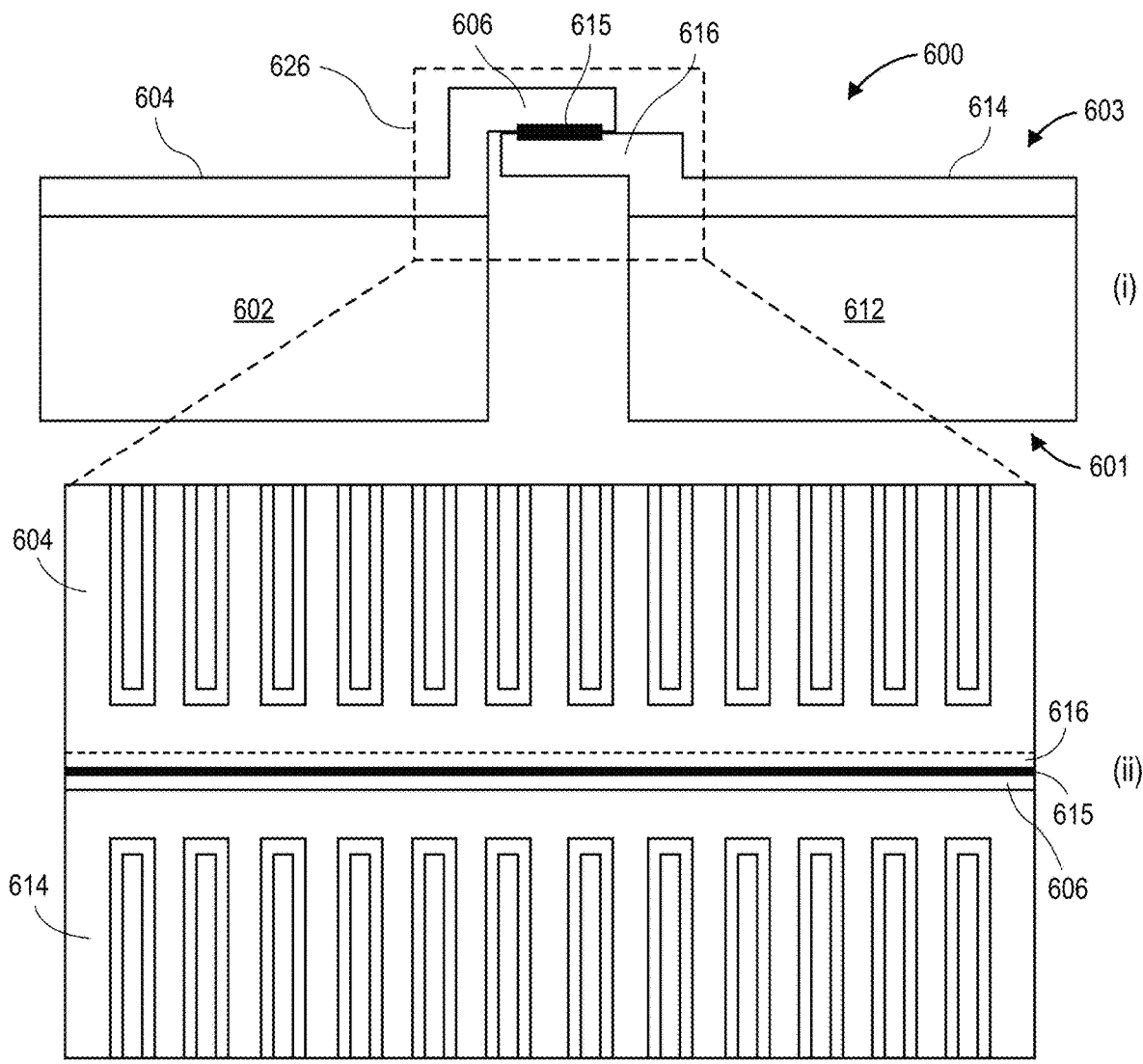
FIG. 6 illustrates is a cross-sectional view (i) and a plan view (ii) of two solar cells coupled by foil overhang portions bonded by a thermocompression bond, in accordance with an embodiment of the present disclosure.

FIG. 6 illustrates a cross-sectional view (i) and a plan view (ii) of two solar cells coupled by foil overhang portions bonded by a thermocompression bond, in accordance with an embodiment of the present disclosure.

Referring to (i) and (ii) of FIG. 6, a solar cell string 600 includes a first solar cell 602 having a front side 601 and back side 603. One or more laser assisted metallization conductive contact structures (e.g., LAMP structures) electrically connect a first metal foil 604 to the back side 603 of the first solar cell 602. In embodiments, the first metal foil 604 can have an overhang portion 606. In embodiments, the solar cell string 600 also includes a second solar cell 612. One or more laser assisted metallization conductive contact structures (e.g., LAMP structures) electrically connect a second metal foil 614 to the back side 603 of the second solar cell 612. In embodiments, the second metal foil 614 can have one or more overhang portions 616. In embodiments, an overhang portion 616 of the second metal foil 614 can be coupled to an overhang portion 606 of the first metal foil 604 by a thermocompression bond 615. In embodiments, the thermocompression bond 615 can be an aluminum-aluminum bond. Although the bond 615 is described as a thermocompression bond, in embodiments, other compression and/or contact-type bonding techniques can be used. In embodiments, the bond 615 can be formed by an ultrasonic welding process. In an example, the bond 615 can include an ultrasonic bond.

Figure 7:
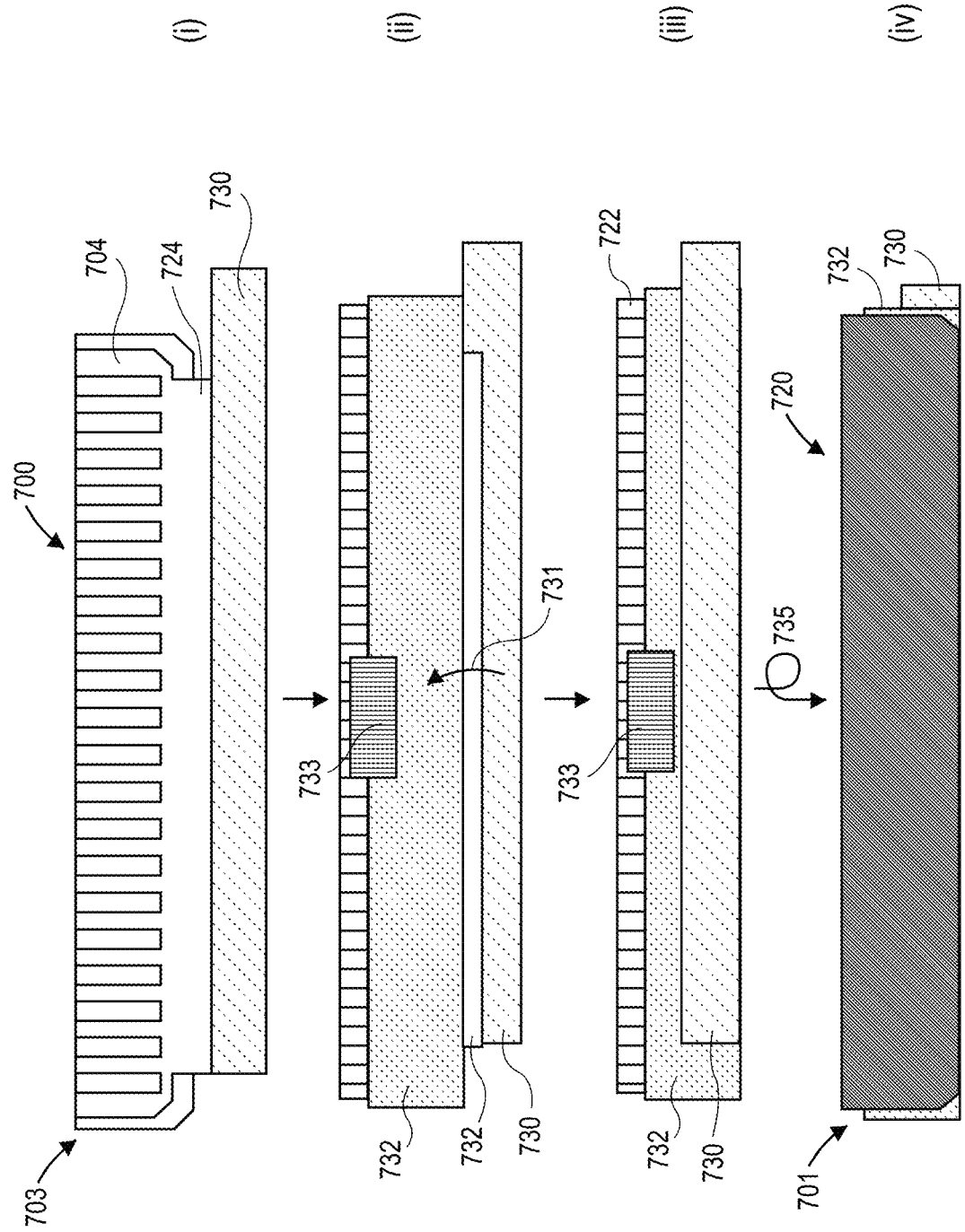
FIG. 7 illustrates a plan view representing various operations in a method of forming a fold-over onboard circuit, in accordance with an embodiment of the present disclosure.

FIG. 7 includes illustrations representing various operations in a method of forming a fold-over onboard circuit, in accordance with an embodiment of the present disclosure.

Referring to (i) of FIG. 7, a first solar cell 700 having a first metal foil 704 at a back side 703 of the first solar cell 700, is shown. In embodiments, the first metal foil 704 can include one or more laser assisted metallization conductive contact structures (e.g., a LAMP adhered foil 704). In embodiments, a ribbon 730 can be bonded to an overhang portion 724 of a first metal foil 704. In embodiments, the overhang portion 724 can extend from the LAMP adhered foil 704. The solar cell 700 can be the first or last solar cell in a solar cell string. Although the ribbon 730 is shown to extend at one end, e.g., to the right as drawn in (i) of FIG. 7, in some embodiments the ribbon has no extension. Referring to (ii) of FIG. 7, in embodiments, an insulating strip 732 can be the adhered to the solar cell 700. In embodiments, as shown in (ii) of FIG. 7, a tape or adhesive 733 can be used to adhere the insulating strip 732 to the solar cell 700. Referring to image (iii) and (ii) of FIG. 7, the ribbon 730 can be folded over 731 and onto the insulating strip 732. In embodiments, after the fold over or layup 731, short jumpers can be bonded to the ribbon 730 and bonded to other solar cells to create string interconnects. In an example, the jumpers and can be welded to the ribbon 730 and be welded to the solar cell to create string interconnects. In embodiments, a separate piece of foil can be bonded to the overhang portions 724 already on the solar cell, e.g., with a LAMP process while the foil is still flat. The latter approach can provide for thicker or combined interconnect portions. In embodiments, the insulating strip 732 can also be referred to as a cloaking structure. In embodiments, although a tape 733 is used to adhere the insulating strip 732 to the solar cell 700, in other embodiments, a tape 733 is not used and the insulating strip 732 itself can adhere or bond directly to the solar cell 700. In an example, the insulating strip 732 can include a tape and thus the tape 733, in some examples, is not used. At operation (iv), the structure of operation (iii) can be flipped over 733 to reveal a front side 701 of the solar cell 700 with the ribbon portion 730 folded beneath the front side 701 of the solar cell 700. The above fold-over onboard circuit formation can be implemented to maximize module area use efficiency (e.g., conduction efficiency) where bussing circuits are "on-board". Instead of leaving an area of a "pad" to attach bussing to, a maximum area on the cell remains for "fingers" to produce current, and to let the foil extend past the edge of the cell, leading to a "fold" over behind the cell. Such folder-over techniques can also be used when packaging and transporting a solar cell including folding-over an overhang portion and/or a bonded ribbon for compact packaging during transport, where the overhang portion and/or the ribbon can be unfolded upon receipt after transport.

Figure 8A:
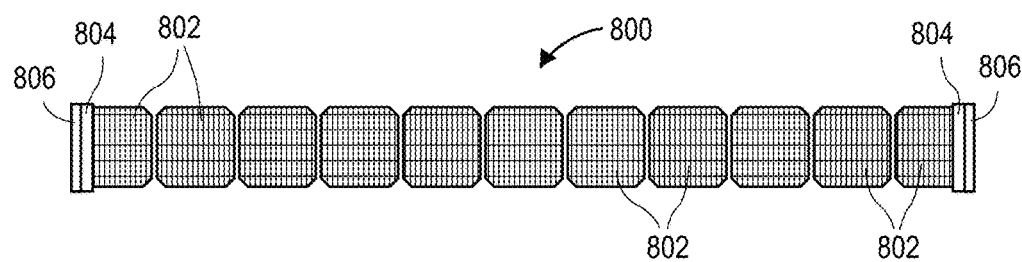
FIG. 8A illustrates a plan view of an individually bussed string, in accordance with an embodiment of the present disclosure.

FIG. 8A illustrates a plan view of an individually bussed string 800, in accordance with an embodiment of the present disclosure. The string 800 includes a plurality of solar cells 802. Each solar cell 802 has one or more laser assisted metallization conductive contact structures (e.g., LAMP structures) that electrically connect a metal foil to a back side of the solar cells 802. As described in greater detail in association with FIG. 10, end ones of the solar cells 802 includes an insulation layer or tape 804 having a folded metal foil portion 806 thereon (e.g., folded metal foil regions as described in FIG. 7). In embodiments, the solar cells 802 of the bussed string 800 can include the solar cell described in FIG. 2E.

Figure 8B:
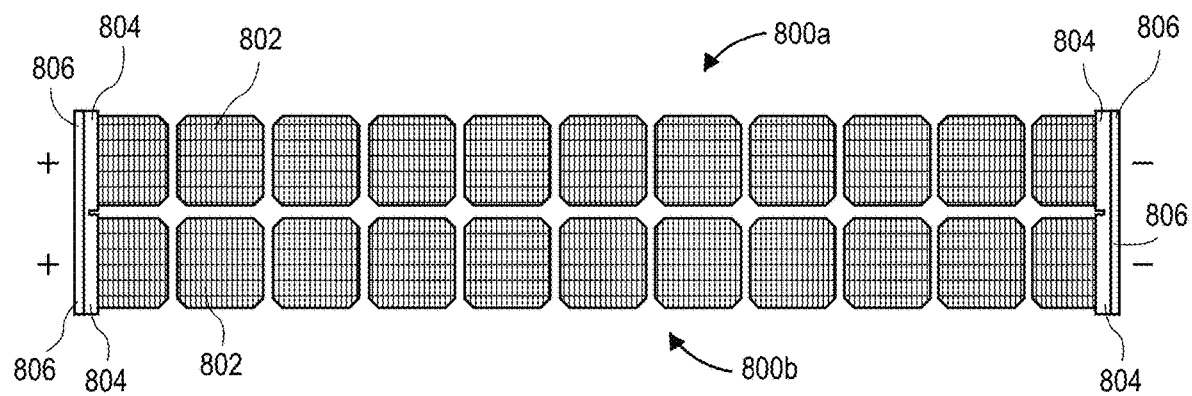
FIG. 8B illustrates a plan view of two parallel strings, in accordance with an embodiment of the present disclosure.

FIG. 8B illustrates a plan view of two parallel strings, in accordance with an embodiment of the present disclosure. In embodiments, like numbers used in FIG. 8B can refer to the same or similar elements described in FIG. 8A. In an example, folded metal foil 806 portions described in FIG. 8A can refer to the same or similar structures described in FIG. 8B.

FIG. 8B illustrates a plan view of two parallel strings 800a, 800b, in accordance with an embodiment of the present disclosure. In embodiments, one or both of the parallel strings 800a, 800b can also refer to the bussed string 800 described in FIG. 8A. Similar to described above, the two parallel strings 800a, 800b can include solar cells 802. In embodiments, each of the solar cells 802 can include a solar cell having individual sub-cells coupled by a metallization structure as described in FIG. 2E above. In embodiments, folded metal foil 806 portions of each of the strings 800a, 800b can be coupled at the ends of each of the strings 800a, 800b to provide a 1× string current with 2× string voltage (e.g., wherein each solar cell provides ½ cell current with 2× cell voltage). In an example, such a configuration can be useful using the solar cells described in FIG. 2E. In embodiments, the configuration in FIG. 2E can result in a solar cell with ½ cell current and 2× cell voltage of a solar cell in comparison to a solar cell of similar architecture and surface area without the individual sub-cell configuration described in FIG. 2E.

FIGS. 8C, 8D, 8E, 8F and 8G illustrate a plan views of a 2×3 parallel/series circuit, in accordance with an embodiment of the present disclosure. In embodiments, the bussed string in FIG. 8A can be used as one of the strings in FIG. 8C-8G. In embodiments, like numbers used in FIG. 8C-8G can refer to the same or similar elements described in FIGS. 8A and 8B. In an example, folded metal foil 806 portions described in FIGS. 8A and 8B can refer to the same or similar structures described in FIG. 8C-8G.

Figure 8C:
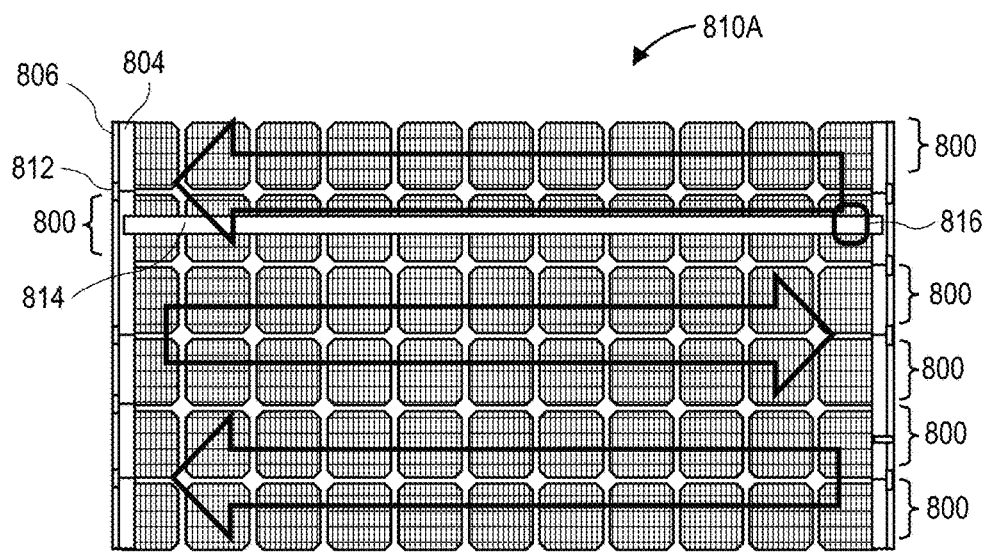
FIGS. 8C, 8D, 8E, 8F and 8G illustrate a plan views of a 2×3 parallel/series circuit, in accordance with an embodiment of the present disclosure.

FIG. 8C illustrates a plan view of a 2×3 parallel/series circuit 810a, in accordance with an embodiment of the present disclosure. Six strings 800 are arranged and appropriately coupled at the ends of the strings 800 by the folded metal foil 806 portions. In embodiments, the folded metal foil 806 can also be referred to as overhang portions. In embodiments, one or more of the strings 800 of FIG. 8C are the same or similar to the bussed string 800 described in FIG. 8A. In embodiments, one or more of the strings 800 of FIG. 8C are the same or similar to the strings 800a, 800b of FIG. 8B. A conductive jumper 812 couples the folded metal foil portion 806 of the metal foil of certain end ones of bussed strings 800. A return ribbon 814 is coupled to the end one of one of the strings 800. In embodiments, the return ribbon 814 is over a back side of each of the solar cells of one of the strings 800. In embodiments, the circuit 810a further includes a junction box or a J-box 816 over a portion of the return ribbon 814. In an embodiment, the J-box 816 can include one or more diodes. In an example, the J-Box 816 can include one or more bypass diodes.

Figure 8D:
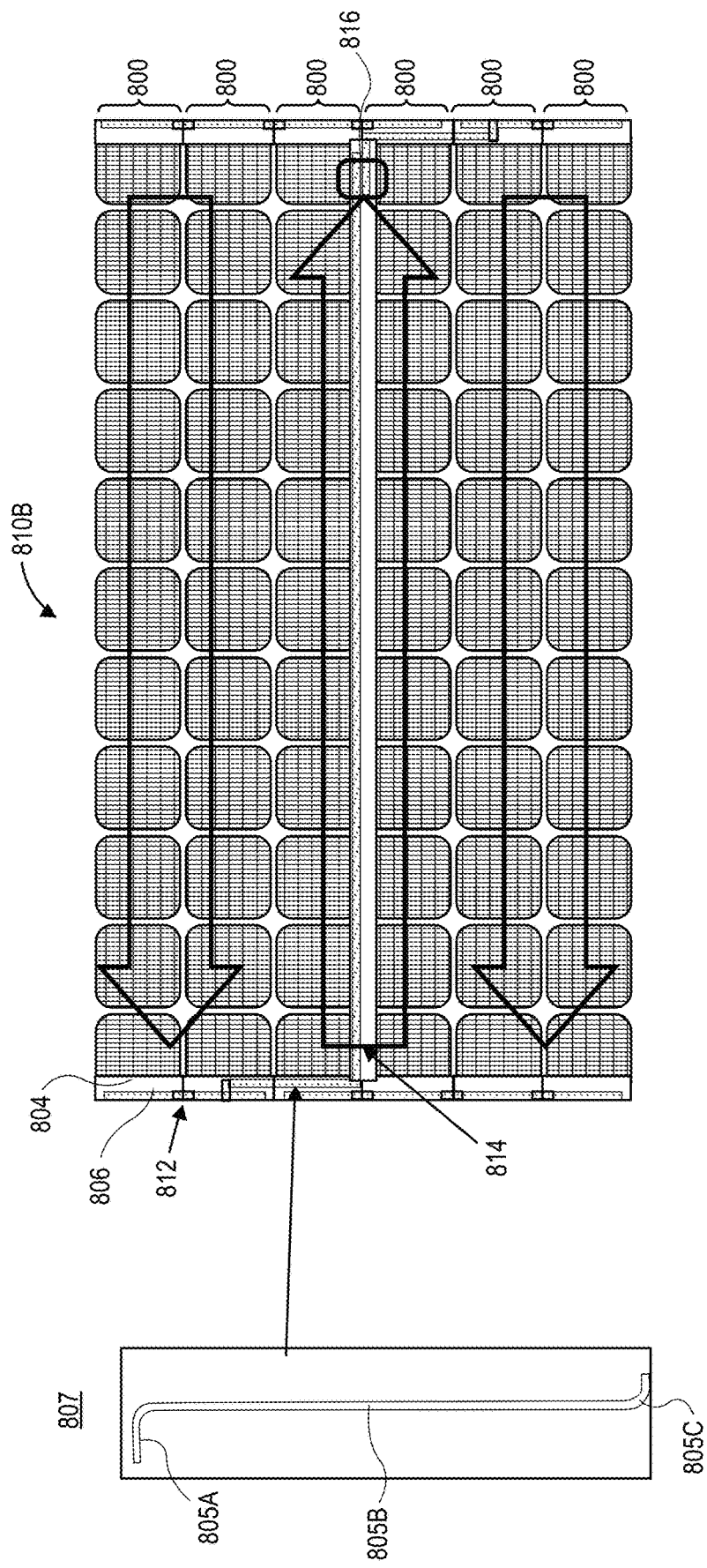

FIG. 8D illustrates a plan view of a 2×3 parallel/series circuit 810b, in accordance with an embodiment of the present disclosure. Six strings 800 are arranged and appropriately coupled at the ends of the strings 800 by folded metal foil 806 portions. In embodiments, the folded metal foil 806 can also be referred to as overhang portions 806. In embodiments, one or more of the strings 800 of FIG. 8D are the same or similar to the bussed string 800 described in FIG. 8A. In embodiments, one or more of the strings 800 of FIG. 8D are the same or similar to the strings 800a, 800b of FIG. 8B. In embodiments, a conductive jumper 812 couples the folded metal foil portion 806 of the metal foil of certain end ones of the strings 800. An extension portion 807 can be used to connect a return ribbon 814 to the folded metal foil portion 806. In embodiments, the return ribbon 814 can be over a back side of each of the solar cells of one of the strings 800. In an embodiment, the extension portion 807 can include a main body portion 805a and bent portions 805b, 805c. In embodiments, the bent portions 805b, 805c, can be at an angle from the main body portion 805a. In an example, the bent portions 805b, 805c, can be perpendicular to the main body portion 805a. In an embodiment, the bent portions 805b, 805c can be at a 1-degree, 5-degree, 10-degree, 15-degree, 20-degree, 25-degree, 30-degree, 35-degree, 40-degree, 45-degree, 50-degree, 55-degree, 60-degree, 65-degree, 70-degree, 75-degree, 80-degree, 85-degree, 90-degree angle or more to the main body portion 805a. In an example, the bent portions 805b, 805c can be at an angle approximately in a range between 1-90 degrees. In embodiments, the circuit 810b further includes a J-box 816 on a portion of the return ribbon 814. In an embodiment, the J-box 816 can include one or more diodes. In an example, the J-Box 816 can include one or more bypass diodes.

Figure 8E:
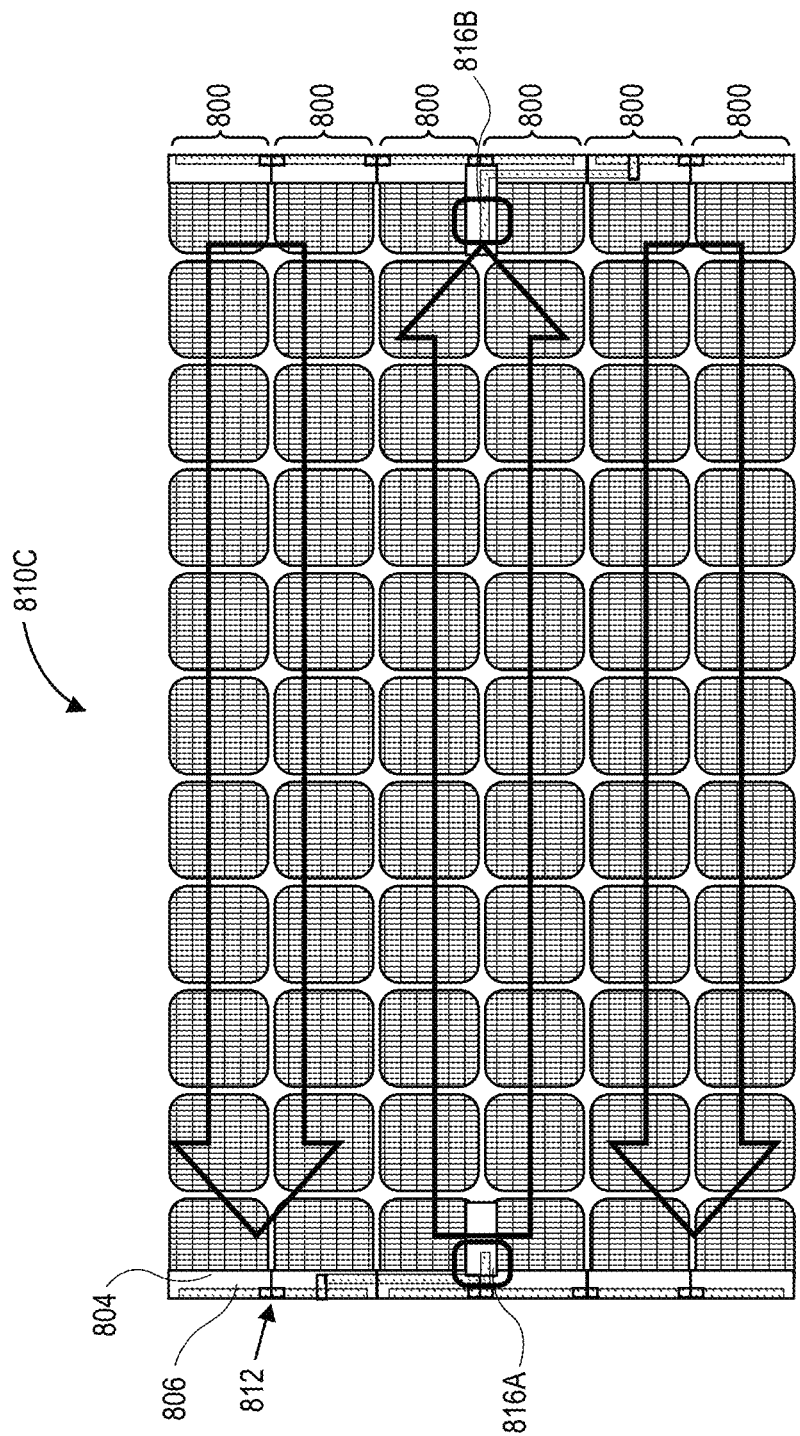

FIG. 8E illustrates a plan view of a 2×3 parallel/series circuit 810c, in accordance with an embodiment of the present disclosure. Six strings 800 are arranged and appropriately coupled at the ends of the strings 800 by folded metal foil 806 portions. In embodiments, the folded metal foil 806 can also be referred to as an overhang portion 806. In embodiments, one or more of the strings 800 of FIG. 8E are the same or similar to the bussed string 800 described in FIG. 8A. In embodiments, one or more of the strings 800 of FIG. 8E are the same or similar to the strings 800a, 800b of FIG. 8B. In embodiments, the circuit 810c includes a first junction box or first J-box 816a and a second junction box or a second J-box 816b on a portion of the return ribbon 814. In an embodiment, at least one or both of the J-boxes 816a, 816b are a monopole junction boxes. In an embodiment, the J-boxes 816a, 816 can include one or more diodes. In an example, the J-Boxes 816a, 816b can include one or more bypass diodes. In an example, in contrast to FIGS. 8C and 8D where at least one junction box is used, two or more junction boxes (J-box) can be used.

Figure 8F:
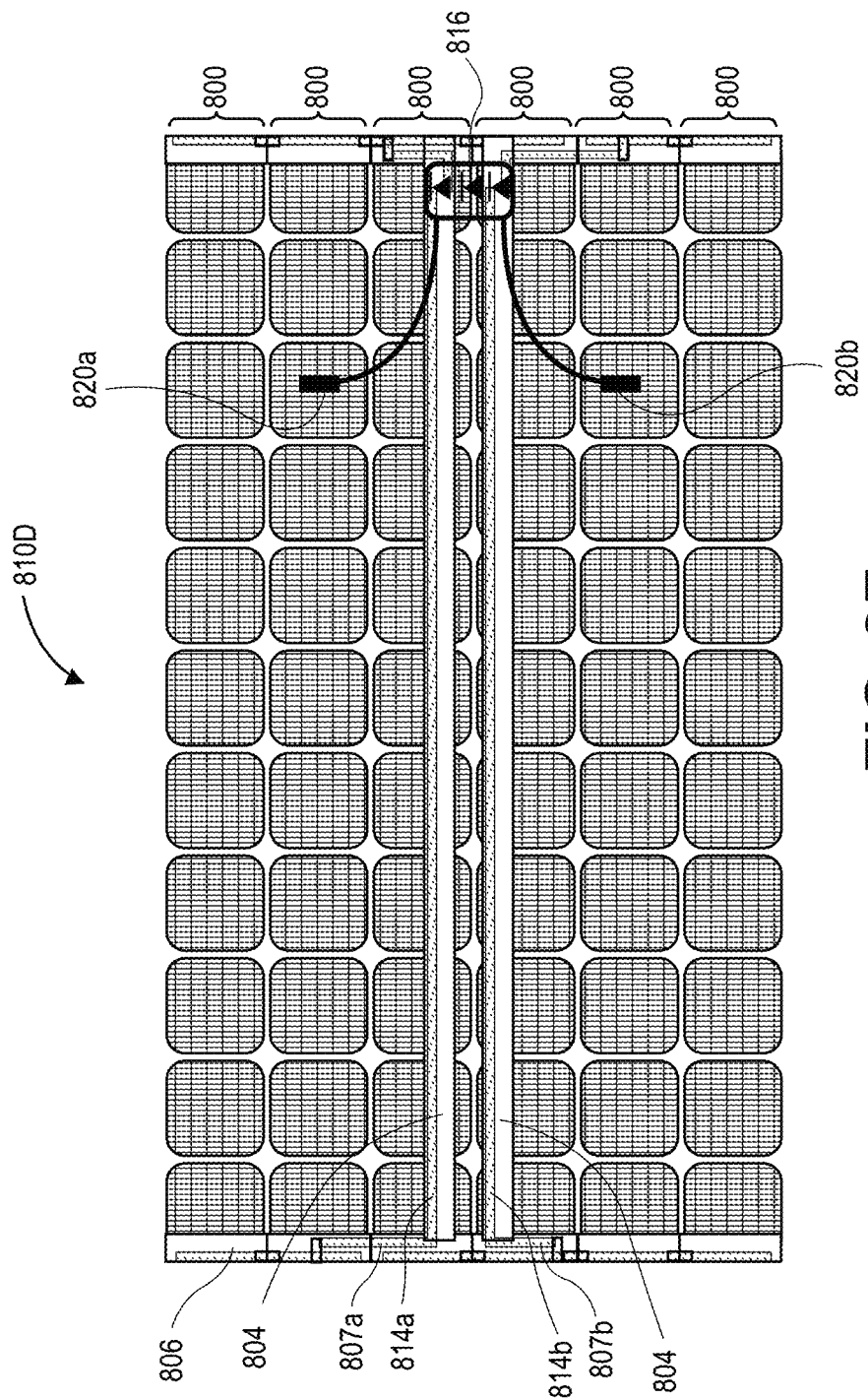
Figure 8G:
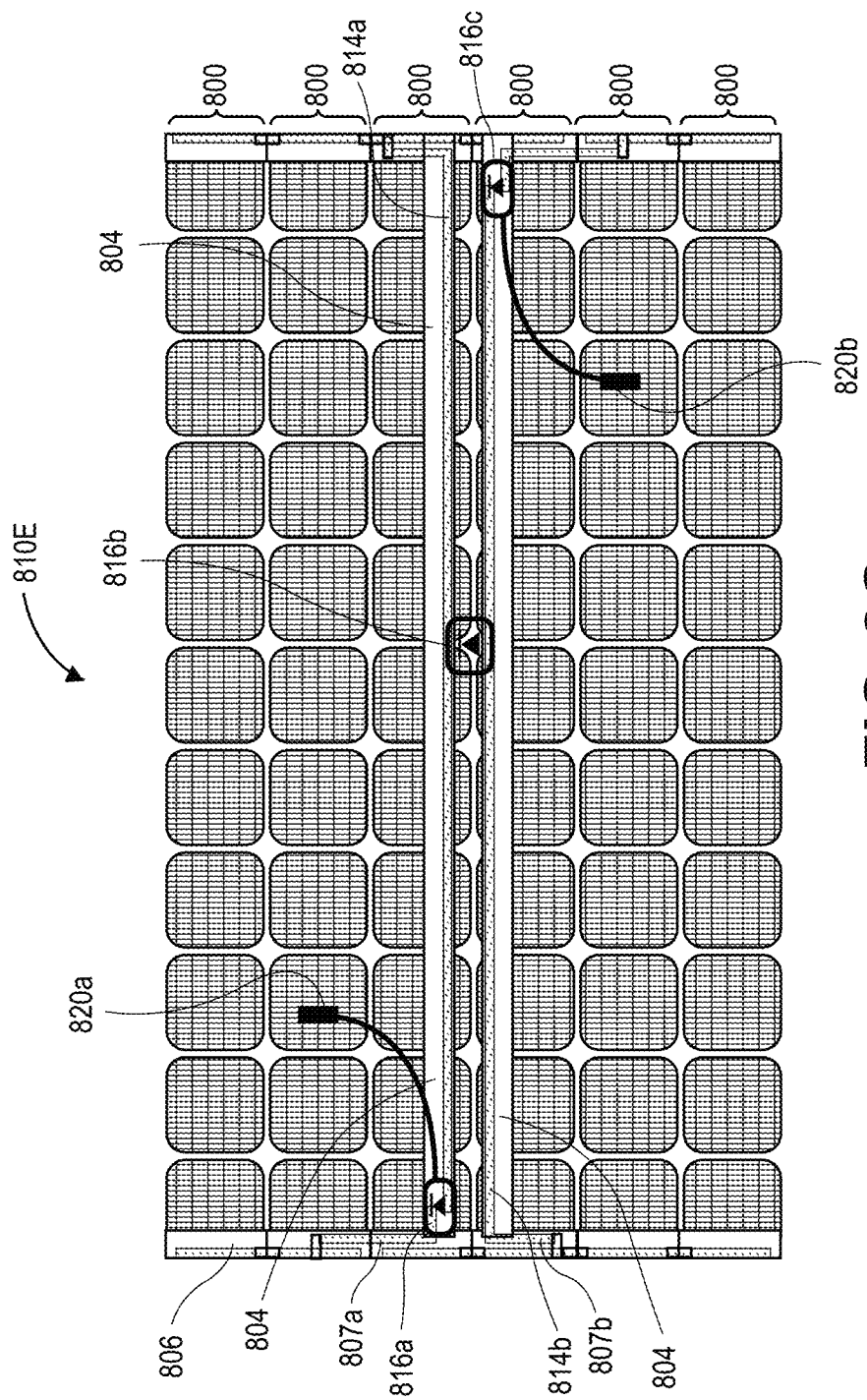

FIGS. 8F and 8G illustrate a plan views of parallel/series circuit configurations including diodes, in accordance with an embodiment of the present disclosure. In an example, FIGS. 8F and 8G show parallel/series circuit configurations that use additional conductors (e.g., a plurality of return ribbons 814a, 814b). In the same example, the additional conductors can be used when electrically connecting one or more diodes (e.g., bypass diodes) within a parallel/series circuit of a solar module/laminate.

FIG. 8F illustrates a plan view of a 2×3 parallel/series circuit 810e, in accordance with an embodiment of the present disclosure. Six strings 800 are arranged and appropriately coupled at the ends of the strings 800 by folded metal foil 806 portions. In embodiments, the folded metal foil 806 can also be referred to as an overhang portion 806. In embodiments, extension portions 807a, 807b can be used to connect return ribbons 814a, 814b to the folded metal foil portion 806. In embodiments, the extension portions 807a, 807b are similar or the same to the extension portion 807 described in FIG. 8D. In embodiments, in contrast to FIGS. 8C, 8D and 8E where at least one return ribbon is used, two or more return ribbons 814a, 814b can be used. In embodiments, end ones of the strings 800 can includes an insulation layer or tape 804 having a folded metal foil portion 806 thereon. In embodiments, an insulation layer 804 can also be used between the return ribbons 814a, 814b and the strings 800. In embodiments, the return ribbons 814a, 814b can be over a back side of each of the solar cells of one of the strings 800. In embodiments, one or more of the strings 800 of FIG. 8F are the same or similar to the bussed string 800 described in FIG. 8A. In embodiments, one or more of the strings 800 of FIG. 8F are the same or similar to the strings 800a, 800b of FIG. 8B. In embodiments, the circuit 810d can include a J-box 816. In an embodiment, the J-box 816 can include one or more diodes, e.g., in one example as shown in FIG. 8F. In an example, the J-Box 816 can include one or more bypass diodes. In embodiments, one or more external connectors 820a, 820b can be used to connect the parallel/series circuit 810d to an external circuit (e.g., connected to another solar panel).

FIG. 8G illustrates a plan view of a 2×3 parallel/series circuit 810d, in accordance with an embodiment of the present disclosure. Six strings 800 are arranged and appropriately coupled at the ends of the strings 800 by folded metal foil 806 portions. In embodiments, the folded metal foil 806 can also be referred to as an overhang portion 806. In embodiments, extension portions 807a, 807b can be used to connect return ribbons 814a, 814b to the folded metal foil portion 806. In embodiments, the extension portions 807a, 807b are similar or the same to the extension portions described in FIGS. 8F and 8D. In embodiments, in contrast to FIGS. 8C, 8D and 8E where at least one return ribbon is used, two or more return ribbons 814a, 814b can be used. In embodiments, end ones of the strings 800 can include an insulation layer or tape 804 having a folded metal foil portion 806 thereon. In embodiments, an insulation layer 804 can also be used between the return ribbons 814a, 814b and the strings 800. In embodiments, the return ribbons 814a, 814b can be over a back side of each of the solar cells of one of the strings 800. In embodiments, one or more of the strings 800 of FIG. 8G are the same or similar to the bussed string 800 described in FIG. 8A. In embodiments, one or more of the strings 800 of FIG. 8G are the same or similar to the strings 800a, 800b of FIG. 8B. In embodiments, the circuit 810e includes a first J-box 816a, a second J-box 816b and a third J-box 816b. In an embodiment, at least one or more of the J-boxes 816a, 816b, 816c are a monopole junction boxes. In an embodiment, the J-boxes 816a, 816 can include one or more diodes (e.g., as shown in FIG. 8G). In an example, the J-Boxes 816a, 816b can include one or more bypass diodes. In an example, in contrast to FIGS. 8C, 8D and 8F where at least one junction box is used, two or more junction boxes (J-box) can be used. In embodiments, one or more external connectors 820a, 820b can be used to connect the parallel/series circuit 810e to an external circuit (e.g., connected to another solar panel).

As described herein, methods of forming solar strings, solar circuit formation and the like are shown. In embodiments, the metallization processes and structures described herein to create and/or as part of a solar panel, solar module, solar laminate and/or a flexible type solar panel. FIGS. 9A and 9B illustrate cross-sectional views of an example solar cell module, in accordance with an embodiment of the present disclosure.

Referring to FIG. 9A, an exploded view of a solar module 940 is presented. In an embodiment, a method can include providing semiconductor substrates 925. In an embodiment, the semiconductor substrates 925 can include solar cells (e.g., solar cells described herein). In an embodiment, the method can include locating and/or placing the semiconductor substrates 925 over an encapsulant 934. In an embodiment, the encapsulant 934 can be disposed over a backsheet 935. In an embodiment, locating and/or placing the semiconductor substrates 925 can include locating and/or placing the semiconductor substrates over a cover layer 933 and/or a backsheet 935. In an example, locating and/or placing the semiconductor substrates 925 can include locating and/or placing the semiconductor substrates 925 over an encapsulant 934B which, in turn, can be disposed over the cover layer 933 (e.g., in this way, a front side 931 of a solar module 940 would face downward). In one example, locating and/or placing the semiconductor substrates 925 can include locating and/or placing the semiconductor substrates 925 over an encapsulant 934A which, in turn, can be disposed over the backsheet 935. In an example, prior to or subsequent to placing the semiconductor substrates 925 over the encapsulant 934A, cover layer 933 and/or backsheet 935, conductive contact structures can be formed using a LAMP approach as describe herein. In an example, the method can include exposing a metal foil 950 to laser beam over selected portions of the semiconductor substrates 925, wherein exposing the metal foil 950 to the laser beam forms a plurality conductive contact structures having of locally deposited metal portion electrically connecting the metal foil 950 to the semiconductor substrates 925 at the selected portions. In an example, the method can include selectively removing portions of the metal foil 950, wherein remaining portions of the metal foil 950 can extend between at least two of the plurality of semiconductor substrates 925. In an embodiment, metal foil 950 can include a continuous sheet. In an example, the method can include using a continuous sheet (e.g., a continuous sheet of metal foil 950).

Referring again to FIG. 9A, in an embodiment, bottom and top encapsulants 934A, 934B can surround the semiconductor substrates 925, e.g., encapsulate the semiconductor substrates 925. In an embodiment, a cover layer 933 can be placed over the encapsulant 934B, semiconductor substrates 925, metallization structure 950 and backsheet 935. In an embodiment, placing the cover layer 933 over the encapsulant 934A can include placing glass over the encpasulant 934. In an embodiment, the encapsulants 934A. 934B can include ethylene vinyl acetate (EVA), polyolefin and/or other encapsulant materials. In an embodiment, a lamination process and/or a thermal process can be performed to form a solar laminate 936. In an embodiment, the solar laminate can include the cover layer 933, encapsulants 934A, 934B, semiconductor substrates 925, metallization structure 950 and backsheet 935. In one example, the lamination process and/or a thermal process can include heating the encapsulants 934A, 934B and semiconductor substrates 925 and metallization structure 950. In an example, the cover layer 933, encapsulants 934A, 934B, semiconductor substrates 925, metallization structure 950 and backsheet 935 can undergo a lamination and/or a thermal process to form the solar laminate 936. In an embodiment, the solar laminate can be placed in a frame 937. In an embodiment, a junction box 945, e.g., a box including bypass diodes, micro-inverters and/or other electronics can be attached to the frame 937. Thus, in an embodiment a solar module 940 can be formed. In an embodiment, the solar module 940 can have a front side 931, e.g., which faces the sun during normal operation, and back side 932 which is opposite the front side 931. Although as shown, a solar laminate is enclosed or is part of the solar module 940, in some products the solar laminate can be formed on its own (e.g., the solar laminate can be its own product). In an example, a flexible type solar panel can include the solar laminate 936 (e.g., without the frame 937). As shown, the metallization structure 950 can be placed below, e.g., on back sides of the semiconductor substrates 925 (e.g., back sides of solar cells). In embodiments, a metallization structure 951 can instead be placed on the front sides of the he semiconductor substrates 925 (e.g., front sides of solar cells).

Referring to FIG. 9B, a solar panel, solar module, solar laminate and/or a flexible type solar panel and/or laminate is formed. In an embodiment, the solar module 940 can have a front side 931, e.g., which faces the sun during normal operation, and back side 932 which is opposite the front side 931. In an embodiment, the solar module 940 can include a solar laminate 936. In an embodiment, the solar laminate can include a cover layer 933, encapsulant 934, semiconductor substrates 925, metallization structure 950 and backsheet 935. As shown, the metallization structure 950 can be placed below, e.g., on back sides of the semiconductor substrates 925 (e.g., back sides of solar cells). In embodiments, a metallization structure 951 can instead be placed on the front sides of the semiconductor substrates 925 (e.g., front sides of solar cells). In an embodiment, the metallization structures 950/951 can include the LAMP structures such as described above (e.g., metal foil, conductive contact structures including locally deposited metal). In an embodiment, metallization structures 950 can include one or more conductive contact structures including locally deposited metal portions electrically connected to the back sides the semiconductor substrates 925. In an embodiment, the metallization structures 950/951 can include interconnect portions located on and extending between semiconductor substrates 925. In an embodiment, the interconnect portions can be disposed over the back sides of the semiconductor substrates 925. In an example, the semiconductor substrates can include a plurality of semiconductor substrates 925 (e.g., first semiconductor substrates, second semiconductor substrates) and each of the substrates can include front sides and back sides. In an example, one or more conductive contact structures including locally deposited metal portions electrically connected to the first side (either a front side, a back side, or both sides) of a first semiconductor substrate and interconnect portions of the metal structure can be located on and extending between the first semiconductor substrate and a second semiconductor substrate, where the interconnect portions can be disposed over the back sides of the first and second semiconductor substrates. In an embodiment, the semiconductor substrates 925 include solar cells. In an embodiment, at least a portion of the semiconductor substrates 925 are arranged in parallel or in series. In an embodiment, at least a portion of the semiconductor substrates 925 are arranged as a string of solar cells. In an embodiment, at least a portion of the semiconductor substrates 925 are arranged as an array of solar cell strings. In an embodiment, the encapsulant 934 can include ethylene vinyl acetate (EVA), polyolefin and/or other encapsulant materials. Although as shown, a solar laminate 936 is enclosed or part of the solar module 940, in some products the solar laminate 936 can formed and sold separately (e.g., as a separate product). In an example, a flexible type solar panel can include the solar laminate 936 (e.g., without the frame 937). Also, although not shown, one or more junction boxes can be located as part of the solar module 940, connected to the frame 937 or connected to the solar laminate 936. In embodiments, referring again to FIGS. 9A and 9B, all applicable methods and structures described herein are applicable in the formation of the solar module 940 and/or solar laminate 936. In an example, the parallel/series circuit 810A-810E from FIGS. 8C-8G, can be used in the solar module 940 and/or solar laminate 936.

FIGS. 9C and 9D illustrate example junction boxes and electrical configurations between junction boxes including metal clad cables and solar module and/or laminate.

Referring to FIG. 9C, an example junction box is presented. In embodiments, the junction box 960 can be disposed on a solar module 940 as shown. In embodiments, the junction box 960 can be a potted junction box. In embodiments, the junction box 960 can include a metal clad cable 962, contacts 963, output wire 964 and a return ribbon 965. In embodiments, the metal clad cable 962 can have a first metal portion 962a, a second metal portion 962b and a metallic transition 962c. In an example, the first metal portion 962a can include aluminum and the second metal portion 962b can include copper. In embodiments, the metallic transition 962c can be a portion of the metal clad cable 962 which transitions from one metal to another, different, metal. In an example, the metallic transition can be a transition from copper to aluminum. In embodiments, the metal clad cable 962, contacts 963, a portion of the output wire 964 and a portion of the return ribbon 965 can be housed within the junction box. In embodiments, the metallic transition 962c of the metal clad cable 962 can be located within the junction box 960. In embodiments, the metal clad cable 962 can be bonded to the contacts 962. In an example, the metal clad cable 962 can include a copper clad aluminum cable. In an example, the bond between the metal clad cable 962 and the contact 963 can include a solder or a solder joint 966. In embodiments, the return ribbon 965 can include a wire, a metal foil, aluminum, aluminum foil, aluminum ribbon, among other materials. In embodiments, the return ribbon 965 can be bonded 967 to the metal clad cable 962. In embodiments, the bond 967 between the return ribbon 965 and the metal clad cable 962 can be housed within the junction box 960 as shown. In an example, the bond 967 can be a metal weld. In embodiments, metal clad cable 962 can be housed entirely within the junction box 960 as shown. In embodiments, the contacts 963 can include copper or can be a copper rail. In embodiments, the output wire 964 can extend outside of the junction box 960 to connect to an external circuit. In an example, the extended portion of the output cable 964 can be insulated or be in the form of a cable 968. In embodiments, the junction box 960 can instead be disposed on a solar laminate. In embodiments, the return ribbon 965 can correspond to the return ribbon 814 from FIGS. 8C, 8D, 8F and 8G. In an example, the return ribbon 965 can be coupled to the folded metal foil portion 806 and/or extension portion 807 of FIGS. 8C, 8F, 8D and 8G.

Referring to FIG. 9D, another example junction box is presented. In embodiments, the junction box 960 can be disposed on a solar module 940 as shown. In embodiments, the junction box 960 can be a potted junction box. In embodiments, the junction box 960 can include a metal clad cable 962, contacts 963 and output wire 964. In embodiments, the metal clad cable 962, contacts 963 and a portion of the output wire 963 can be housed within the junction box 960 as shown. In embodiments, the metal clad cable 962 can have first metal portion 962a and, a second metal portion 962b and a metallic transition 962c. In an example, the first metal portion 962a can include aluminum and the second metal portion 962b can include copper. Similar to FIG. 9C, in embodiments, the metallic transition 962c can be a portion of the metal clad cable 962 which transitions from one metal to another, different, metal. In an example, the metallic transition 962c can be a transition from copper to aluminum. In embodiments, the metallic transition 962c can be soldered to the contacts 963 during assembly or built into the contacts 963 during junction box manufacturing. In embodiments, the metal clad cable 962 can be bonded to the contacts 963. In embodiments, the metallic transition 962c can be soldered to the contacts 963 during assembly or built into the contacts 963 during junction box manufacturing. In an example, the metal clad cable 962 can include a copper clad aluminum cable. In an example, the bond 966 between the metal clad cable 962 and the contact 963 can include a solder or a solder joint. In embodiments, a return ribbon 965 can be bonded 967 to the metal clad cable 962. In embodiments, the bond 967 between the return ribbon 965 and the metal clad cable 962 can be external to the junction box 960, e.g., in contrast to FIG. 9C. In embodiments, the metallic transition 962c of the metal clad 962 can be located outside or external to the junction box 960. In an example, the bond 967 can be a metal weld. In embodiments, a portion of the metal clad cable 962 can be housed within the junction box 960 as shown. In an example, the second metal portion 962b can be housed in the junction box 960 while the first metal portion 962a and the metallic transition 962c can be external to the junction box, e.g., outside of, the junction box 960. In embodiments, the contacts 963 can include copper or can be a copper rail. In embodiments, the output wire 964 can extend outside of the junction box 960 to connect to an external circuit. In an example, the extended portion of the output cable 964 can be insulated or be in the form of a cable 968. In embodiments, the junction box 960 can instead be disposed on a solar laminate. In embodiments, the return ribbon 965 can correspond to the return ribbon 814 from FIGS. 8C, 8D, 8F and 8G. In an example, the return ribbon 965 can be coupled to the folded metal foil portion 806 and/or extension portion 807 of FIGS. 8C, 8D, 8F and 8G.

FIGS. 10A-10D illustrate various architectures for LAMP fold-over circuit formation, in accordance with an embodiment of the present disclosure.

Figure 10A:
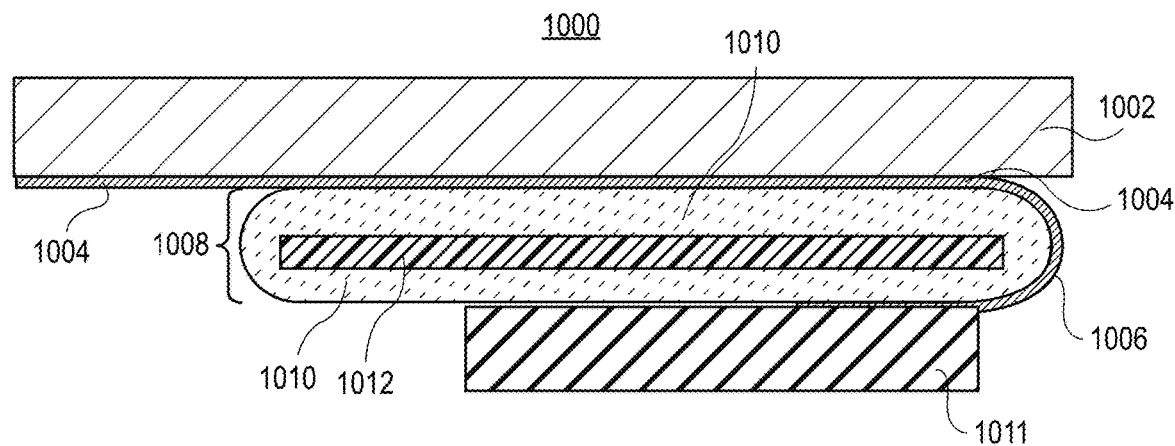
FIGS. 10A, 10B and 10C illustrate various architectures for LAMP fold over circuit formation, in accordance with an embodiment of the present disclosure.

Referring to FIG. 10A, a LAMP fold-over circuit 1000 includes a solar cell 1002 having one or more laser assisted metallization conductive contact structures that electrically connect a metal foil 1004 to the back side of the solar cell 1002. The metal foil 1004 can include an overhang portion 1006. In embodiments a ribbon 1011 can be bonded to the overhang portion 1006 (e.g., as described above). The overhang portion 1006 is folded over an insulating structure 1008. In embodiments, the insulating structure 1008 can a include multi-layered extrusion having encapsulant layers and dielectric layers, each layer having a thickness in a range of 10-1000 microns. In an embodiment, the insulating structure 1008 can include a thickness of at least 30 microns. The insulating structure 1008 can include an encapsulant material 1010 around a core 1012. The inclusion of the insulating structure 1008 can maintain a curvature in the overhang portion 1006, decouples stress, and/or provide insulation. In an embodiment, a ribbon 1011 can be coupled to the overhang portion 1006. In an example, the ribbon 1011 can be coupled to a portion of the overhang portion 1006 disposed beneath the insulating structure 1008. In an embodiment, the overhang portion 1006 can be disposed between the ribbon 1011 and the insulating structure 1008. In an embodiment, the ribbon 1011 can be electrically connected and/or bonded to the overhang portion 1006 (e.g., welded, soldered, etc.). In embodiments, the ribbon 1011 and overhang portion 1006 can be continuous. In an example, the ribbon 1011 can be part of, and/or extend from, the overhang portion 1006. In embodiments, the ribbon 1011 can include an aluminum, aluminum ribbon, aluminum foil, among other materials. An example of the insulating structure 1008 is described in FIG. 10B below.

Figure 10B:
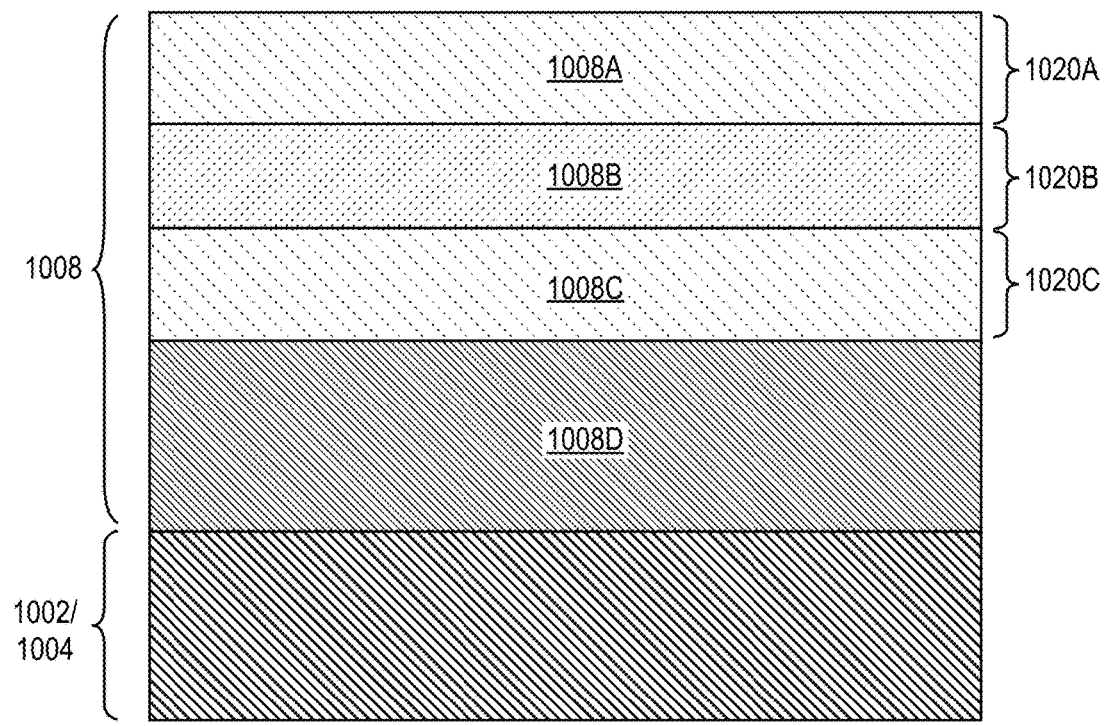

Referring to FIG. 10B, an exemplary material stack for the insulating structure 1008 of FIG. 10A is depicted, according to some embodiments. In embodiments, the insulating structure 1008 can include a plurality of layers. In a specific example, the insulating structure 1008 can include four layers: a first layer 1008A, second layer 1008B, third layer 1008C and fourth layer 1008D as shown in FIG. 10B. In embodiments, the first layer can also be referred to as a first encapsulant layer 1008A. In embodiments, the second layer can also be referred to as a first dielectric layer 1008B. In embodiments, the first layer 1008A can be disposed over the second layer 1008B. In embodiments, the third layer can also be referred to as a second encapsulant layer 1008C. In embodiments, the second layer 1008B can be disposed over the third layer 1008C. In embodiments, the combination of the first layer 1008A (e.g., first encapsulant layer), the second layer 1008B (e.g., first dielectric layer), and the third layer 1008C (e.g., second encapsulant layer) can be referred to herein as an insulating structure or a multi-layered extrusion stack 1008. In embodiments, a fourth layer 1008D (e.g., optional layer) can also be included with the multi-layered extrusion stack 1008 for additional thickness. in embodiments, fourth layer can also be referred to as third encapsulant layer. In embodiments, the third layer 1008C can be disposed over the fourth layer 1008D.

Referring again to FIG. 10B, in embodiments, the first, third and fourth layers 1008A, 1008C, 1008D (e.g., encapsulant layers) can include ethylene vinyl acetate (EVA) or polyolefin (POE). In embodiments, the second layer 1008B (e.g., dielectric layer) can include a polyethylene terephthalate (PET). Although example materials are described herein for the first, second, third and fourth layers, other materials can also be used.

Referring still again to FIG. 10B, in embodiments, the first layer 1008A can have a thickness 1020A. In embodiments, the second layer 1008B can have a thickness 1020B. In embodiments, the third layer 1008C can have thickness 1020C. In embodiments, the thickness 1020A, 1020B, 1020C of each layer 1008A, 1008B, 1008C, 1008D respectively, can each be in a range of approximately 10-1000 microns. In an example, the first layer 1008A, second layer 1008B, third layer 1008C, and/or fourth layer 1008D can have a thickness in a range of 101-200 microns, 201-300 microns, 301-400 microns, 401-500 microns, 501-600 microns, 601-700 microns, 701-800 microns, 801-900 microns and/or 901-1000 microns.

Referring yet again to FIG. 10B, in embodiments, the multi-layered extrusion stack 1008 can be placed on or located over a solar cell 1002. In embodiments, the multi-layered extrusion stack 1008 can be placed on or located over a metal foil 1004 of the solar cell 1002 (e.g., as described in FIG. 10A). In embodiments, the multi-layered extrusion stack 1008 can be placed on or located over a plated metal, ribbon, wired or any other type of solar cell metallization.

Figure 10C:
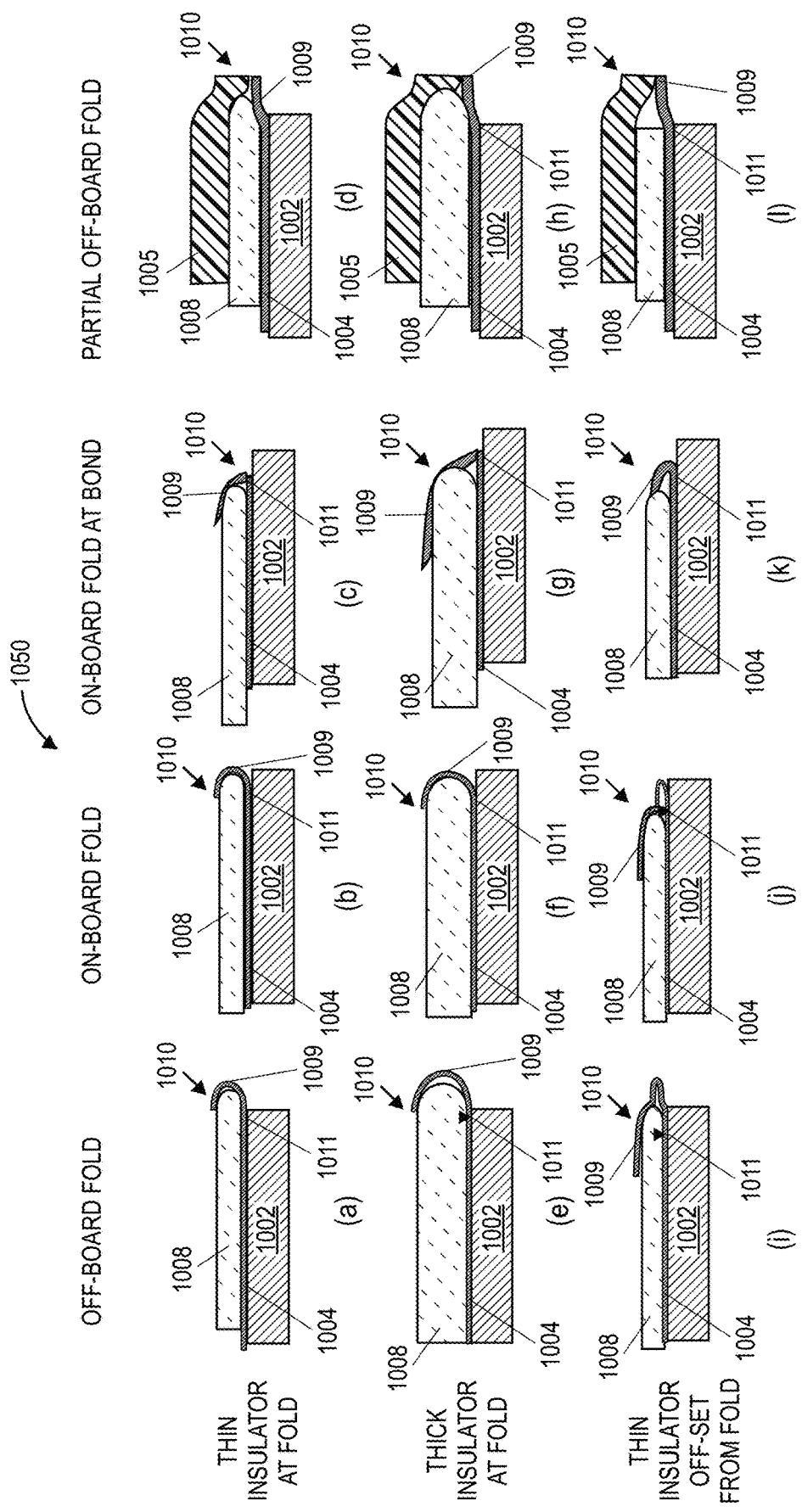

Referring to FIG. 10C, an array 1050 of fold-over circuit architectures is shown for four exemplary arrangements: off-board fold, on-board fold, on-board fold at bond, and partial off-board fold. In embodiments, the column labels of FIG. 10C can refer to the geometry of the mating location between a substrate 1002 of a solar cell, solar cell metallization 1004 and an insulating structure 1008. In embodiments, the substrate 1002 of a solar cell can include a silicon substrate and solar cell metallization 1004 can include a metal foil, aluminum foil and/or any other type of metallization. In embodiments, the insulating structure 1008 can include the insulating structures described above (e.g., as described in FIGS. 10A and 10B). In embodiments, an overhang portion 1009 can extend from the solar cell metallization 1004 disposed over the substrate 1002, the overhang portion 1009 extending off an edge the substrate 1002. In embodiments, the overhang portion 1009 can be folded 1010 over the insulating structure 1008. In embodiments, four exemplary arrangements at the fold 1010 are shown as a function of insulating structure thickness: a thin insulator at a fold (e.g., 1 insulating stack at the fold), a thick insulator at a fold (e.g., 2 insulating stacks at the fold), or an insulator offset from a fold (e.g., no insulating stacks at the fold). In an example, the row labels can indicate the thickness of an insulating material 1008 present at the fold 1010 relative to the metallization 1004 thickness. Also, shown are bond 1011 that allow the solar cell metallization to bond to the substrate 1002 and/or an underlying metal. In an example, the bonds can include welds or laser welds. Other arrangements can also provide suitable fold-over circuit configurations.

Referring again to FIG. 10C, in embodiments, the off-board fold and partial off-board fold can provide structural examples which minimize the length of detached metallization structure at the fold 1010. In embodiments, this configuration can be referred to at FIG. 1050 (*a*), 1050 (*e*) and 1050 (*i*) for the off-board fold and to FIG. 1050 (*d*), 1050 (*h*) and 1050 (*l*) for the partial off-board fold. In an example, overhang portions 1009 of a metallization structure 1004 can be minimized at a wafer edge since the metallization structure 1004 can be free to extended past the edge of the substrate 1002. In embodiments, an advantage to minimizing the length of the detached on-cell metallization 1004 can include reducing current loss and maximizing power output. In embodiments, the off-board fold and partial off-board fold options can maximize power by minimizing the required length of detached metallization/foil 1004 after a final weld location 1011 at the wafer edge of the substrate 1002 since the foil can be free to extend past the edge, e.g., fold 1010, of the solar cell. In some embodiments, the off-board metallization and partial off-board fold can include covering, cloaking or adding a material to obstruct the metallization 1004 from view from a front side of the solar cell. Such a configuration can also address corrosion and improve aesthetical appearance of a solar cell product.

Referring yet again to FIG. 10C, in embodiments, the on-board fold and on-board fold at bond examples include a distance where the metallization structure can separate from the wafer before the wafer edge. In embodiments, this configuration can refer to FIG. 1050 (*b*), 1050 (*f*) and 1050 (*j*) for the on-board fold and to FIG. 1050 (*c*), 1050 (*g*) and 1050 (*k*) for the on-board fold at bond. In embodiments, the on-board at bond examples allow for the metallization structure 1004 to continue flat after a last bond location 1011 then make a fold 1010 around an insulator material 1008. In embodiments, the on-board fold at bond can require a particular support bond or weld 1011 at which the metallization structure 1004 is pulled back and folded over an insulating structure 1008 (e.g., insulating structure 1008 from FIG. 10A). In embodiments, the on-board fold and on-board fold at bond options can include some distance where the on-cell metallization 1004 separates from the solar cell substrate 1002 before the substrate edge. In embodiments, such a solution can allow for the need to be physically cover or cloak from the front side.

Referring still again to FIG. 10C, in embodiments, the row titles can indicate the thickness of the insulating material present at the metallization-to-ribbon junction relative to the metallization structure thickness. In embodiments, thin insulator at the fold can include an insulator material that is 1-10 times the thickness of the metallization structure 1004. In embodiments, the thick insulator at the fold can include a thickness of the insulator that is greater than 10 times the thickness of the metallization structure 1004. In embodiments, the thin insulator off-set can include a thin insulator material offset form the actual metallization-to-ribbon junction so that the least or the minimal thickness can be present at the fold location 1010. In an example, as used for in reference to FIG. 10C thin can include a thickness of approximately 50 microns or less. In an example, as used in reference to FIG. 10C, thick can include a thickness of approximately 100 microns or more. In embodiments, thin off-set can refer to the thin material off-set form the actual junction at the bond 1011 or fold 1010 such that a zero thickness is present at the actual fold 1010, as shown in FIG. 10C.

In another aspect, LAMP side interconnect grids are described. Features of such side interconnect grids can include the use of thick ribbons or wires (busbars) connected to foil tabs. One continuous busbar can span multiple adjacent cell tabs. End-busbars can connect the continuous busbars. Additional busbars can be included to interconnect the continuous busbars. Yet additional busbars can be included to interconnect the continuous busbars side-to-side.

Figure 11A:
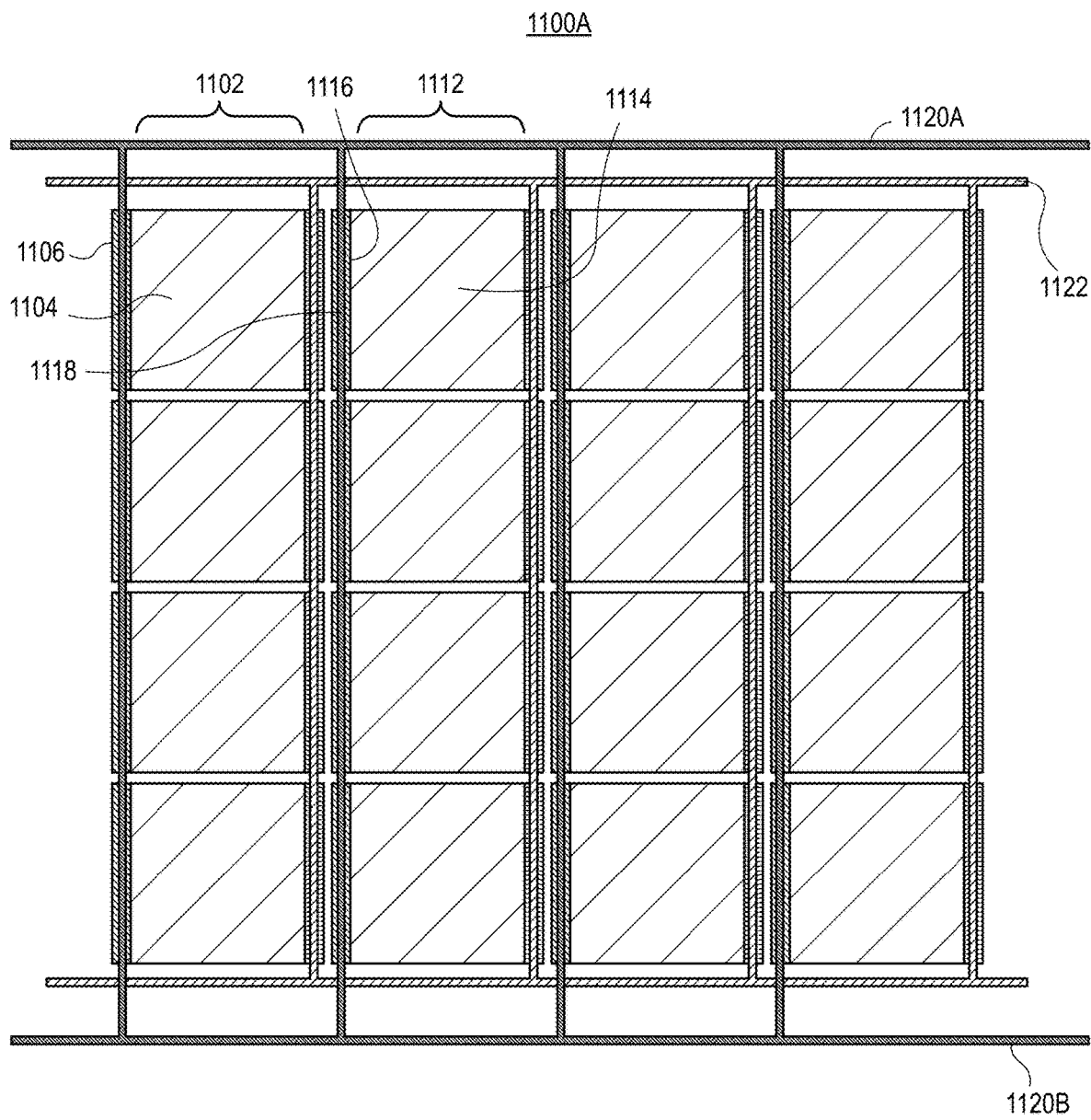
FIGS. 11A and 11B illustrate plan views of exemplary LAMP side interconnect grids, in accordance with an embodiment of the present disclosure.
Figure 11B:
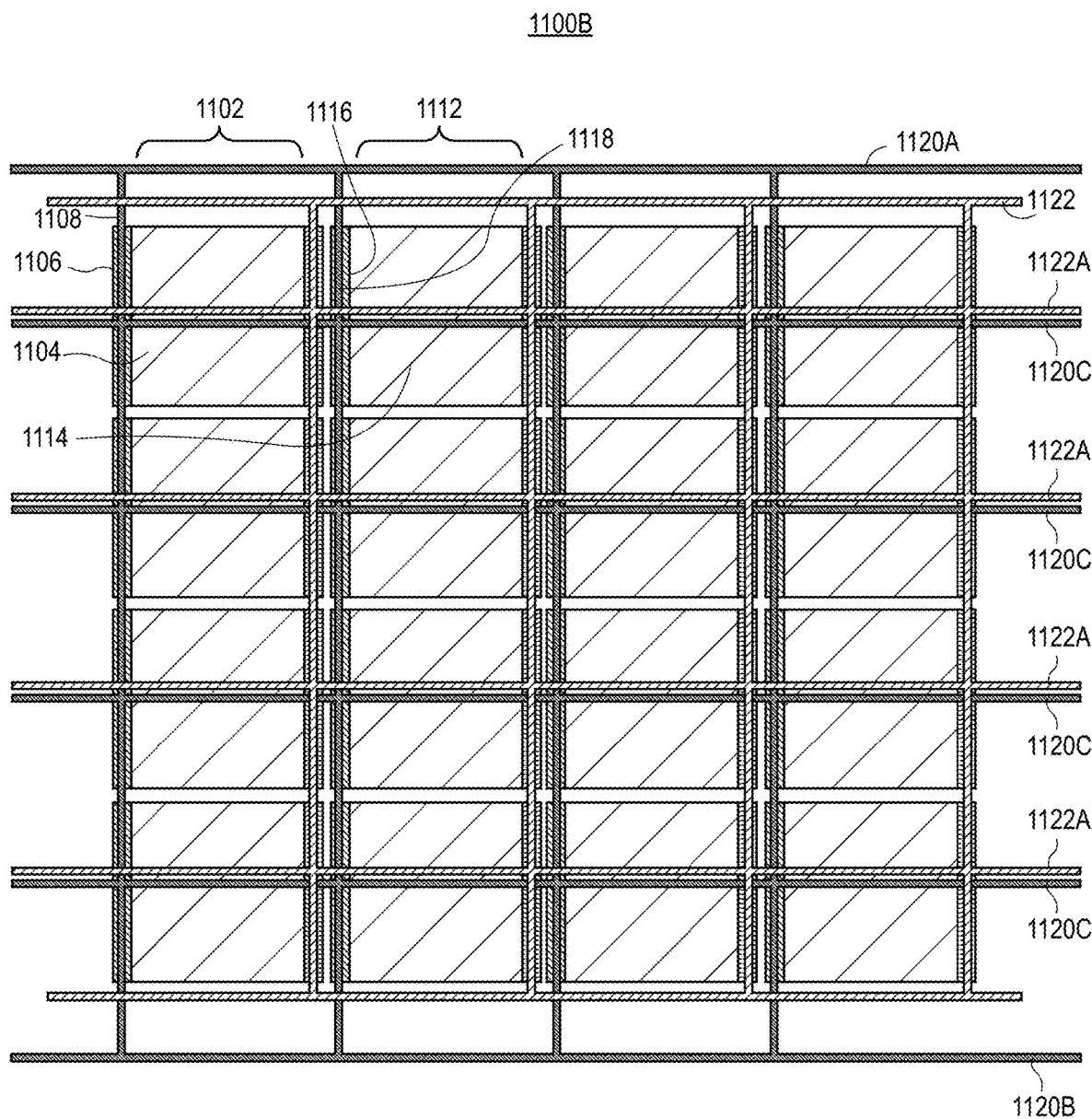

FIGS. 11A and 11B illustrate plan views of exemplary LAMP side interconnect grids 1100A and 1100B, respectively, in accordance with an embodiment of the present disclosure.

Referring to FIGS. 11A and 11B, a solar cell module includes a first solar cell string 1102 including a first plurality of solar cells 1104. Each of the first plurality of solar cells has a front side and a back side, and one or more laser assisted metallization conductive contact structures electrically connecting a metal foil to the back side of the solar cell, where the metal foil has an overhang portion 1106. A first busbar 1108 couples the overhang portions 1106 of the metal foil of each of the first plurality of solar cells 1102. The solar cell module also includes a second solar cell string 1112 including a second plurality of solar cells 1114. Each of the second plurality of solar cells 1114 has a front side and a back side, and one or more laser assisted metallization conductive contact structures electrically connecting a metal foil to the back side of the solar cell, where the metal foil has an overhang portion 1116. The solar cell module also includes a second busbar 1118 coupling the overhang portions 1116 of the metal foil of each of the second plurality of solar cells 1112. An end-busbar 1120A couples the first and second busbars 1108 and 1118. As is depicted, additional strings can be included. Also, the complementary end-busbar 1120B can be included opposite the end-busbar 1120A. Additionally, a similar busbar structure 1122 can be included for opposing sides of the solar cells. In an embodiment, referring to FIG. 11B, one or more side-to-side busbars 1120C or 1122A can be included.

Another aspect, strain relief formation can be implemented to reduce stress on foil welds and wafer attachment by transferring strain into W-shape features. Such W-shape strain relief can be formed in a tool after formation of an interconnect weld. The resulting structure can provide electrical connection between adjacent cells. The approach can include overlapping extended foil portions, overhang portions, or "wings". Two foil portions or "wings" are bonded together. Bonding can involve use of a laser, e.g., via welding but the process is not so limited. Methodologies described below can be referred to generally as strain relief stringing/circuit formation processes.

Figure 12:
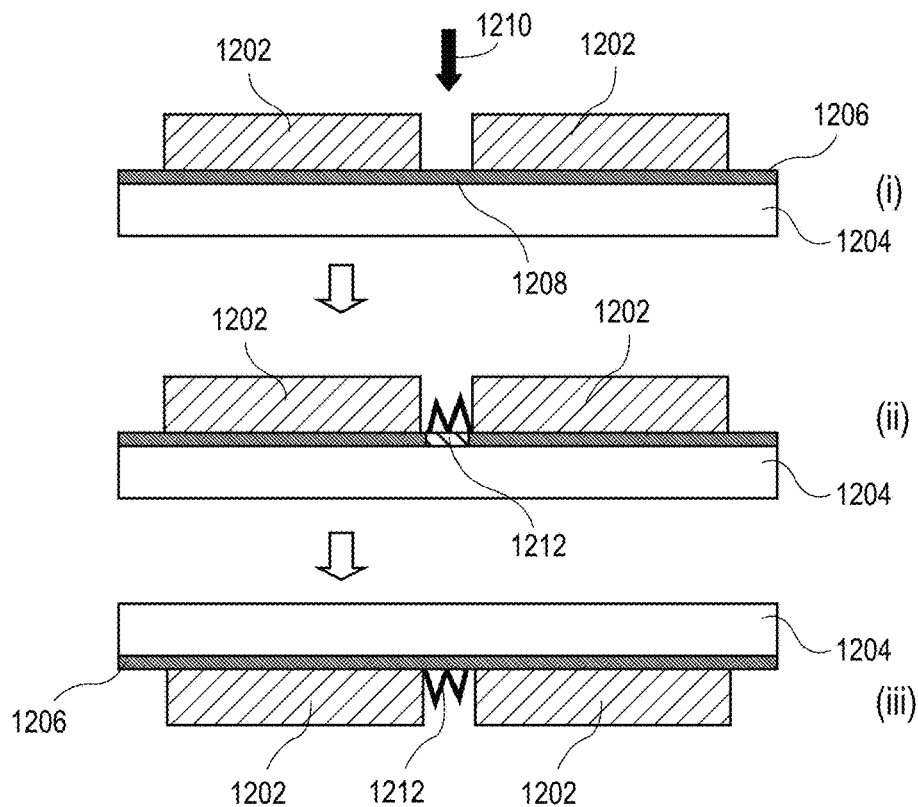
FIG. 12 illustrates cross-sectional views representing various operations in a method of sunny side up processing for stringing, in accordance with an embodiment of the present disclosure.

FIG. 12 illustrates cross-sectional views representing various operations in a method of sunny side up processing for stringing, in accordance with an embodiment of the present disclosure.

Referring to FIG. 12, at operation (i), a pair of cells 1202 is placed front side up on a chuck 1204. In embodiments, the chuck 1204 can be a ceramic chuck 1204. The back side of each of the pair of cells 1202 includes a metal foil 1206 thereon, the metal foil 1206 having overhang portions. The overhang portions are bonded at a location 1208 between cells, e.g., using a laser welding process 1210. At operation (ii), the bonded overhang portions have a strain relief feature 1212 formed therein, such as a W-strain relief feature. In one embodiment, the W-strain relief feature is formed by bending the welded overhang portions of adjacent cells. At operation (iii), the resulting string arrangement on the chuck 1204 is flipped over for layout. It is to be appreciated that it may not be possible to bend a ribbon with insulator layer (e.g., described above) or other material at a good alignment position and, instead, it may need to be bent after layout on a glass using a similar approach. In embodiments, the strain relief feature 1212 can include the strain relief features described above or herein.

Figure 13:
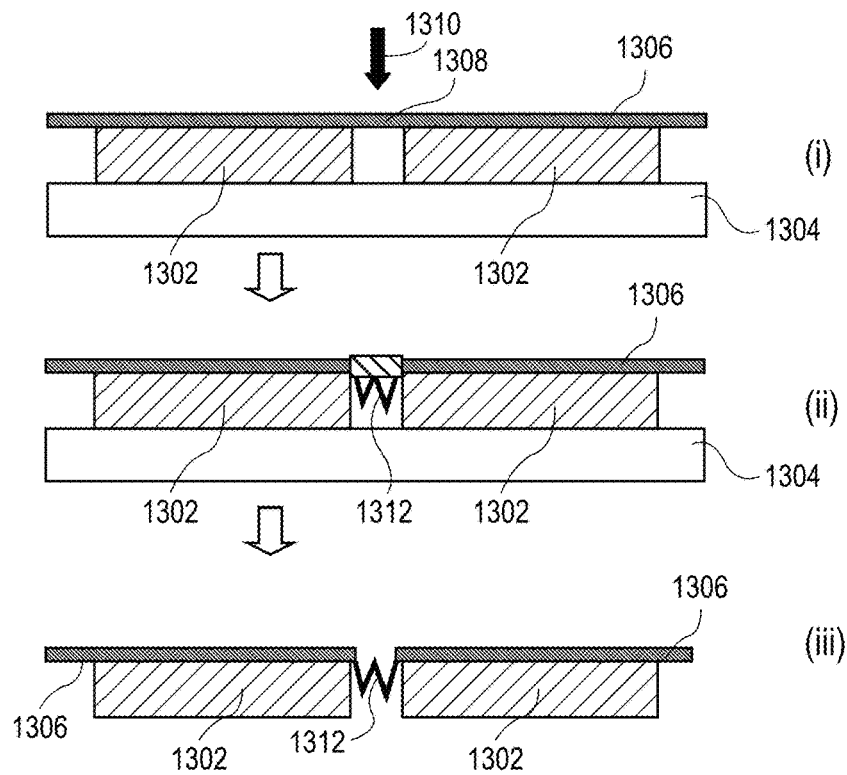
FIG. 13 illustrates cross-sectional views representing various operations in a method of sunny side down processing for stringing, in accordance with an embodiment of the present disclosure.

FIG. 13 illustrates cross-sectional views representing various operations in a method of sunny side down processing for stringing, in accordance with an embodiment of the present disclosure.

Referring to FIG. 13, at operation (i), a pair of cells 1302 is placed front side down on a chuck 1304. In embodiments, the chuck 1304 can be a ceramic chuck 1304. The back side of each of the pair of cells 1302 includes a metal foil 1306 thereon, the metal foil 1306 having overhang portions. The overhang portions are bonded at a location 1308 between cells, e.g., using a laser welding process 1310. At operation (ii), the bonded overhang portions have a strain relief feature 1312 formed therein, such as a W-strain relief feature. In one embodiment, the W-strain relief feature is formed by bending the welded overhang portions of adjacent cells. At operation (iii), the resulting string arrangement is shown, where the string arrangement is lifted off the chuck 1304, from (ii) of FIG. 13, for layout. It is to be appreciated that it may not be possible to bend a ribbon with an insulator layer (e.g., as described above) or other material at a good alignment position and, instead, it may need to be bent after layout on a glass using a similar approach.

Figure 14:
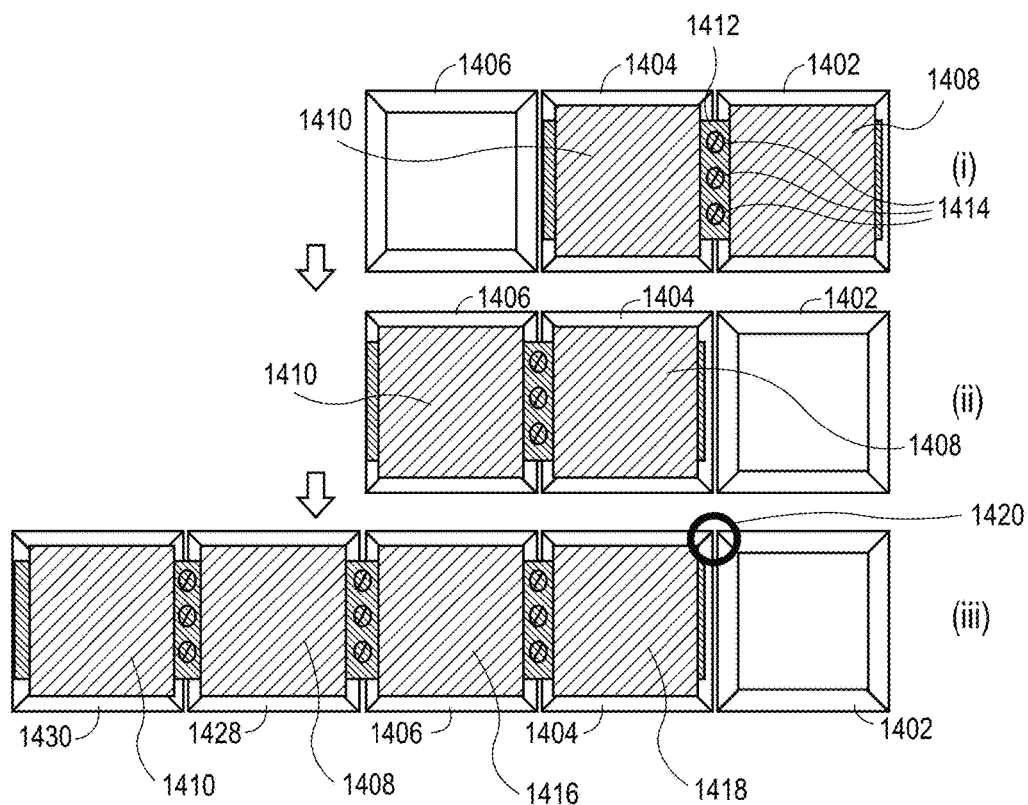
FIG. 14 illustrates plan views representing various operations in a method of stringing, in accordance with an embodiment of the present disclosure.

FIG. 14 illustrates plan views representing various operations in a method of stringing, in accordance with an embodiment of the present disclosure.

Referring to operation (i) of FIG. 14, a first chuck 1402, a second chuck 1404 and are third chuck 1406 are provided. A first cell 1408 is placed on first chuck 1402. A second cell 1410 is placed on second chuck 1404. The first cell 1408 and the second cell 1410 have metal foil overhang portions 1412 that are bonded, e.g., with bonds or welds 1414. In embodiments, a vacuum can be used to hold the solar cells 1410, 1408 in place at the chucks 1404, 1402 respectively.

At operation (ii) of FIG. 14, cell 1408 on the first chuck 1402 and cell 1410 on the second chuck 1404 are moved to second chuck 1404 and third chuck 1406, respectively. In embodiments, W bending is performed between the cells 1408 and 1410. During W bending, a vacuum of the third chuck 1406 can remain "on" and the cell 1408 on second chuck 1404 floats and moves toward the third chuck 1406 during W bending. In an example, the W bending described is similar or the same to the strain relief features described above or herein.

At operation (iii) of FIG. 14, first cell 1408 is moved to a fourth chuck 1428, and second cell 1410 is moved to a fifth chuck 1430. A third cell 1416 is introduced to third chuck 1406, and a fourth cell 1418 is introduced to the second chuck 1404. In embodiments, a vision system 1420 next to the second chuck 1404 can drive pins for loading first cell 1408 for laser welding, while floating cells during W bend. In an embodiment, the vacuum can be "on" for vision alignment and laser welding of another cell onto the first chuck 1402.

Figure 15:
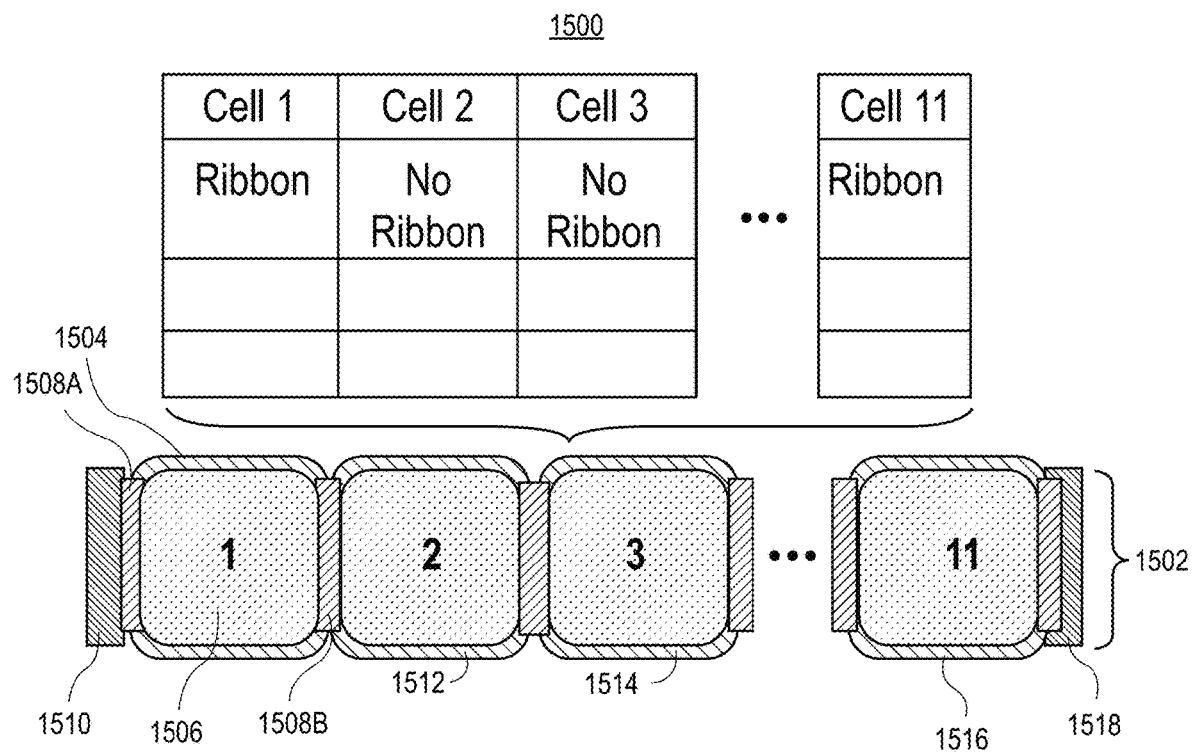
FIG. 15 includes a table and corresponding plan view of a string of solar cells, in accordance with an embodiment of the present disclosure.

FIG. 15 includes a table 1500 and corresponding plan view 1502 of a string of solar cells, in accordance with an embodiment of the present disclosure.

Referring to FIG. 15, a first cell 1504 has a foil 1506 with a first wing 1508A having a ribbon 1510 bonded thereto. The first cell 1504 can include a second wing 1508B bonded to a wing of an adjacent second solar cell 1512, and so on. As used herein, wing can also be referred to as an overhang portion (e.g., as described above). In embodiments, stringing operations can include smoothing the overhang portions of the foil, bonding ribbon to two cells (e.g., sunny side down), bonding two cells (one with ribbon, one without), adding a third cell 1514, and either welding or forming a "W" feature (e.g., as described above). The operations can be repeated until, e.g., a 10 cell string is achieved. In embodiments, an eleventh cell 1516 having a ribbon 1518 can be bonded to the 10 cell string. The string can then be flipped over (including the chuck) onto a layout, and ribbon 1518 can be folded over, in either order. Final circuit formation can include placing jumpers, bonding jumpers, and place and bond of the cells (e.g., as also described above).

Figure 16A:
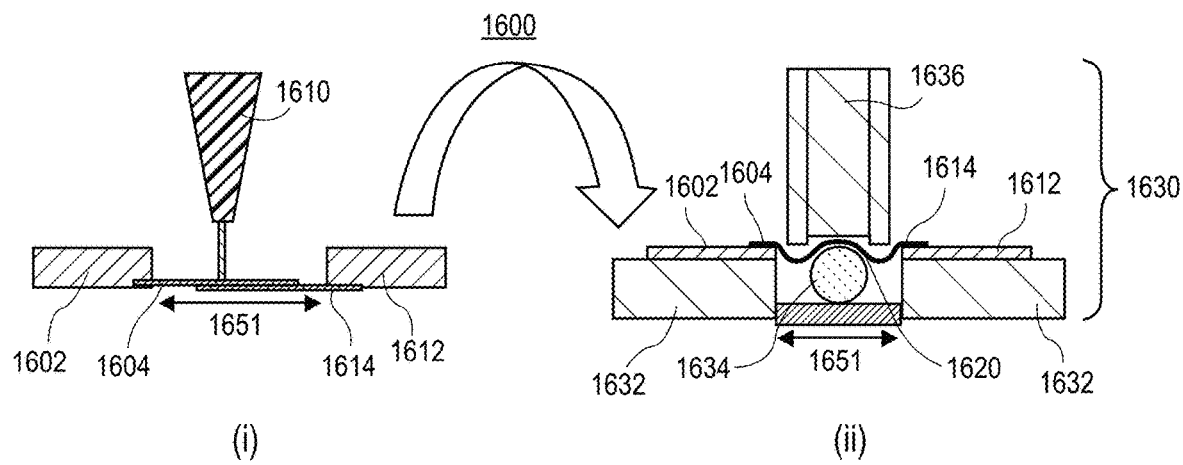
FIGS. 16A and 16B illustrates cross-sectional views representing various operations in a method of fabricating a string of solar cells as well as an apparatus for fabricating such solar cell strings, in accordance with an embodiment of the present disclosure.

FIG. 16A illustrates cross-sectional views representing various operations in a method 1600 of fabricating a string of solar cells, in accordance with an embodiment of the present disclosure.

Referring to FIG. 16A, at operation (i) an overhang foil portion 1604 of a first cell 1602 is bonded or welded (e.g., laser 1610 welded) to an overhang foil portion 1614 of a first cell 1612. An exemplary spacing 1651 between cells 1602 and 1604 is approximately 5 mm or less. At operation (ii), a W strain relief feature 1620 is formed in the welded overhang portions 1604 and 1614. The resulting spacing 1651 between cells 1602 and 1604 can be approximately 5 mm or less. In an embodiment, a tool 1630 for forming the W strain relief feature 1620 includes chucks 1632, a shaping feature 1634, and a press feature 1636 (e.g., as described below).

Figure 16B:
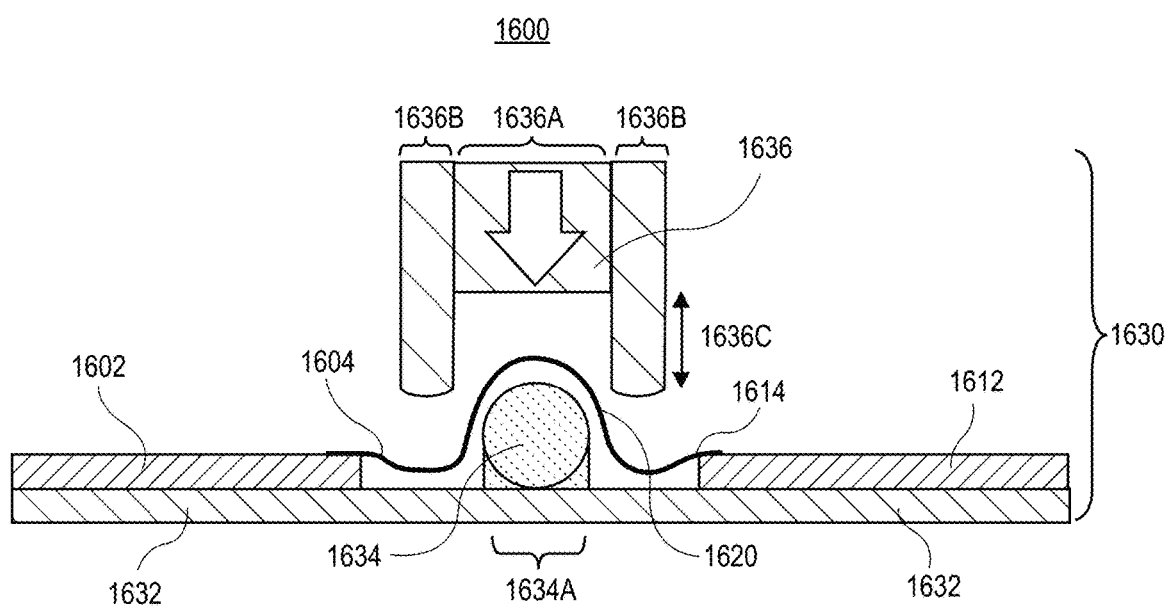
Figure 16C:
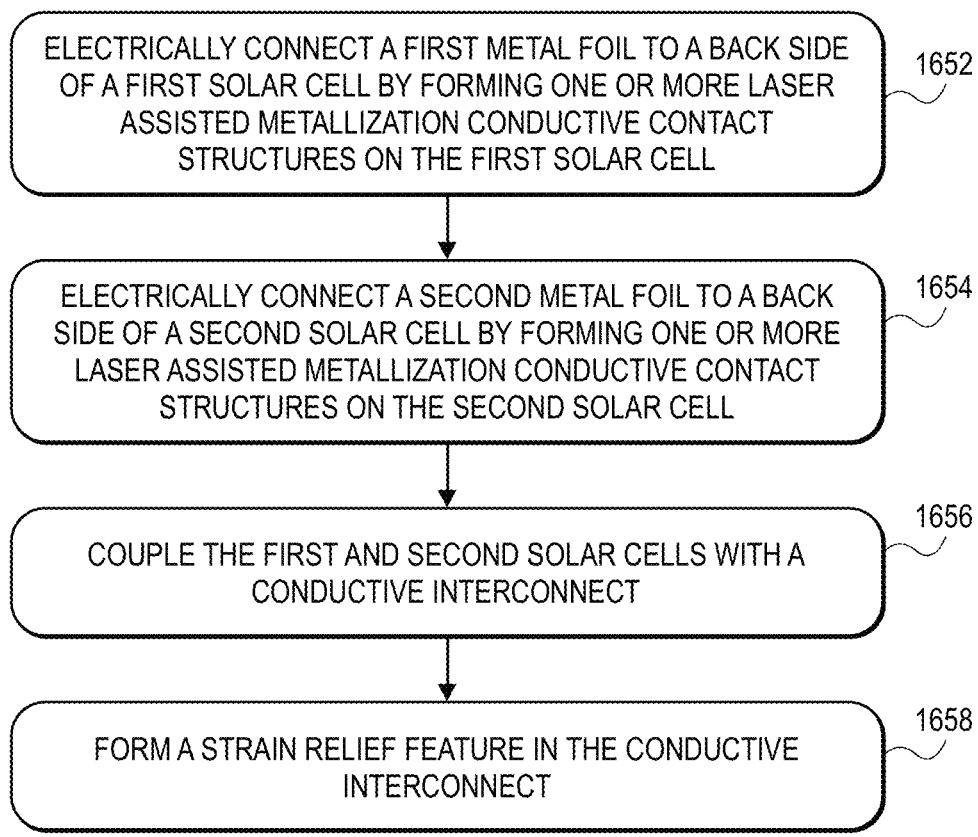
FIG. 16C is a flowchart representing various operations in a method of fabricating a string of solar cells, in accordance with an embodiment of the present disclosure.

FIG. 16B illustrates cross-sectional views representing various operations in an apparatus 1600 of fabricating a string of solar cells, in accordance with an embodiment of the present disclosure.

Referring to FIG. 16B, a tool 1630 for forming the W strain relief feature 1620 includes chucks 1632, a shaping feature 1634, and a press feature 1636. In embodiments, the shaping feature 1636 can include a base portion 1636a and extended portions 1636b. In embodiments, the base portion can have a width of approximately in a range of 700-1000 micrometers. In embodiments, the extended portions 1636b can have a width of approximately in a range of 300-400 micrometers. In embodiments, the extended portions 1636b can extend from the base portion 1636a by a length 1636c. In embodiments, the length 1636c can include approximately in a range of 700-1000 micrometers. In embodiments, the shaping feature 1634 can have a width 1634a. In embodiments, the width 1634a can include 500 micrometers. In embodiments, the shaping feature 1634 can be in the cross-sectional shape of a circle, square, oblong, trapezoid and/or any other polygon or shape. In embodiments, the shaping feature 1634 can include a cylinder or a cylindrical shape.

With reference generally to FIGS. 12, 13, 14, 15, 16A and 16B, FIG. 16C is a flowchart 1650 representing various operations in a method of fabricating a solar cell string, in accordance with an embodiment of the present disclosure.

At operation 1652 of flowchart 1650, a method of fabricating a solar cell string includes electrically connecting a first metal foil to a back side of a first solar cell by forming one or more laser assisted metallization conductive contact structures (e.g., LAMP structures) on the first solar cell. At operation 1654 of flowchart 1650, a second metal foil is electrically connected to a back side of a second solar cell by forming one or more laser assisted metallization conductive contact structures (e.g., LAMP structures) on the second solar cell. At operation 1656 of flowchart 1650, the first and second solar cells are coupled with a conductive interconnect. In an embodiment, coupling the first and second solar cells with the conductive interconnect involves coupling an overhang portion of the first metal foil and an overhang portion of the second metal foil. At operation 1658 of flowchart 1650, a strain relief feature can be formed in the conductive interconnect. In an embodiment, the method can involve smoothing the overhang portion of the first metal foil and the overhang portion of the second metal foil prior to forming the strain relief feature in the conductive interconnect, e.g., as described below in association with FIG. 18.

In another aspect, tool consideration for forming strain relief features in LAMP features for solar cell stringing are described. Challenges to be addressed include that wings or overhang portions are typically small, a "W" is small, cell substrates or wafers are delicate, the cell texture is delicate, and cell movement needs to be accommodated during stringing and during strain relief formation.

Figure 17:
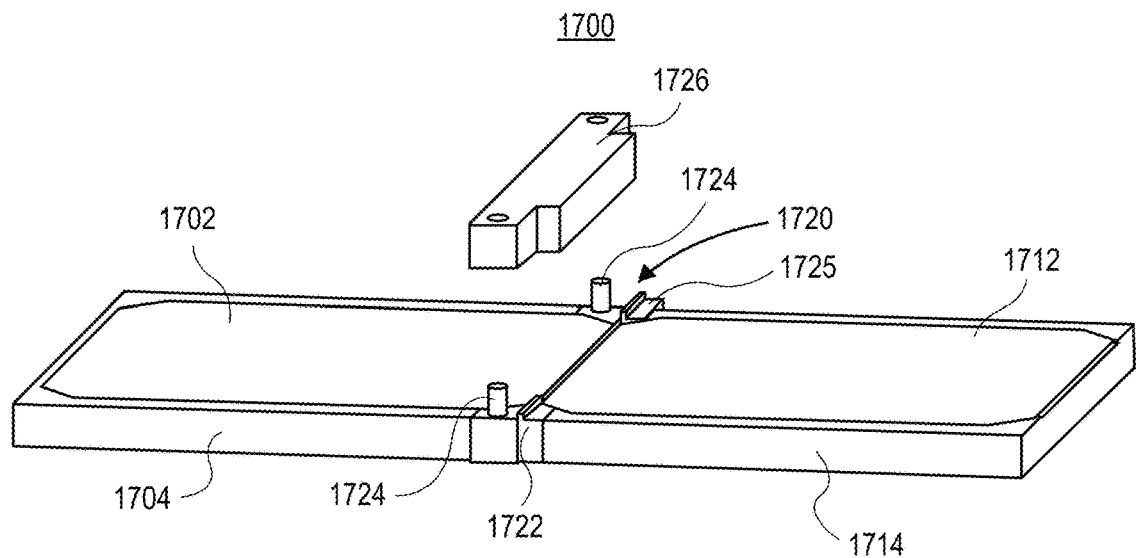
FIG. 17 illustrates a tooling arrangement for strain relief formation, in accordance with an embodiment of the present disclosure.

FIG. 17 illustrates a tooling arrangement 1700 for strain relief formation, in accordance with an embodiment of the present disclosure.

Referring to FIG. 17, a first cell 1702 is on a first chuck 1704. A second cell 1712 is on a second chuck 1714. A region 1720 situates welded overlapping metal foil overhang portions 1722 between receiving pins 1724 and over topography 1725. A press 1726 can be inserted onto the pins 1724. The press 1726 can be used to shape the welded overlapping metal foil overhang portions 1722 to include a strain relief feature therein. In another embodiment, a roller can be used in place of the press 1726. In an embodiment, the structures described at 1636 of FIGS. 16A and 16B can also be used or apply to the press 1726. In one example, the press 1726 can include the features and/or shape of the press feature 1636 (e.g., the base portion 1636a and extended portions 1636b).

Figure 18:
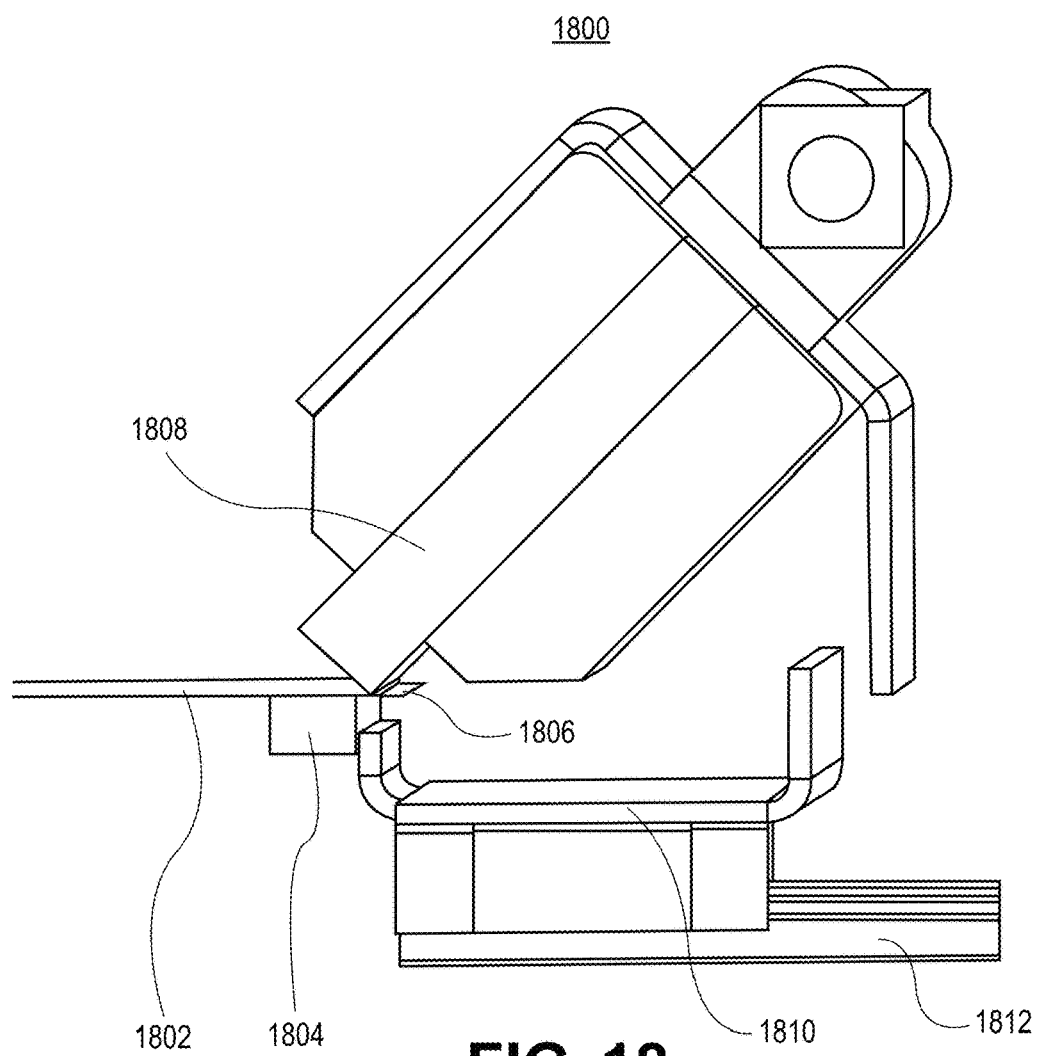
FIG. 18 illustrates a tooling arrangement for overhang portion smoothing, in accordance with an embodiment of the present disclosure.

FIG. 18 illustrates a tooling arrangement 1800 for wing smoothing, in accordance with an embodiment of the present disclosure.

Referring to FIG. 18, a cell or string of cells 1802 is situated over an anvil 1804. A metal foil overhang portion 1806 extends beyond the anvil 1804. A press 1808 is fit into a receiving cam 1810. The metal foil overhang portion 1806 is smoothed out when the press 1808 is fit into a receiving cam 1810. In embodiments, the metal foil can be flattened and/or adhered uniformly to a roller including a vacuum underneath the metal foil overhang portion 1806, where the metal foil overhang portion 1806 is smoothed out when the roller including a vacuum is used to fit into a receiving cam 1810. The receiving cam 1810 can be on a slide 1812 to enable movement of the process.

Several implementations discussed herein can provide less costly and faster metallization than using optical lithography (and omission of an associated etch process), and potentially more precise patterning with smaller feature width and higher aspect ratio compared to screen printing. LAMP techniques enable direct deposition and patterning of metal on a substrate using an inexpensive metal foil in a single operation process via a laser, and represents a significant cost advantage over competing technologies. LAMP techniques also enable the fabrication of relatively small features. Specifically, tighter pitch and higher efficiency can be achieved as compared with structures typically formed using screen printing.

Other advantages include providing a feasible approach to replace the use of silver with less costly aluminum (in the form of an aluminum foil) for metallization of semiconductor features. Furthermore, the aluminum deposited with a LAMP technique can be a pure, monolithic metal, in contrast to screen printed silver, which has higher electrical resistance due to its porosity.

An exemplary aluminum (Al) metal foil has a thickness approximately in the range of 1-100 µm, for example in the range of 1-15 µm, 5-30 µm, 15-40 µm, 25-50 µm 30-75 µm, or 50-100 µm. The Al metal foil can be a temper grade metal foil such as, but not limited to, F-grade (as fabricated), O-grade (full soft), H-grade (strain hardened) or T-grade (heat treated). The aluminum metal foil can be anodized or not, and can include one or more coatings. Multilayer metal foils can also be used. Exemplary metal foils include metal foils of aluminum, copper, tin, tungsten, manganese, silicon, magnesium, zinc, lithium and combinations thereof with or without aluminum in stacked layers or as alloys.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. In another embodiment, any type of substrate used in the fabrication of micro-electronic devices can be used instead of a silicon substrate, e.g., a printed circuit board (PCB) and/or other substrates can be used.

While this disclosure is primarily directed to back-contact solar cells, the methods and techniques discussed herein, and specifically the LAMP techniques, can be applied to the metallization of a substrate in other solar cell types, such as front contact solar cells (e.g., PERC solar cells, mono-PERC solar cells, HIT solar cells, TopCon solar cells. (PERL) cells, and tandem cells, and other types of solar cells).

Additionally, the above described approaches can be applicable to manufacturing of other than solar cells. The methods and/or processes described herein can apply to various substrates and/or devices, e.g., semiconductor substrates. For example, a semiconductor substrate can include a solar cell, light emitting diode, microelectromechanical systems and other substrates.

Furthermore, although many embodiments described pertain to directly contacting a semiconductor with a metal foil as a metal source, concepts described herein can also be applicable to solar applications (e.g., HIT cells) where a contact is made to a conductive oxide, such as indium tin oxide (ITO), rather than contacting a semiconductor directly. Additionally, embodiments can be applicable to other patterned metal applications, e.g., PCB trace formation.

Thus, strings of solar cells having laser assisted metallization conductive contact structures and their methods of manufacture are presented.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

Example embodiment 1: A solar cell string includes a first solar cell having a front side and a back side, and one or more laser assisted metallization conductive contact structures electrically connecting a first metal foil to the back side of the first solar cell. The solar cell string also includes a second solar cell having a front side and a back side, and one or more laser assisted metallization conductive contact structures electrically connecting a second metal foil to the back side of the second solar cell. The solar cell string also includes a conductive interconnect coupling the first and second solar cells, the conductive interconnect including a strain relief feature.

Example embodiment 2: The solar cell string of example embodiment 1, wherein the strain relief feature includes a plurality of folds out of plane of the first and second solar cells, the strain relief feature including an overhang portion of the first metal foil and an overhang portion of the second metal foil.

Example embodiment 3: The solar cell string of example embodiment 2, wherein the strain relief feature is a W or M strain relief feature.

Example embodiment 4: The solar cell string of example embodiment 1, wherein the strain relief feature includes a conductive piece bonded to a portion of the first metal foil and to a portion of the second metal foil.

Example embodiment 5: The solar cell string of example embodiment 4, wherein the portion of the first metal foil is an overhang portion of the first metal foil, and the portion of the second metal foil is an overhang portion of the second metal foil.

Example embodiment 6: The solar cell string of example embodiment 4, wherein the portion of the first metal foil is on the first solar cell, and the portion of the second metal foil is on the second solar cell.

Example embodiment 7: The solar cell string of example embodiment 1, further including a first insulator structure on the first solar cell, the first insulator structure at least partially wrapped by an overhang portion of the first metal foil, and further including a second insulator structure on the second solar cell, the first insulator structure at least partially wrapped by an overhang portion of the second metal foil, wherein the strain relief feature includes a conductive piece bonded to the overhang portion of the first metal foil and to the overhang portion of the second metal foil.

Example embodiment 8: The solar cell string of example embodiment 1, wherein the strain relief feature includes a structure between the first solar cell and the second solar cell, the structure including a conductive layer on an insulator layer, wherein a wing portion of the first metal foil is bonded to the conductive layer, and wherein a wing portion of the second metal foil is bonded to the conductive layer.

Example embodiment 9: The solar cell string of example embodiment 1, wherein the strain relief feature includes a plurality of folds out of plane of the first and second solar cells, the strain relief feature including an overhang portion of the first metal foil, the overhang portion of the first metal foil bonded to a portion of the second metal foil on the second solar cell.

Example embodiment 10: The solar cell string of example embodiment 1, wherein the strain relief feature includes a conductive piece bonded to an overhang portion of the first metal foil and to a portion of the second metal foil on the second solar cell.

Example embodiment 11: A solar cell string includes a first solar cell having a front side and a back side, and one or more laser assisted metallization conductive contact structures electrically connecting a first metal foil to the back side of the first solar cell, wherein the first metal foil has an overhang portion. The solar cell string also includes a second solar cell having a front side and a back side, and one or more laser assisted metallization conductive contact structures electrically connecting a second metal foil to the back side of the second solar cell. The second metal foil has an overhang portion, and the overhang portion of the second metal foil is coupled to the overhang portion of the first metal foil by a thermocompression bond.

Example embodiment 12: The solar cell string of example embodiment 11, wherein the thermocompression bond is an aluminum-aluminum bond.

Example embodiment 13: A solar cell module includes a first solar cell string including a first plurality of solar cells, each of the first plurality of solar cells having a front side and a back side, and one or more laser assisted metallization conductive contact structures electrically connecting a metal foil to the back side of the solar cell. The metal foil of an end one of the first plurality of solar cells has an overhang portion folded over the back side of the end one of the first plurality of solar cells. The solar cell module also includes a second solar cell string including a second plurality of solar cells, each of the second plurality of solar cells having a front side and a back side, and one or more laser assisted metallization conductive contact structures electrically connecting a metal foil to the back side of the solar cell. The metal foil of an end one of the second plurality of solar cells has an overhang portion folded over the back side of the end one of the second plurality of solar cells. The solar cell module also includes a conductive jumper coupling the overhang portions of the metal foil of the end ones of the first and second pluralities of solar cells. The solar cell module also includes a return ribbon coupled to the end one of the second plurality of solar cells, the return ribbon over the back side of each of the second plurality of solar cells.

Example embodiment 14: The solar cell string of example embodiment 13, further including a J-box on a portion of the return ribbon.

Example embodiment 15: A solar cell module includes a first solar cell string including a first plurality of solar cells, each of the first plurality of solar cells having a front side and a back side, and one or more laser assisted metallization conductive contact structures electrically connecting a metal foil to the back side of the solar cell, wherein the metal foil has an overhang portion. The solar cell module also includes a first busbar coupling the overhang portions of the metal foil of each of the first plurality of solar cells. The solar cell module also includes a second solar cell string including a second plurality of solar cells, each of the second plurality of solar cells having a front side and a back side, and one or more laser assisted metallization conductive contact structures electrically connecting a metal foil to the back side of the solar cell, wherein the metal foil has an overhang portion. The solar cell module also includes a second busbar coupling the overhang portions of the metal foil of each of the second plurality of solar cells. The solar cell module also includes an end-busbar coupling the first and second busbars.

Example embodiment 16: The solar cell string of example embodiment 15, further including one or more side-to-side busbars coupling the first and second busbars.

Example embodiment 17: A method of fabricating a solar cell string includes electrically connecting a first metal foil to a back side of a first solar cell by forming one or more laser assisted metallization conductive contact structures on the first solar cell. The method also includes electrically connecting a second metal foil to a back side of a second solar cell by forming one or more laser assisted metallization conductive contact structures on the second solar cell. The method also includes coupling the first and second solar cells with a conductive interconnect. The method also includes forming a strain relief feature in the conductive interconnect.

Example embodiment 18: The solar cell string of example embodiment 17, wherein coupling the first and second solar cells with the conductive interconnect includes coupling an overhang portion of the first metal foil and an overhang portion of the second metal foil.

Example embodiment 19: The solar cell string of example embodiment 18, wherein forming the strain relief feature in the conductive interconnect includes using a press or a roller.

Example embodiment 20: The solar cell string of example embodiment 18 or 19, further including smoothing the overhang portion of the first metal foil and the overhang portion of the second metal foil prior to forming the strain relief feature in the conductive interconnect.

What is claimed is:
1. A solar cell string, comprising:
a first solar cell having a front side and a back side, and one or more laser assisted metallization conductive contact structures electrically connecting a first metal foil to the back side of the first solar cell;
a second solar cell having a front side and a back side, and one or more laser assisted metallization conductive contact structures electrically connecting a second metal foil to the back side of the second solar cell; and
a conductive interconnect coupling the first and second solar cells, the conductive interconnect comprising a strain relief feature, the strain relief feature comprising an overhang portion of the first metal foil and an overhang portion of the second metal foil, the overhang portion of the first metal foil in direct physical contact with the overhang portion of the second metal foil, wherein the strain relief feature comprises a plurality of folds out of plane of the first and second solar cells, the plurality of folds extending from a location below a bottom of the first and second solar cells to a location above a top of the first and second solar cells, and a plurality of welds between adjacent ones of the plurality of folds, wherein individual ones of the plurality of welds are laterally spaced apart from one another along a direction laterally between the one or more laser assisted metallization conductive contact structures of the first solar cell and the one or more laser assisted metallization conductive contact structures of the second solar cell.

2. The solar cell string of claim 1, wherein the strain relief feature is a W or M strain relief feature.

\* \* \* \* \*